United States Patent
Chang et al.

(10) Patent No.: US 12,170,331 B2
(45) Date of Patent: Dec. 17, 2024

(54) CONDUCTIVE STRUCTURES AND METHODS OF FORMATION

(71) Applicant: Taiwan Semiconductor Manufacturing Company, Ltd., Hsinchu (TW)

(72) Inventors: Cheng-Wei Chang, Taipei (TW); Chia-Hung Chu, Taipei (TW); Hsu-Kai Chang, Hsinchu (TW); Sung-Li Wang, Zhubei (TW); Kuan-Kan Hu, Hsinchu (TW); Shuen-Shin Liang, Hsinchu County (TW); Kao-Feng Lin, New Taipei (TW); Hung Pin Lu, Hsinchu (TW); Yi-Ying Liu, Hsinchu (TW); Chuan-Hui Shen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 407 days.

(21) Appl. No.: 17/651,314

(22) Filed: Feb. 16, 2022

(65) Prior Publication Data
US 2023/0009981 A1 Jan. 12, 2023

Related U.S. Application Data

(60) Provisional application No. 63/220,236, filed on Jul. 9, 2021.

(51) Int. Cl.
*H01L 29/78* (2006.01)
*H01L 21/285* (2006.01)
(Continued)

(52) U.S. Cl.
CPC ...... *H01L 29/785* (2013.01); *H01L 21/28518* (2013.01); *H01L 21/768* (2013.01); *H01L 29/401* (2013.01); *H01L 29/41791* (2013.01)

(58) Field of Classification Search
CPC ............ H01L 29/785; H01L 21/28518; H01L 21/768; H01L 29/401; H01L 29/41791;
(Continued)

(56) References Cited

U.S. PATENT DOCUMENTS

| 7,459,756 B2 | 12/2008 | Lin et al. |
| 2019/0067013 A1 | 2/2019 | Wang et al. |
| 2021/0090948 A1* | 3/2021 | Chen ................ H01L 29/41791 |

FOREIGN PATENT DOCUMENTS

| TW | 200509391 A | 3/2005 |
| TW | 201628091 A | 8/2016 |

* cited by examiner

*Primary Examiner* — Tong-Ho Kim
(74) *Attorney, Agent, or Firm* — Harrity & Harrity, LLP

(57) ABSTRACT

A titanium precursor is used to selectively form a titanium silicide ($TiSi_x$) layer in a semiconductor device. A plasma-based deposition operation is performed in which the titanium precursor is provided into an opening, and a reactant gas and a plasma are used to cause silicon to diffuse to a top surface of a transistor structure. The diffusion of silicon results in the formation of a silicon-rich surface of the transistor structure, which increases the selectivity of the titanium silicide formation relative to other materials of the semiconductor device. The titanium precursor reacts with the silicon-rich surface to form the titanium silicide layer. The selective titanium silicide layer formation results in the formation of a titanium silicon nitride ($TiSi_xN_y$) on the sidewalls in the opening, which enables a conductive structure such as a metal source/drain contact to be formed in the opening without the addition of another barrier layer.

20 Claims, 39 Drawing Sheets

(51) Int. Cl.
*H01L 21/768* (2006.01)
*H01L 29/40* (2006.01)
*H01L 29/417* (2006.01)

(58) Field of Classification Search
CPC ......... H01L 29/66795; H01L 21/76849; H01L 21/76843; H01L 21/76844; H01L 21/76831; H01L 21/823475; H01L 21/823418; H01L 21/823431; H01L 21/823481; H01L 27/0886
USPC ........................................................ 257/401
See application file for complete search history.

CONDUCTIVE STRUCTURES AND METHODS OF FORMATION

CROSS-REFERENCE TO RELATED APPLICATION

This patent application claims priority to U.S. Provisional Patent Application No. 63/220,236, filed on Jul. 9, 2021, and entitled "INTERCONNECT STRUCTURE AND METHODS OF FORMATION." The disclosure of the prior application is considered part of and is incorporated by reference into this patent application.

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
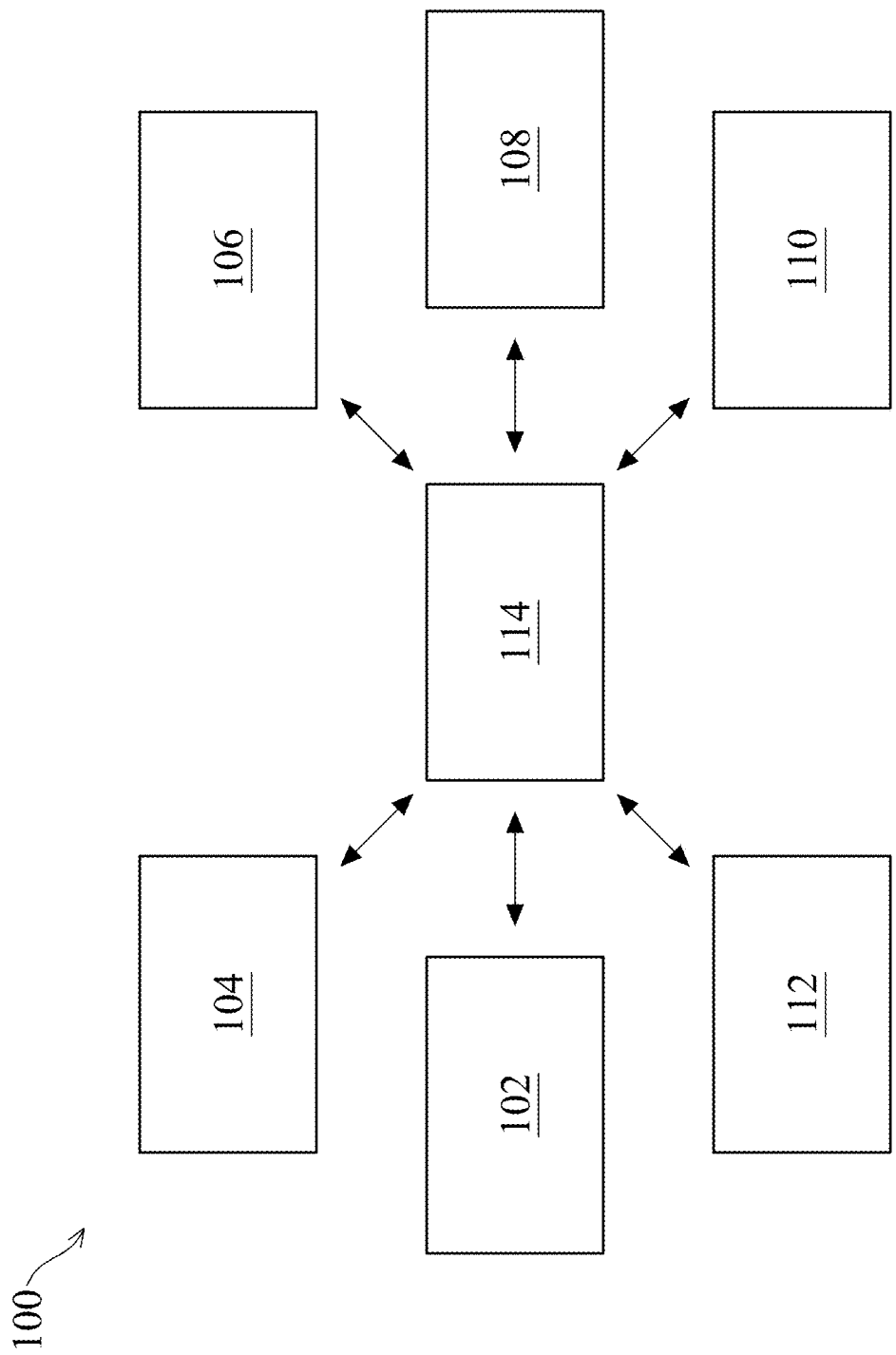
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Material selection has a direct impact on performance and size reduction in a semiconductor device. The types of conductive materials used in conductive structures (e.g., contacts and interconnect structures) of a semiconductor device can affect resistivity, parasitic capacitance, defect formation, electromigration, and/or other properties and attributes of the conductive structures. As the miniaturization of semiconductor devices (and the corresponding conductive structures) progresses, the use of cobalt (Co), tungsten (W), and ruthenium (Ru) may provide sustained and/or increased performance due to high mobility relative to other metals. However, some combinations of conductive materials may result in increased rates of defect formation and reduced performance. This can occur, for example, where conductive structures that are electrically and/or physically interfaced include respective and different types of metals (e.g., heterogeneous materials).

In some cases, solid solutioning may occur in a binary system between conductive structures that include respective and different types of metals. Solid solutioning may trigger atom-to-atom substitutions or vacancies at or near the interface between the conductive structures, which may increase the rate of defect formation in the conductive structures. In other cases, galvanic corrosion may occur in a binary system between conductive structures that include respective and different types of metals. Galvanic corrosion may cause corrosion of and/or separation between the conductive structures, may result in phase transition defects (e.g., between alpha and beta phases of tungsten (W), for example), and/or may result in other defects and/or performance reductions. This may increase parasitic capacitance between the conductive structures and may break the connection between the conductive structures, which reduces yield and increases semiconductor device failures.

Moreover, some barrier layer materials for conductive structures may increase sheet resistance, may increase contact resistance, and/or may reduce the available space in an opening for forming a conductive structure, among other examples. The reduction in the available space may lead to reduced cross-sectional width (which may be referred to as a "critical dimension" or CD) for the conductive structure, which may reduce the gap-filling performance for the conductive structure, may increase the likelihood and/or rate of void formation in the conductive structure, may increase surface roughness (Rp) for the conductive structure, and/or may result in another type of defect or performance reduction for the conductive structure.

Some implementations described herein provide homogenous conductive structures and associated methods of formation. In some implementations, a titanium precursor is used to selectively form a titanium silicide ($TiSi_x$) layer on a source/drain region of a semiconductor device. A plasma-based deposition operation is performed in which the titanium precursor is provided into an opening to the source/drain region, and a reactant gas and a plasma are used to cause silicon in the source/drain region to diffuse to a top surface of the source/drain region. The titanium precursor, the reactant gas, and the plasma are provided into the opening for a time duration, which may be referred to as a soaking operation. The diffusion of silicon results in the formation of a silicon-rich surface of the source/drain region, which increases the selectivity of the titanium silicide formation relative to other materials of the semiconductor device such as silicon oxide ($SiO_x$). The titanium precursor reacts with the silicon-rich surface of the source/drain region to form the titanium silicide layer on the source/drain region. The selective titanium silicide layer formation results in the formation of a titanium silicon nitride ($TiSi_xN_y$) on the sidewalls in the opening, which enables a conductive structure such as a metal source/drain contact to be formed in the opening without the addition of another barrier layer such as titanium nitride ($Ti_xN_y$) or tantalum nitride ($Ta_xN_y$). This reduces the complexity of forming the metal source/drain contact and provides a greater volume in the opening for forming the metal source/drain contact (e.g., relative to the use of another barrier layer), which increases gap-filling performance for the metal source/drain contact, reduces the likelihood of void formation, and/or decreases surface roughness of the metal source/drain contact, among other examples.

Moreover, a source/drain interconnect may be formed to the metal source/drain contact such that the source/drain interconnect and the metal source/drain contact are formed of the same conductive material such as ruthenium (Ru) or another type of conductive material. The source/drain interconnect and the metal source/drain contact including the same conductive material reduces the likelihood of solid solutioning for the source/drain interconnect and the metal source/drain contact, reduces the likelihood of galvanic corrosion for the source/drain interconnect and the metal source/drain contact, and/or reduces phase transitions in the source/drain interconnect and the metal source/drain contact (e.g., as ruthenium may possess a high-pressure cell (HIPC or Ru-HPC) structure under the working temperature in the deposition processes for the source/drain interconnect and the metal source/drain contact). This reduces parasitic capacitance between the source/drain interconnect and the metal source/drain contact, reduces resistivity between the source/drain interconnect and the metal source/drain contact, reduces the likelihood of separation of the source/drain interconnect and the metal source/drain contact, and/or reduces defect formation in the source/drain interconnect and the metal source/drain contact, among other examples, A back end of line (BEOL) metallization layer, such as a metal-zero (M0) metal line may be formed to physically and/or electrically connect to the source/drain interconnect.

Alternatively, an integrated contact and interconnect may be formed in the opening. The integrated contact and interconnect includes a unified conductive structure that extends from the source/drain region (or from the titanium silicide layer on the source/drain region) to the BEOL metallization layer (or to a barrier layer under the BEOL metallization layer). The integrated contact and interconnect structure includes a homogeneous conductive material such as ruthenium (Ru) or another metal, and is not affected by defects such as solid solutioning and galvanic corrosion that might otherwise occur in separate (two-part) metal source/drain contacts and source/drain interconnects formed of respective and different types of conductive materials. The integrated contact and interconnect structure also reduces the quantity of layer-to-layer interfaces between the source/drain region and the BEOL metallization layer, which further reduces contact resistance between the source/drain region and the BEOL metallization layer.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the semiconductor processing environment 100 includes a plurality of wafer/die transport tools 114.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
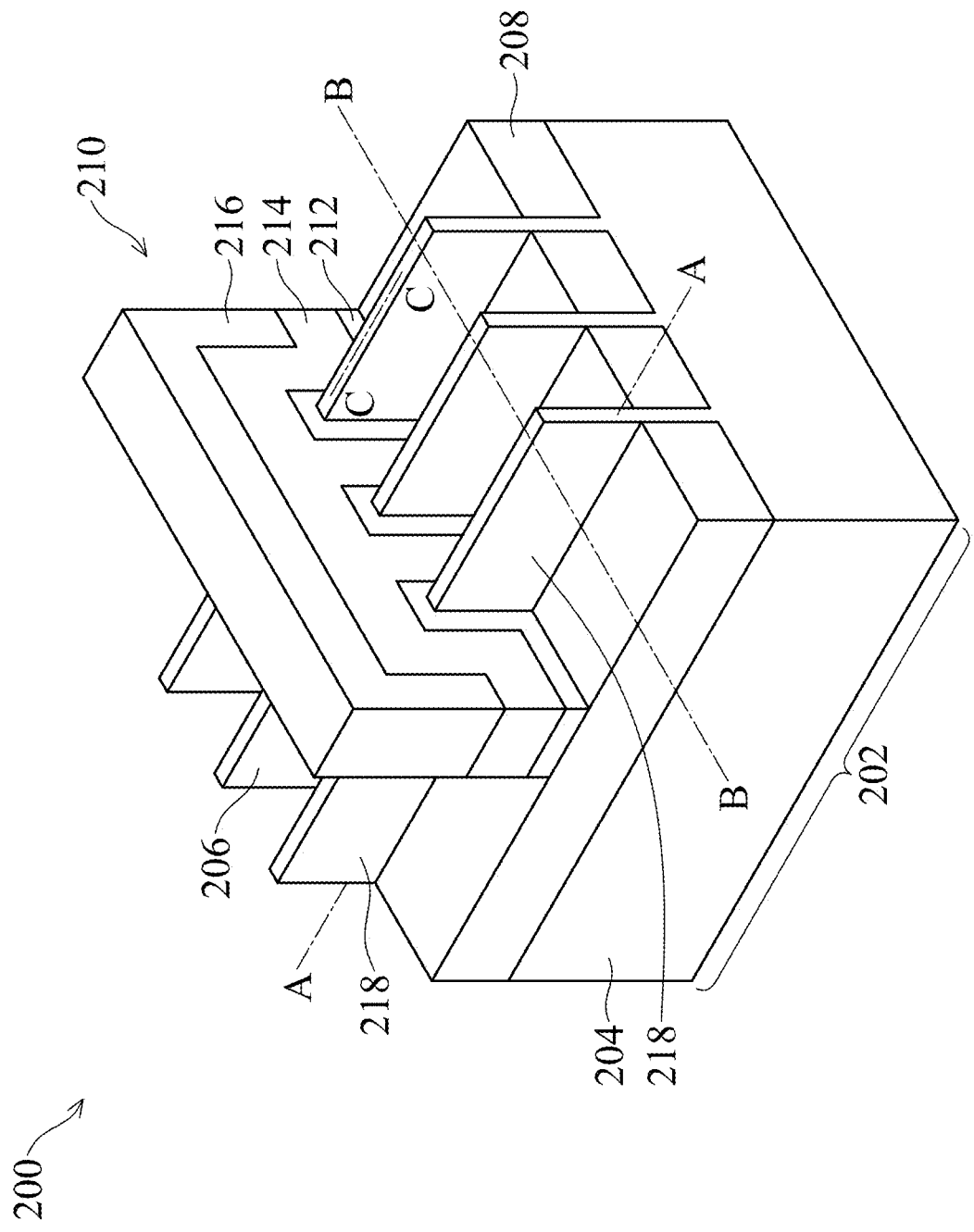
FIG. 2 is a diagram of a region of an example semiconductor device described herein.

FIG. 2 is a diagram of example regions of a semiconductor device 200 described herein. In particular, FIG. 2 illustrates an example device region 202 of the semiconductor device 200 in which one or more transistors or other devices are included. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region. FIGS. 3A-7F are schematic cross-sectional views of various portions of the device region 202 of the semiconductor device 200 illustrated in FIG. 2, and correspond to various processing stages of forming fin-based transistors in the device region 202 of the semiconductor device 200.

The semiconductor device 200 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 204 may include a round/circular substrate having an approximately 200 mm diameter, an approximately 300 mm diameter, or another diameter, such as 450 mm, among other examples. The substrate 204 may alternatively be any polygonal, square, rectangular, curved, or otherwise non-circular workpiece, such as a polygonal substrate.

Fin structures 206 are included above (and/or extend above) the substrate 204 for the device region 202. A fin structure 206 may provide an active region where one or more devices (e.g., fin-based transistors) are formed. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back to form shallow trench isolation (STI) regions 208 above the substrate 204 and between the fin structures 206. Other fabrication techniques for the STI regions 208 and/or for the fin structures 206 may be used. The STI regions 208 may electrically isolate adjacent active areas in the fin structures 206. The STI regions 208 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 208 may include a multi-layer structure, for example, having one or more liner layers.

A dummy gate structure 210 (or a plurality of dummy gate structures 210) is included in the device region 202 over the fin structures 206 (e.g., approximately perpendicular to the fin structures 206). The dummy gate structure 210 engages the fin structures 206 on three or more sides of the fin structures 206. In the example depicted in FIG. 2, the dummy gate structure 210 includes a gate dielectric layer 212, a gate electrode layer 214, and a hard mask layer 216. In some implementations, the dummy gate structure 210 further includes a capping layer, one or more spacer layers, and/or another suitable layer. The various layers of the dummy gate structure 210 may be formed by suitable deposition techniques and patterned by suitable photolithography and etching techniques.

The term, "dummy", as described here, refers to a sacrificial structure which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. Accordingly, the configuration of the semiconductor device 200 illustrated in FIG. 2 may include an intermediate configuration, and additional semiconductor processing operations may be performed for the semiconductor device 200 to further process the semiconductor device 200.

The gate dielectric layer 212 may include a dielectric oxide layer. The dielectric oxide layer may be formed by chemical oxidation, thermal oxidation, ALD, CVD, and/or other suitable methods. The gate electrode layer 214 may include a poly-silicon material or another suitable material. The gate electrode layer 214 may be formed by suitable deposition processes such as LPCVD or PECVD, among other examples. The hard mask layer 216 may include any material suitable to pattern the gate electrode layer 214 with particular features/dimensions on the substrate 204.

In some implementations, the various layers of the dummy gate structure 210 are first deposited as blanket layers. Then, the blanket layers are patterned through a process including photolithography and etching processes, removing portions of the blanket layers and keeping the remaining portions over the STI regions 208 and the fin structures 206 to form the dummy gate structure 210.

Source/drain areas 218 are disposed in opposing regions of the fin structures 206 with respect to the dummy gate structure 210. The source/drain areas 218 include areas in the device region 202 in which source/drain regions are to be formed. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of the dummy gate structure 210, being coalesced), two functional transistors may be implemented. Other configurations in other examples may implement other numbers of functional transistors.

FIG. 2 further illustrates reference cross-sections that are used in later figures, including FIGS. 3A-7F. Cross-section A-A is in a plane along a channel in a fin structure 206 between opposing source/drain areas 218. Cross-section B-B is in a plane perpendicular to cross-section A-A, and is across a source/drain area 218 in fin structure 206. Cross-section C-C is in a plane along another channel in a fin structure 206. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3A:
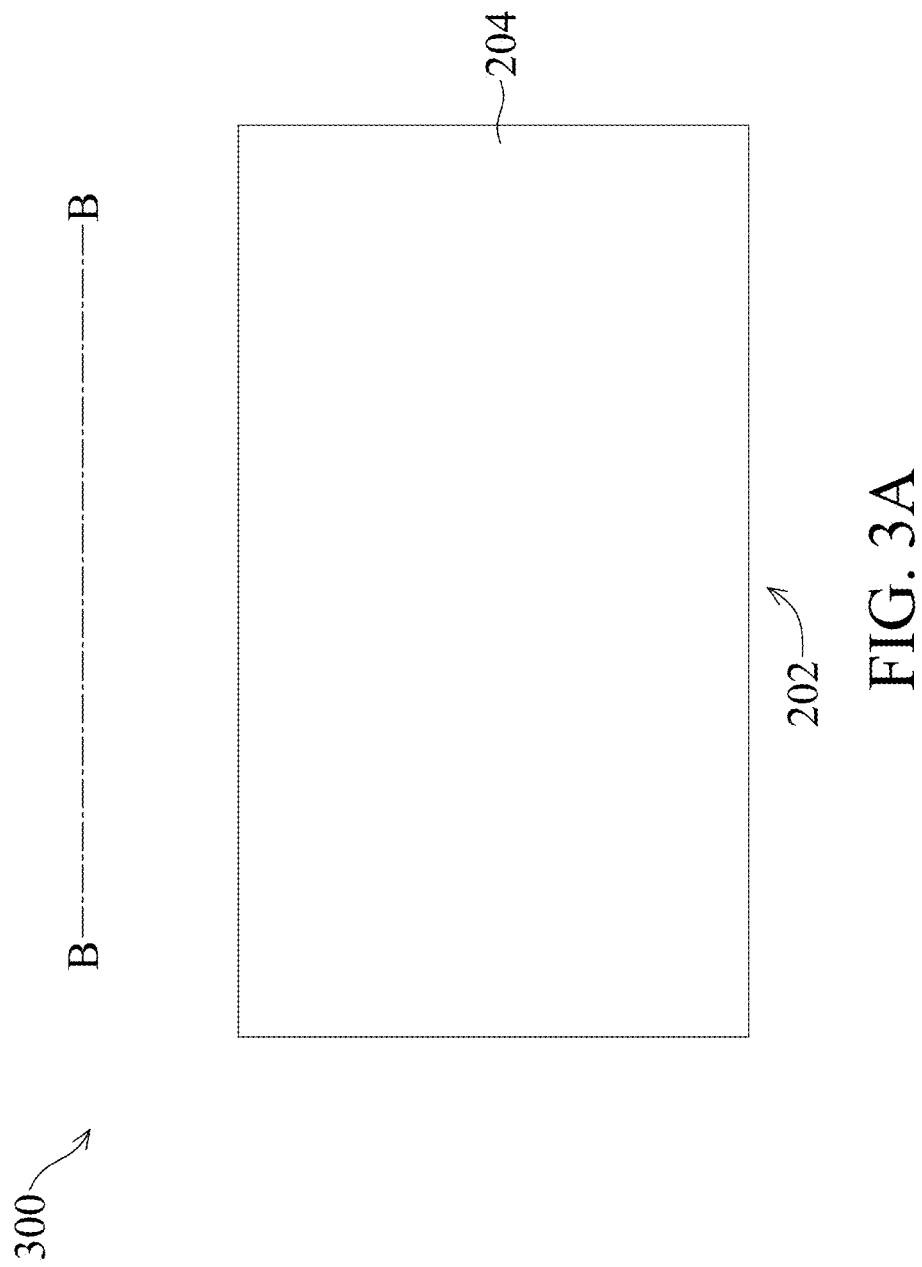
FIGS. 3A-3D, 4A-4C, 5A-5D, and 6A-6N, and 7A-7F are diagrams of example implementations described herein.

FIGS. 3A-3D are diagrams of an example implementation 300 described herein. The example implementation 300 includes an example of forming fin structures 206 for transistors in the device region 202 of the semiconductor device 200. FIGS. 3A-3D are illustrated from the perspective of the cross-sectional plane B-B in FIG. 2 for the device region 202. Turning to FIG. 3A, the example implementation 300 includes semiconductor processing operations relating to the substrate 204 in and/or on which transistors are formed in the device region 202.

Figure 3B:
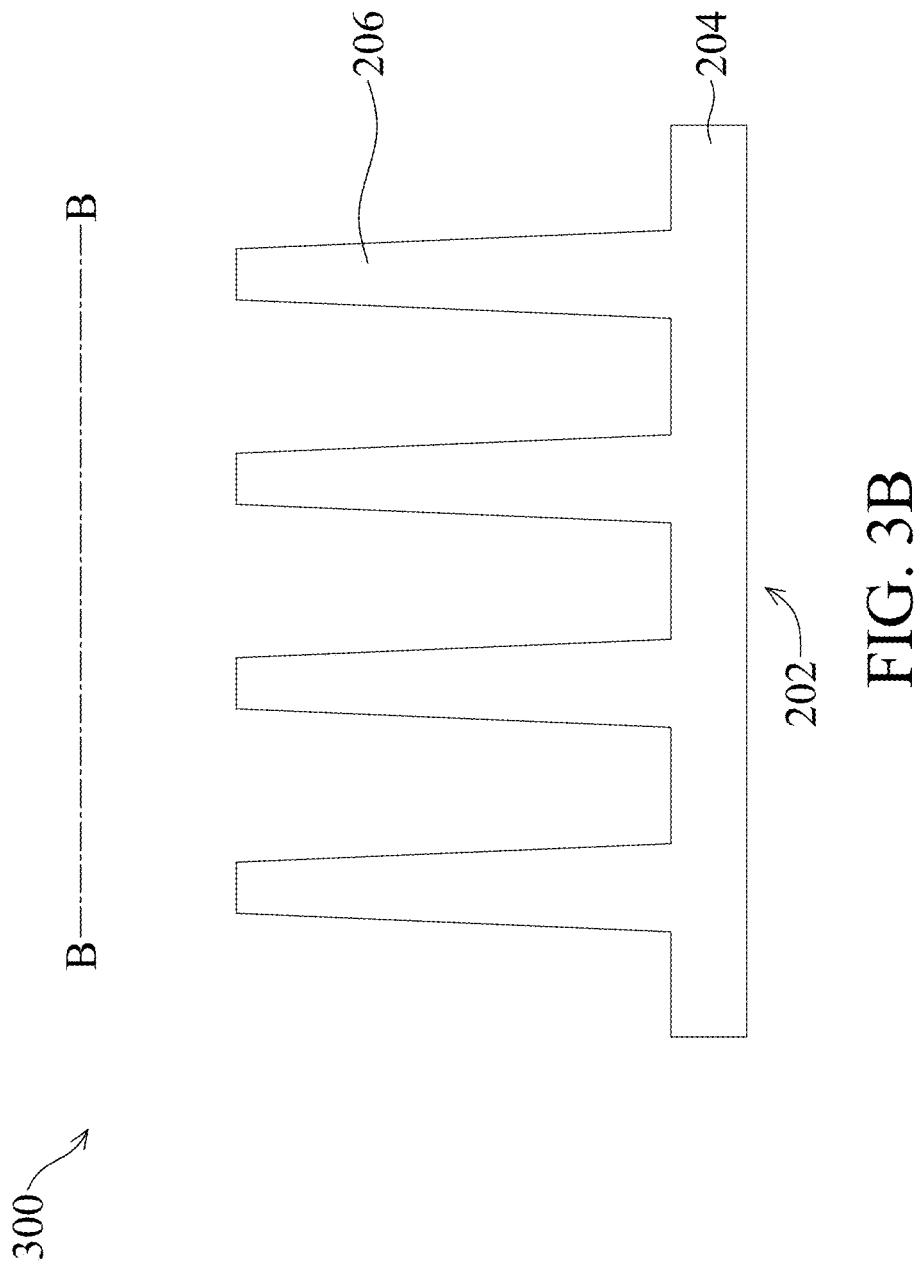

As shown in FIG. 3B, the fin structures 206 are formed in the substrate 204 in the device region 202. In some implementations, a pattern in a photoresist layer is used to form the fin structures 206. In these implementations, the deposition tool 102 forms the photoresist layer on the substrate 204. The exposure tool 104 exposes the photoresist layer to a radiation source to pattern the photoresist layer. The developer tool 106 develops and removes portions of the photoresist layer to expose the pattern. The etch tool 108 etches into the substrate 204 to form the fin structures 206. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 206 based on a pattern.

Figure 3C:
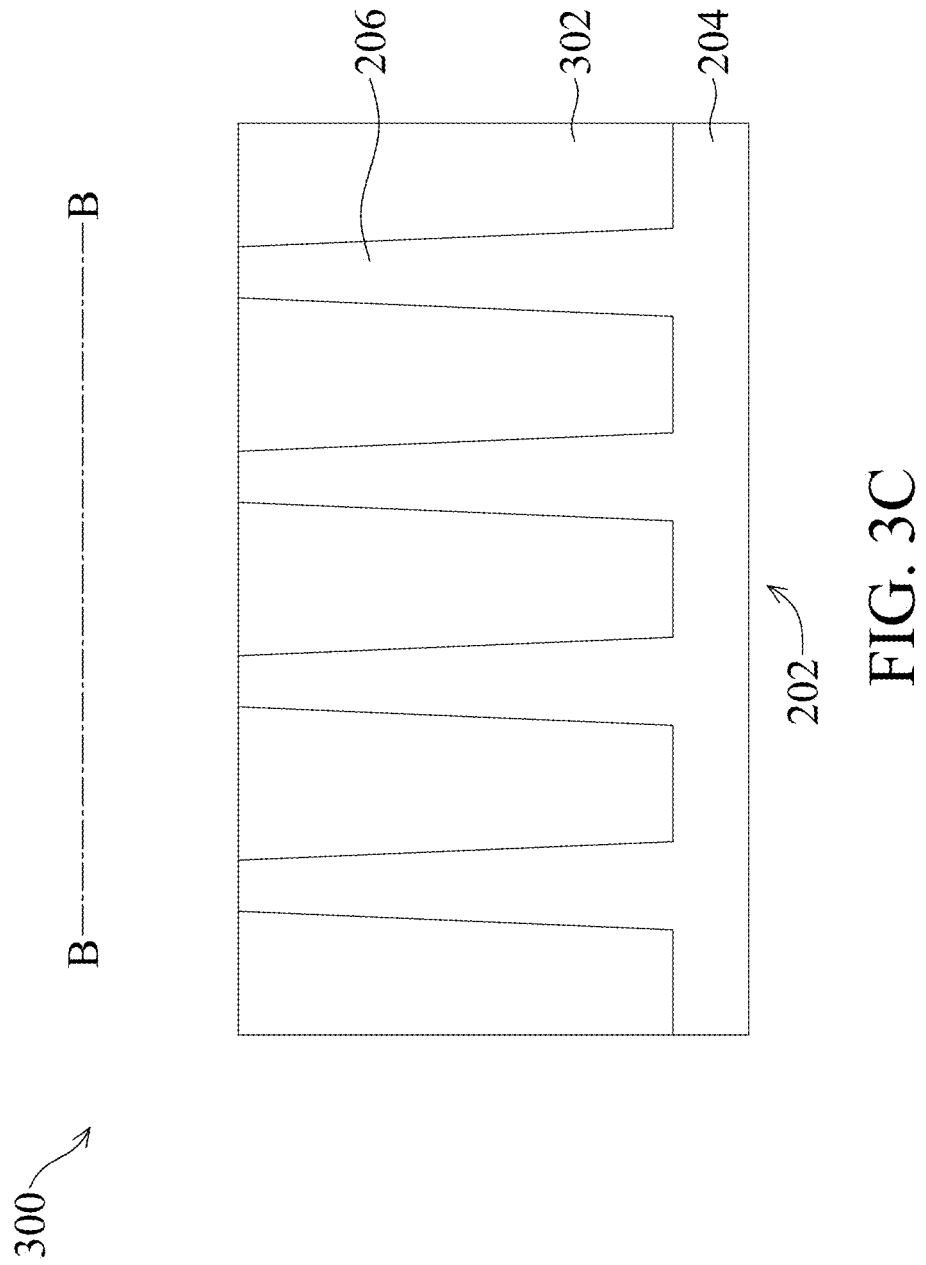

As shown in FIG. 3C, an STI layer 302 is formed in between the fin structures 206. The deposition tool 102 deposits the STI layer 302 using a CVD technique, a PVD technique, an ALD technique, a deposition technique described above in connection with FIG. 1, and/or another deposition technique. In some implementations, the STI layer 302 is formed to a height that is greater than the height of the fin structures 206. In these implementations, the planarization tool 110 performs a planarization (or polishing) operation to planarize the STI layer 302 such that the top surface of the STI layer 302 is substantially flat and smooth, and such that the top surface of the STI layer 302 and the top surface of the fin structures 206 are approximately the same height. The planarization operation may increase uniformity in the STI regions 208 that are formed from the STI layer 302 in a subsequent etch-back operation.

Figure 3D:
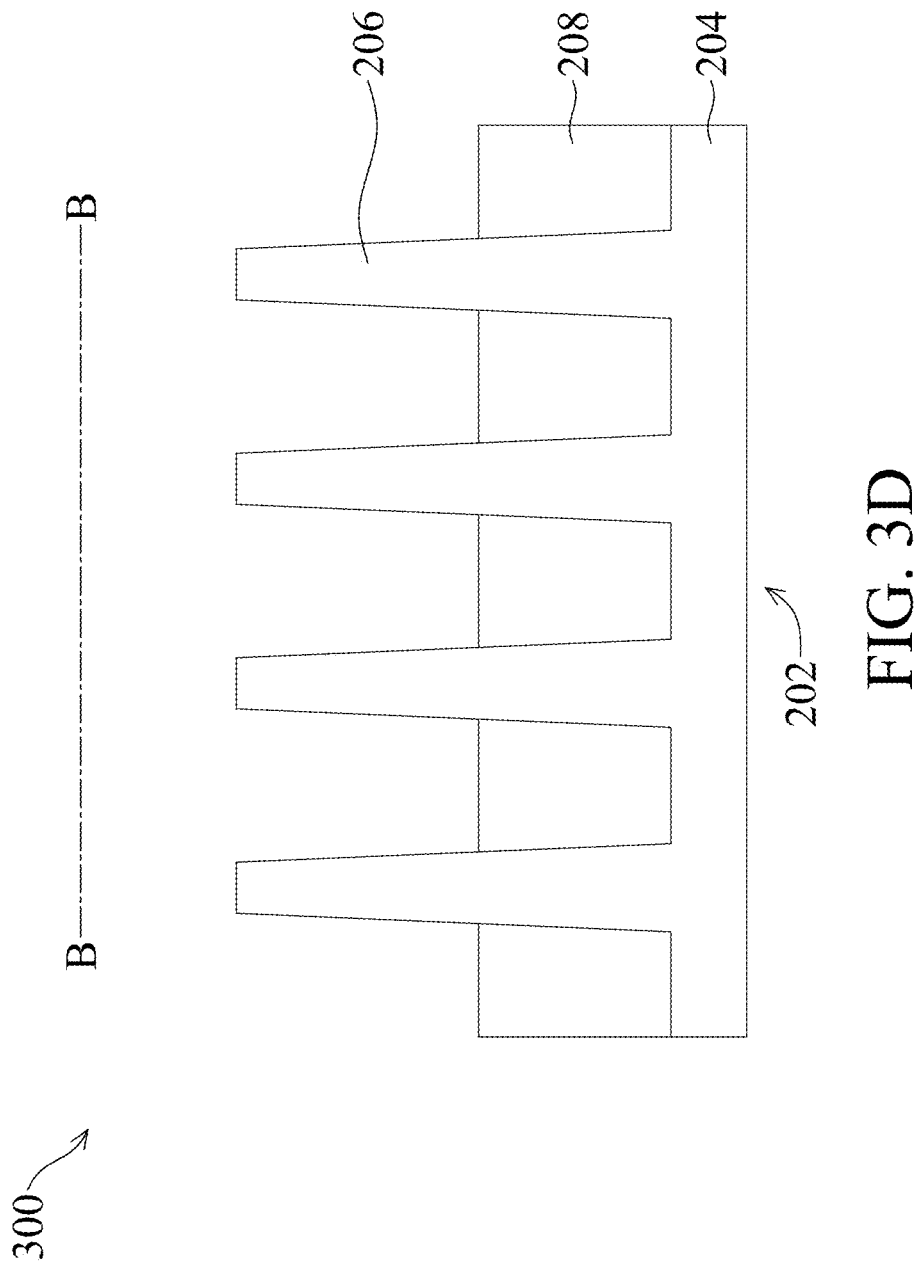

As shown in FIG. 3D, the STI layer 302 is etched in an etch back operation to expose portions of the fin structures 206. The etch tool 108 etches a portion of the STI layer 302 using a plasma etch technique, a wet chemical etch technique, and/or another type of etch technique. The remaining portions of the STI layer 302 between the fin structures 206 include the STI regions 208. In some implementations, the STI layer 302 is etched such that the height of the exposed portions of the fin structures 206 (e.g., the portions of the fin structures 206 that are above the top surface of the STI regions 208) and the same height in the device region 202. In some implementations, a first portion of the STI layer 302 in the device region 202 is etched and a second portion of the STI layer 302 in the device region 202 is etched such that the height of exposed portions of a first subset of the fin structures 206 and the height of the exposed portions of a second subset of the fin structures 206 are different, which enables the fin heights to be tuned to achieve particular performance characteristics for the device region 202.

As indicated above, FIGS. 3A-3D are provided as an example. Other examples may differ from what is described with regard to FIGS. 3A-3D.

Figure 4A:
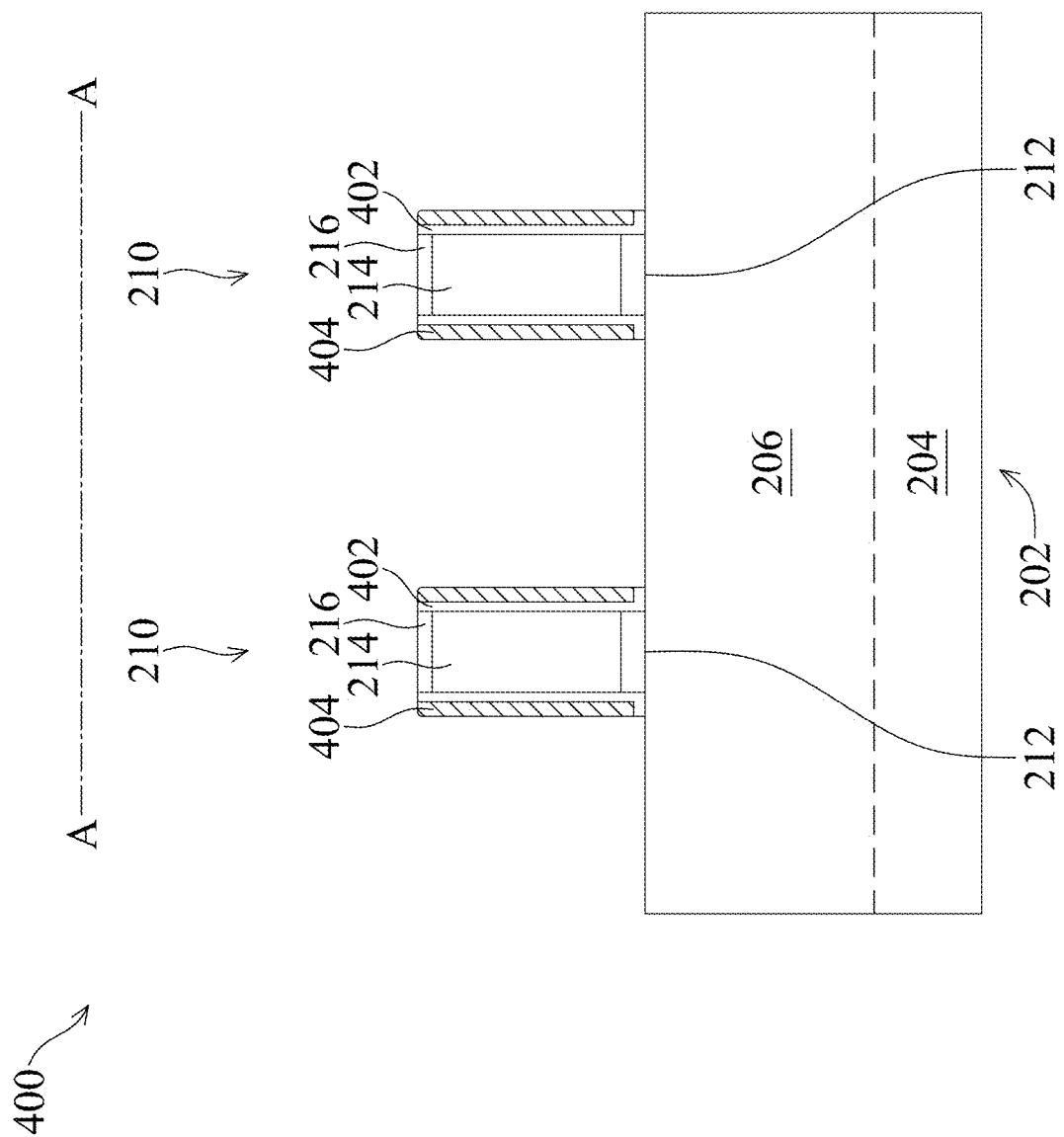
Figure 4B:
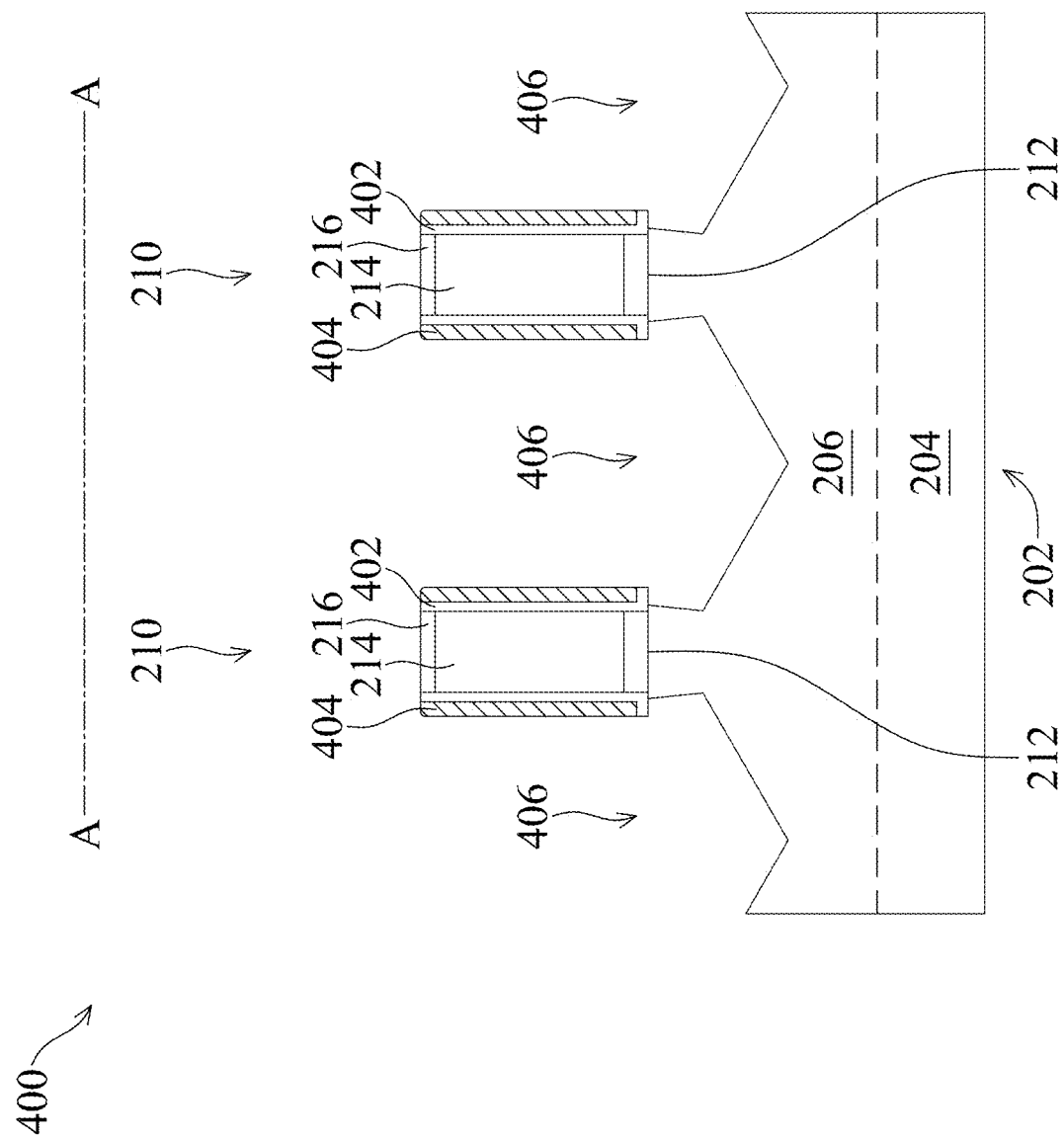
Figure 4C:
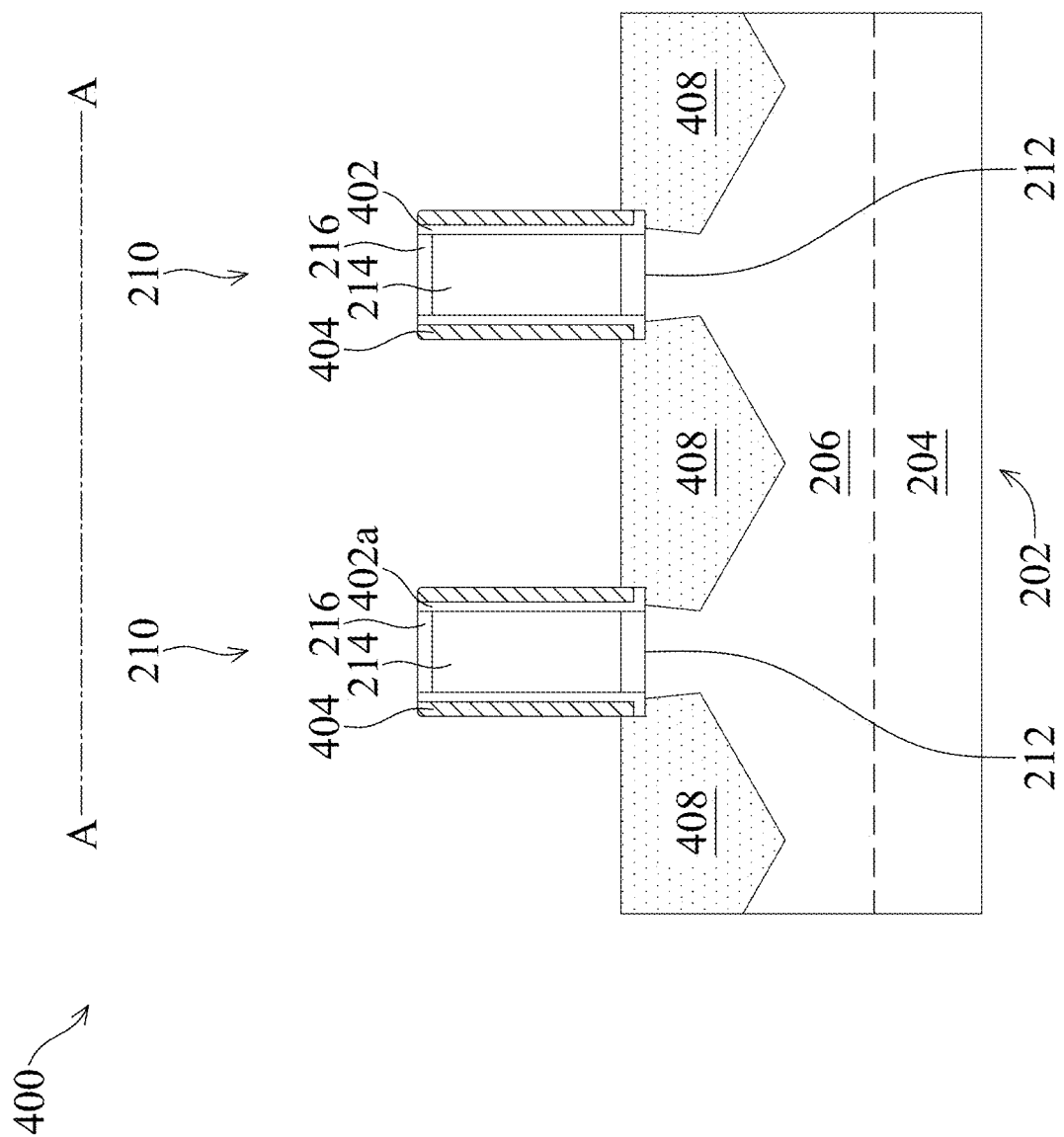

FIGS. 4A-4C are diagrams of an example implementation 400 described herein. The example implementation 400 includes an example of forming source/drain regions in the source/drain areas 218 of the device region 202 of the semiconductor device 200. FIGS. 4A-4C are illustrated from the perspective of the cross-sectional plane A-A in FIG. 2 for the device region 202. In some implementations, the operations described in connection with the example implementation 400 are performed after the fin formation process described in connection with FIGS. 3A-3D.

As shown in FIG. 4A, dummy gate structures 210 are formed in the device region 202. The dummy gate structures 210 are formed and included over the fin structures 206, and around the sides of the fin structures 206 such that the dummy gate structures 210 surround the fin structure 206 on at least three sides of the fin structure 206. The dummy gate structures 210 are formed as placeholders for the actual gate structures (e.g., replacement high-k gate structures or metal gate structures) that are to be formed for the transistors included in the device region 202. The dummy gate structures 210 may be formed as part of a replacement gate process, which enables other layers and/or structures to be formed prior to formation of the replacement gate structures.

The dummy gate structures 210 include gate dielectric layers 212, gate electrode layers 214, and hard mask layers 216. The gate dielectric layers 212 may each include dielectric oxide layers. As an example, the gate dielectric layers 212 may each be formed (e.g., by the deposition tool 102) by chemical oxidation, thermal oxidation, ALD, CVD, and/or other suitable methods. The gate electrode layers 214 may each include a poly-silicon layer or other suitable layers. For example, the gate electrode layers 214 may be formed (e.g., by the deposition tool 102) by suitable deposition processes such as LPCVD or PECVD, among other examples. The hard mask layers 216 may each include any material suitable to pattern the gate electrode layers 214 with particular dimensions and/or attributes. Examples include silicon nitride, silicon oxynitride, silicon carbon nitride, or a combination thereof, among other examples. The hard mask layers 216 may be deposited (e.g., by the deposition tool 102) by CVD, PVD, ALD, or another deposition technique.

As further shown in FIG. 4A, seal spacer layers 402 are included on the sidewalls of the dummy gate structures 210. The seal spacer layers 402 may be conformally deposited (e.g., by the deposition tool 102) and may include a silicon oxycarbide (SiOC), a nitrogen free SiOC, or another suitable material. The seal spacer layers 402 may be formed by an ALD operation in which various types of precursor gasses including silicon (Si) and carbon (C) are sequentially supplied in a plurality of alternating cycles to form the seal spacer layers 402, among other example deposition techniques.

As further shown in FIG. 4A, bulk spacer layers 404 may be formed on the seal spacer layers 402. The bulk spacer layers 404 may be formed of similar materials as the seal spacer layers 402. However, the bulk spacer layers 404 may formed without plasma surface treatment that is used for the seal spacer layers 402. Moreover, the bulk spacer layers 404 may be formed to a greater thickness relative to the thickness of the seal spacer layers 402.

In some implementations, the seal spacer layers 402 and the bulk spacer layers 404 are conformally deposited (e.g., by the deposition tool 102) on the dummy gate structures 210, and on the fin structures 206. The seal spacer layers 402 and the bulk spacer layers 404 are then patterned (e.g., by the deposition tool 102, the exposure tool 104, and the developer tool 106) and etched (e.g., by the etch tool 108) to remove the seal spacer layers 402 and the bulk spacer layers 404 from the tops of the dummy gate structures 210 and from the fin structures 206.

As shown in FIG. 4B, recesses 406 are formed in the fin structures 206 in the device region 202 between the dummy gate structures 210 in an etch operation. The etch operation may be referred to a first strained source/drain (SSD) etch operation, and the recesses 406 may be referred to as strained source/drain recesses. In some implementations, the first etch operation includes a plasma etch technique, a wet chemical etch technique, and/or another type of etch technique.

In some implementations, a plurality of etch operations are performed to form recesses 406 for different types of transistors. For example, a photoresist layer may be formed over and/or on a first subset of the fin structures 206 and over and/or on a first subset of the dummy gate structures 210 such that a second subset of the fin structures 206 between a second subset of the dummy gate structures 210 such that p-type source/drain regions and n-type source/drain regions may be formed in separate epitaxial operations.

As shown in FIG. 4C, source/drain regions 408 are formed in the recesses 406 in the device region 202 of the semiconductor device 200 over the substrate 204. The deposition tool 102 forms the source/drain regions 408 by an epitaxial operation, in which layers of the epitaxial material are deposited in the recesses 406 such that the layers of p-type source/drain regions and/or layers of n-type source/drain regions are formed by epitaxial growth in a particular crystalline orientation. The source/drain regions 408 are included between the dummy gate structures 210 and at least partially below and/or lower than the dummy gate structures 210. Moreover, the source/drain regions 408 at least partially extend above the top surface of the fin structures 206.

The material (e.g., silicon (Si), gallium (Ga), or another type of semiconductor material) that is used to form the source/drain regions 408 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

As indicated above, FIGS. 4A-4C are provided as an example. Other examples may differ from what is described with regard to FIGS. 4A-4C.

FIGS. 5A-5D are diagrams of an example implementation 500 described herein. The example implementation 500 includes an example dummy gate replacement process, in which the dummy gate structures 210 are replaced with high-k gate structures and/or metal gate structures. FIGS. 5A-5D are illustrated from the perspective of the cross-sectional plane A-A in FIG. 2 for the device region 202.

Figure 5A:
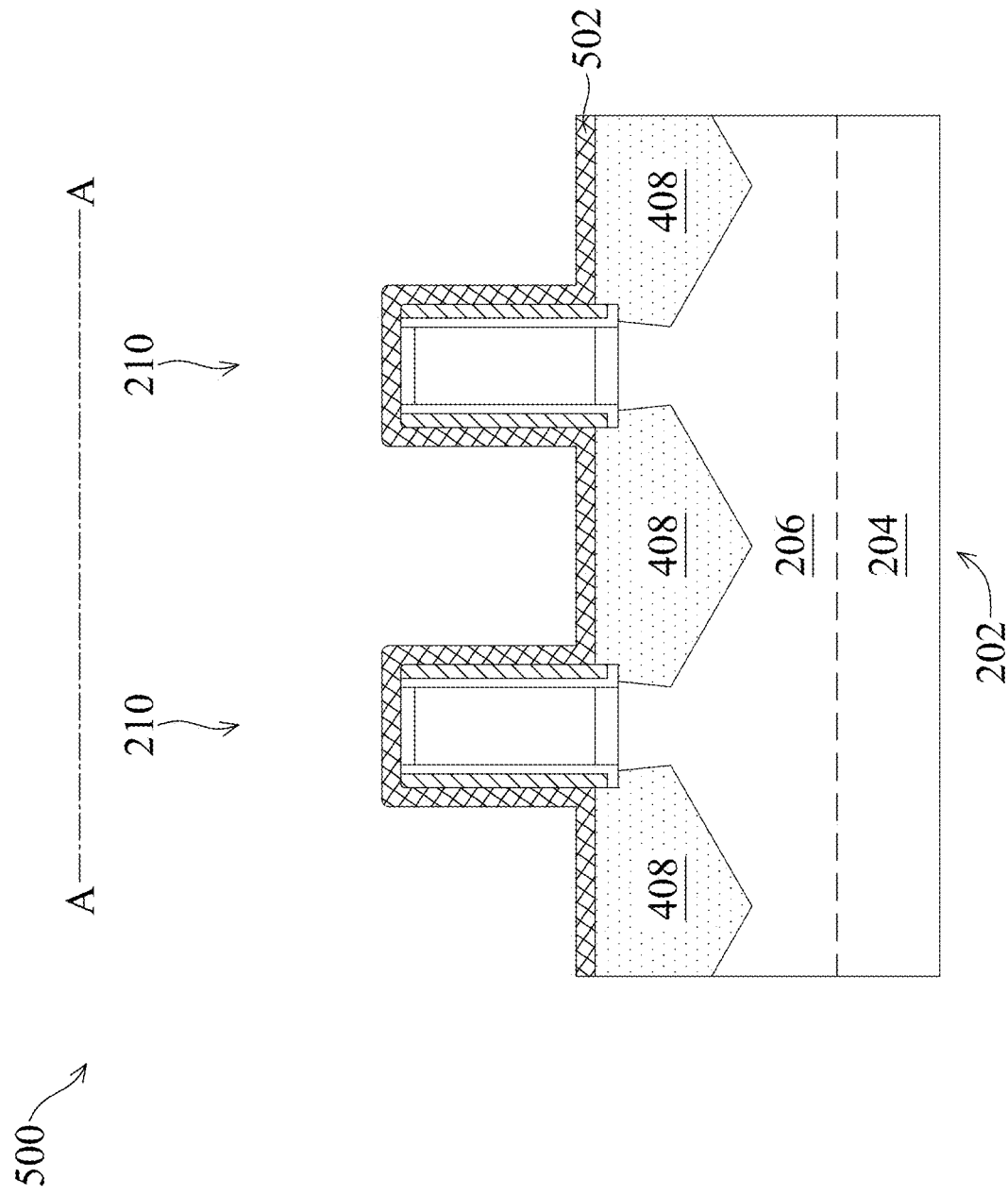

As shown in FIG. 5A, a contact etch stop layer (CESL) 502 is conformally deposited (e.g., by the deposition tool 102) over the source/drain regions 408, over the dummy gate structures 210, and on the sidewalls of the bulk spacer layers 404. The CESL 502 may provide a mechanism to stop an etch process when forming contacts or vias for the device region 202. The CESL 502 may be formed of a dielectric material having a different etch selectivity from adjacent layers or components. The CESL 502 may include or may be a nitrogen containing material, a silicon containing material, and/or a carbon containing material. Furthermore, the CESL 502 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL 502 may be deposited using a deposition process, such as ALD, CVD, or another deposition technique.

Figure 5B:
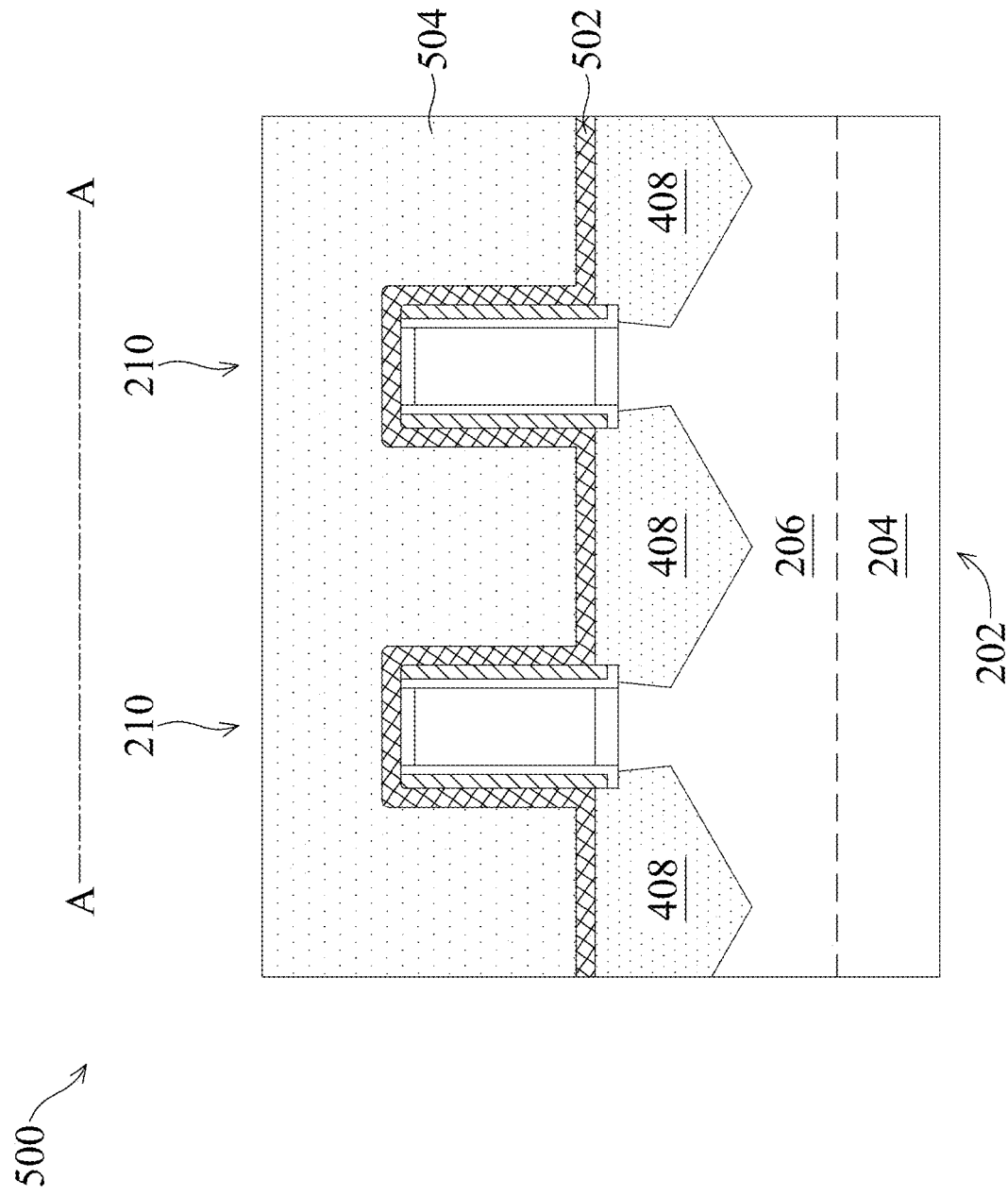

As shown in FIG. 5B, an interlayer dielectric (ILD) layer 504 is formed (e.g., by the deposition tool 102) over and/or on the CESL 502. The ILD layer 504 fills in the areas between the dummy gate structures 210 over the source/drain regions 408. The ILD layer 504 is formed to permit a replacement gate structure process to be performed in the device region 202, in which metal gate structures are formed to replace the dummy gate structures 210. The ILD layer 504 may be referred to as an ILD zero (ILD0) layer.

In some implementations, the ILD layer 504 is formed to a height (or thickness) such that the ILD layer 504 covers the dummy gate structures 210. In these implementations, a subsequent CMP operation (e.g., performed by the planarization tool 110 is performed to planarize the ILD layer 504 such that the top surfaces of the ILD layer 504 are approximately at a same height as the top surfaces of the dummy gate structures 210. The increases the uniformity of the ILD layer 504.

Figure 5C:
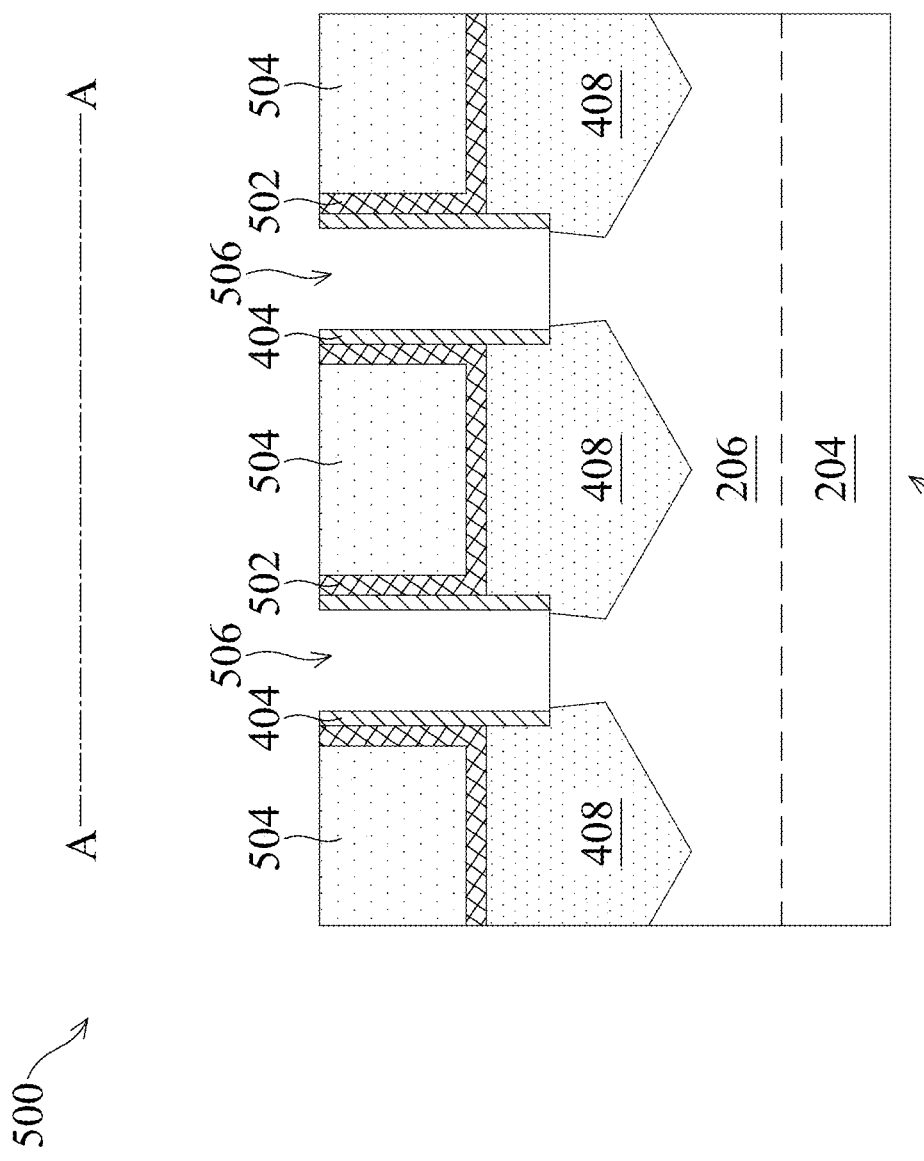

As shown in FIG. 5C, the replacement gate operation is performed (e.g., by one or more of the semiconductor processing tools 102-112) to remove the dummy gate structures 210 from the device region 202. The removal of the dummy gate structures 210 leaves behind openings (or recesses) 506 between the bulk spacer layers 404 and between the source/drain regions 408. The dummy gate structures 210 may be removed in one or more etch operations includes a plasma etch technique, which may include a wet chemical etch technique, and/or another type of etch technique.

Figure 5D:
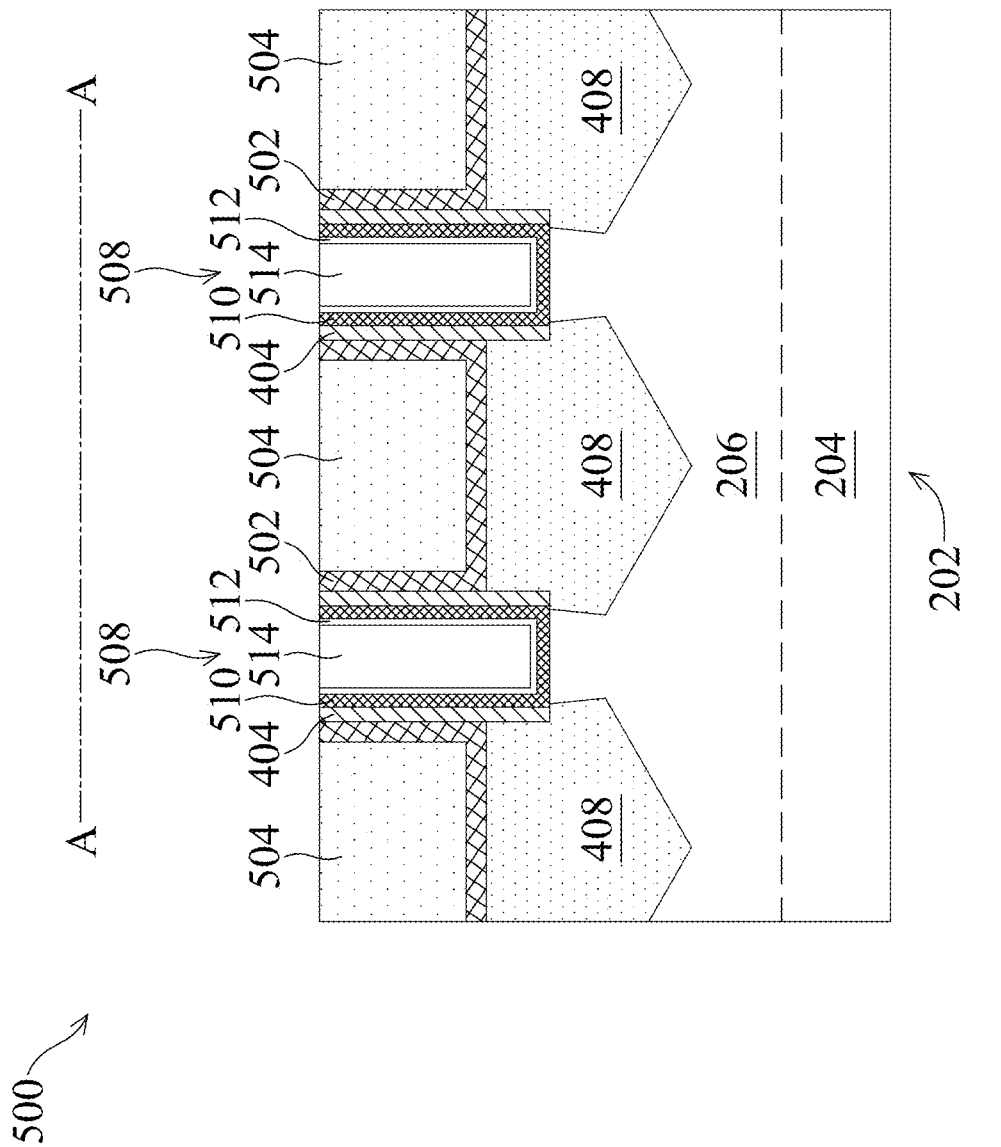

As shown in FIG. 5D, the replacement gate operation continues where deposition tool 102 and/or the plating tool 112 forms the gate structures (e.g., replacement gate structures) 508 in the openings 506 between the bulk spacer layers 404 and between the source/drain regions 408. The gate structures 508 may include metal gate structures, high-k gate structures, or other types of gate structures. The gate structures 508 may include an interfacial layer (not shown), a high-k dielectric layer 510, a work function tuning layer 512, and a metal electrode structure 514 formed therein to form a gate structure 508. In some implementations, the gate structures 508 may include other compositions of materials and/or layers.

As indicated above, FIGS. 5A-5D are provided as an example. Other examples may differ from what is described with regard to FIGS. 5A-5D.

Figure 6A:
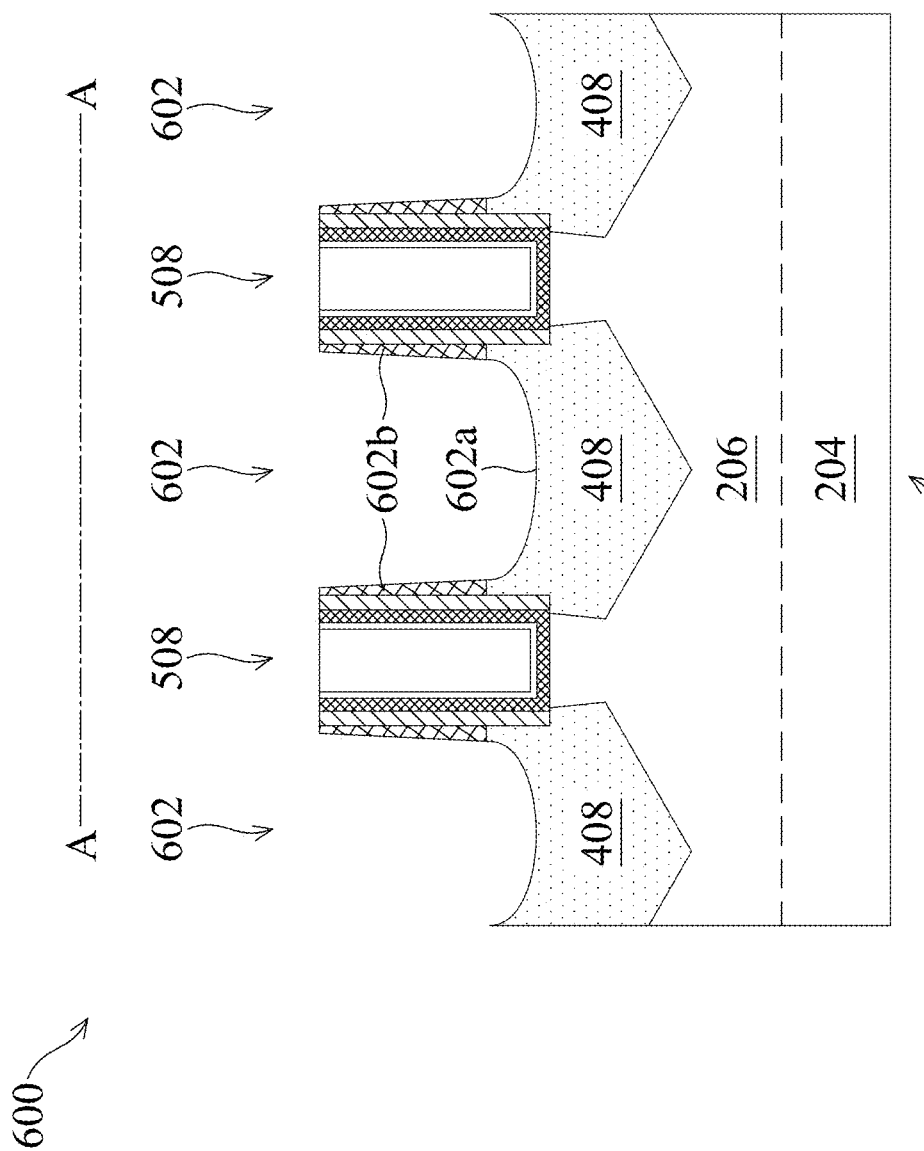
Figure 6B:
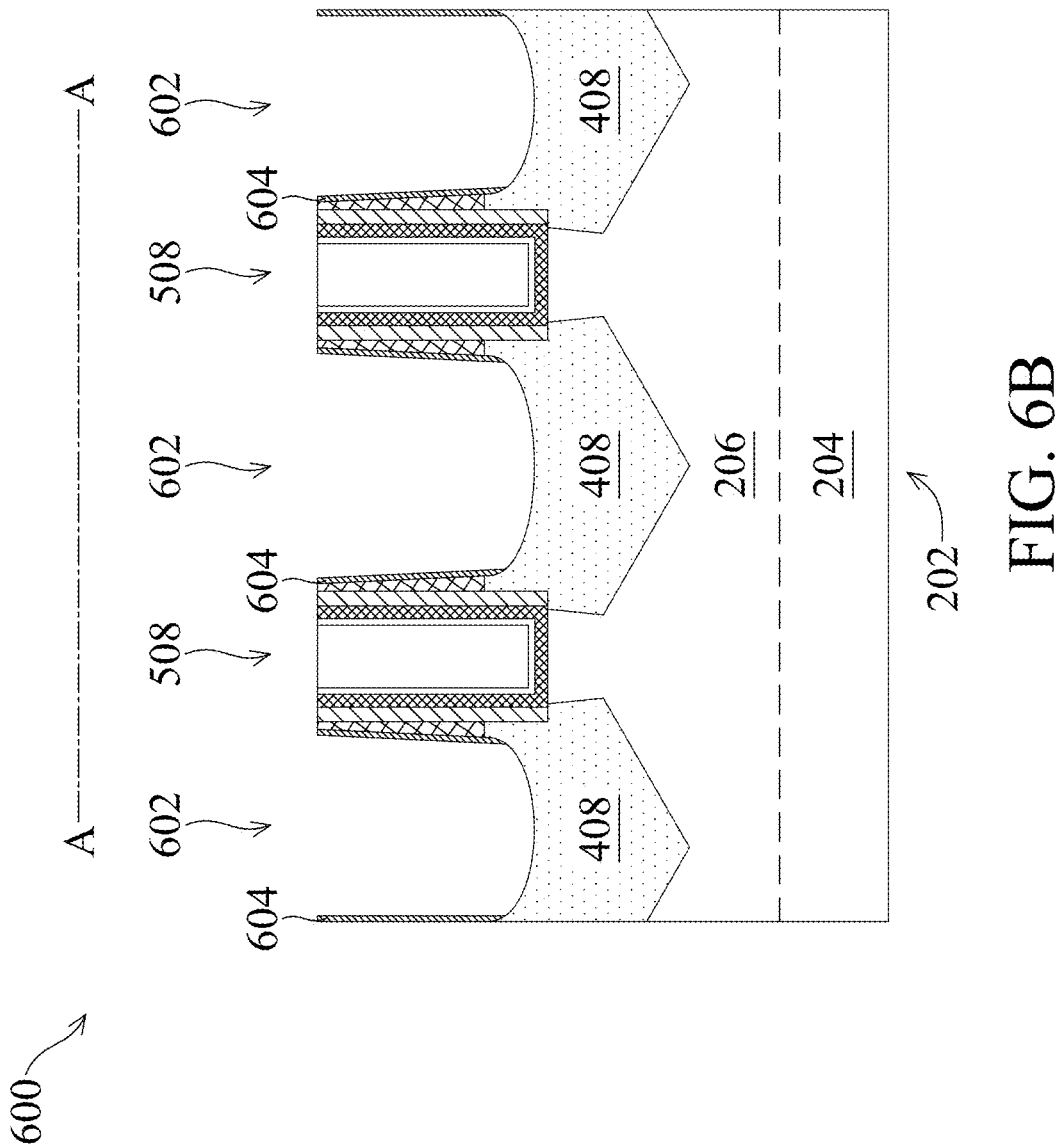
Figure 6C:
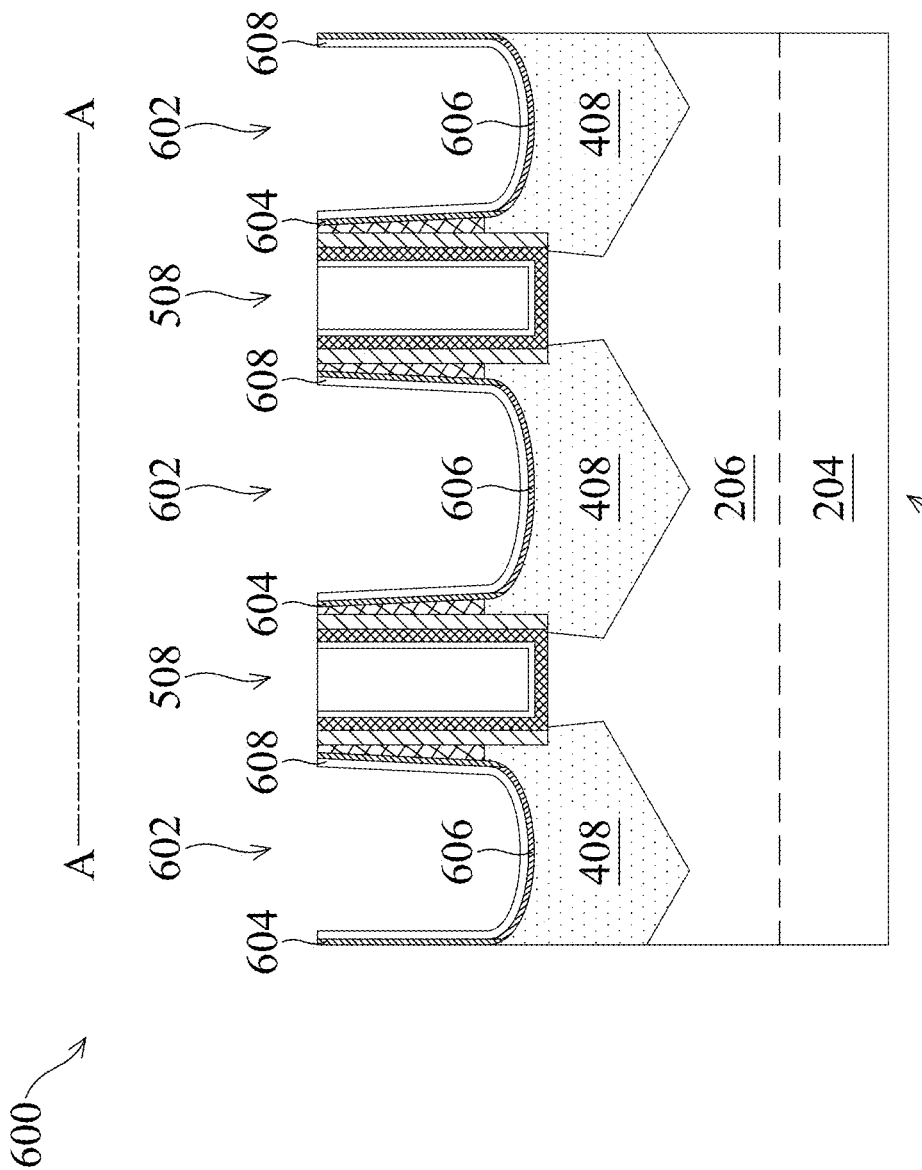
Figure 6D:
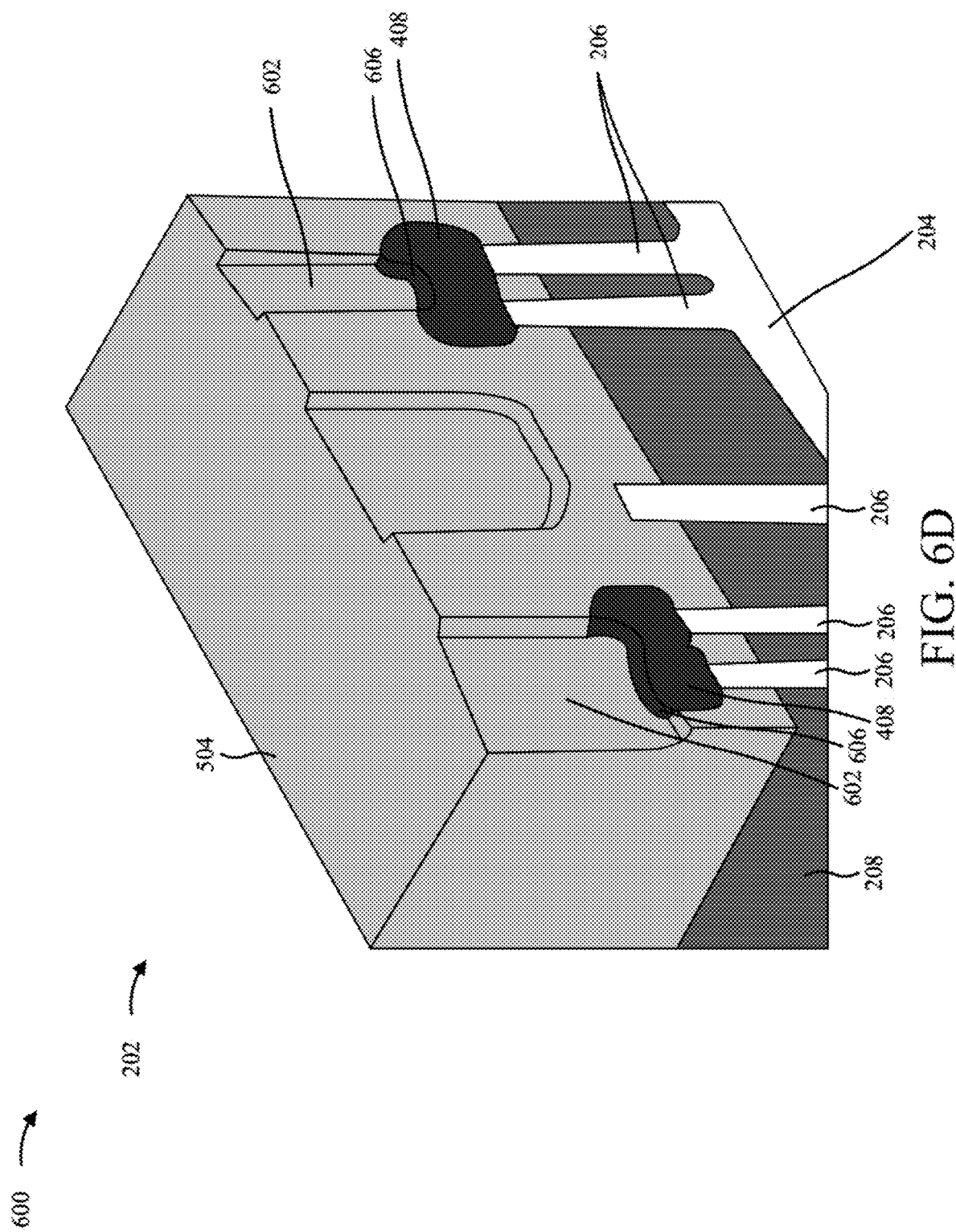
Figure 6E:
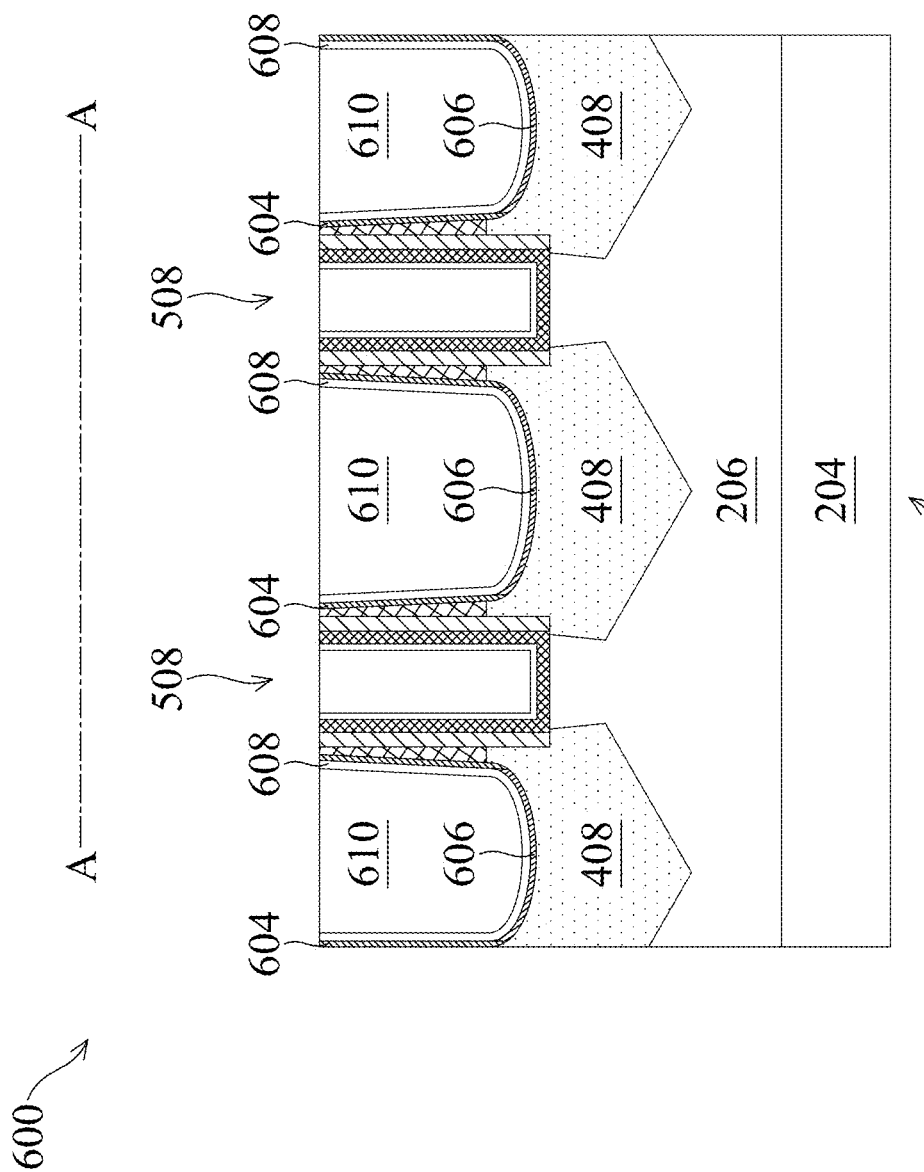
Figure 6F:
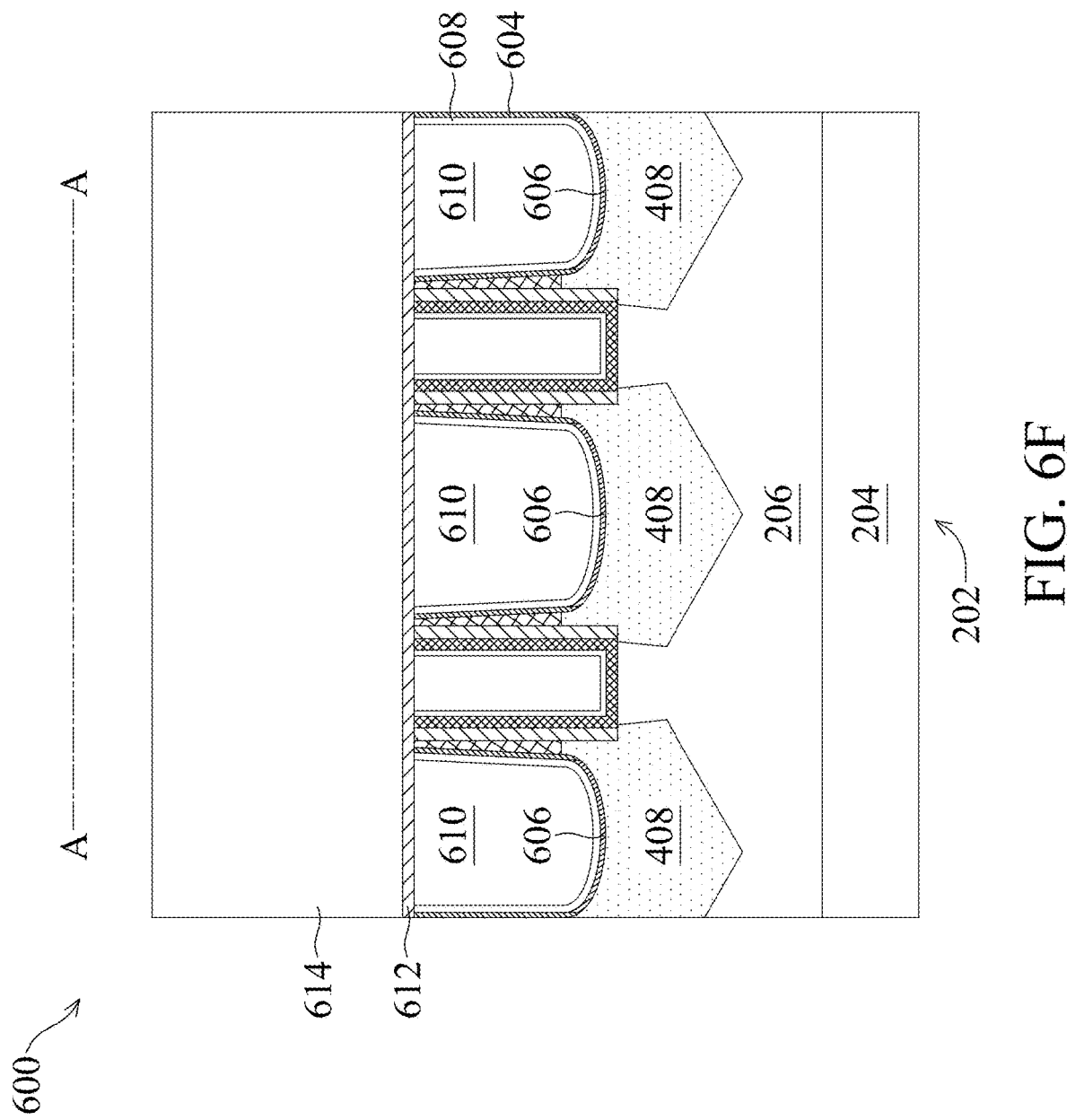
Figure 6G:
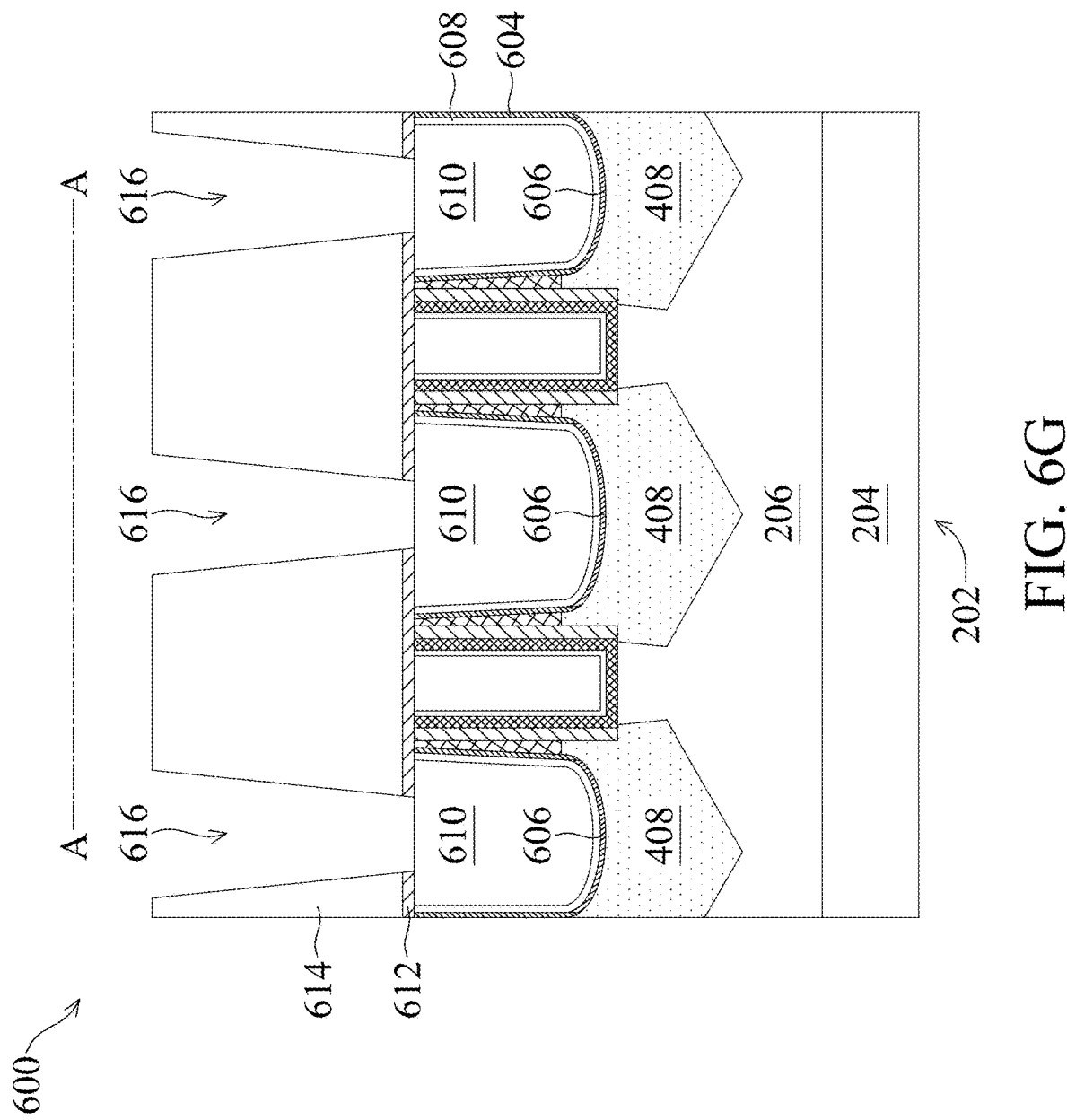
Figure 6H:
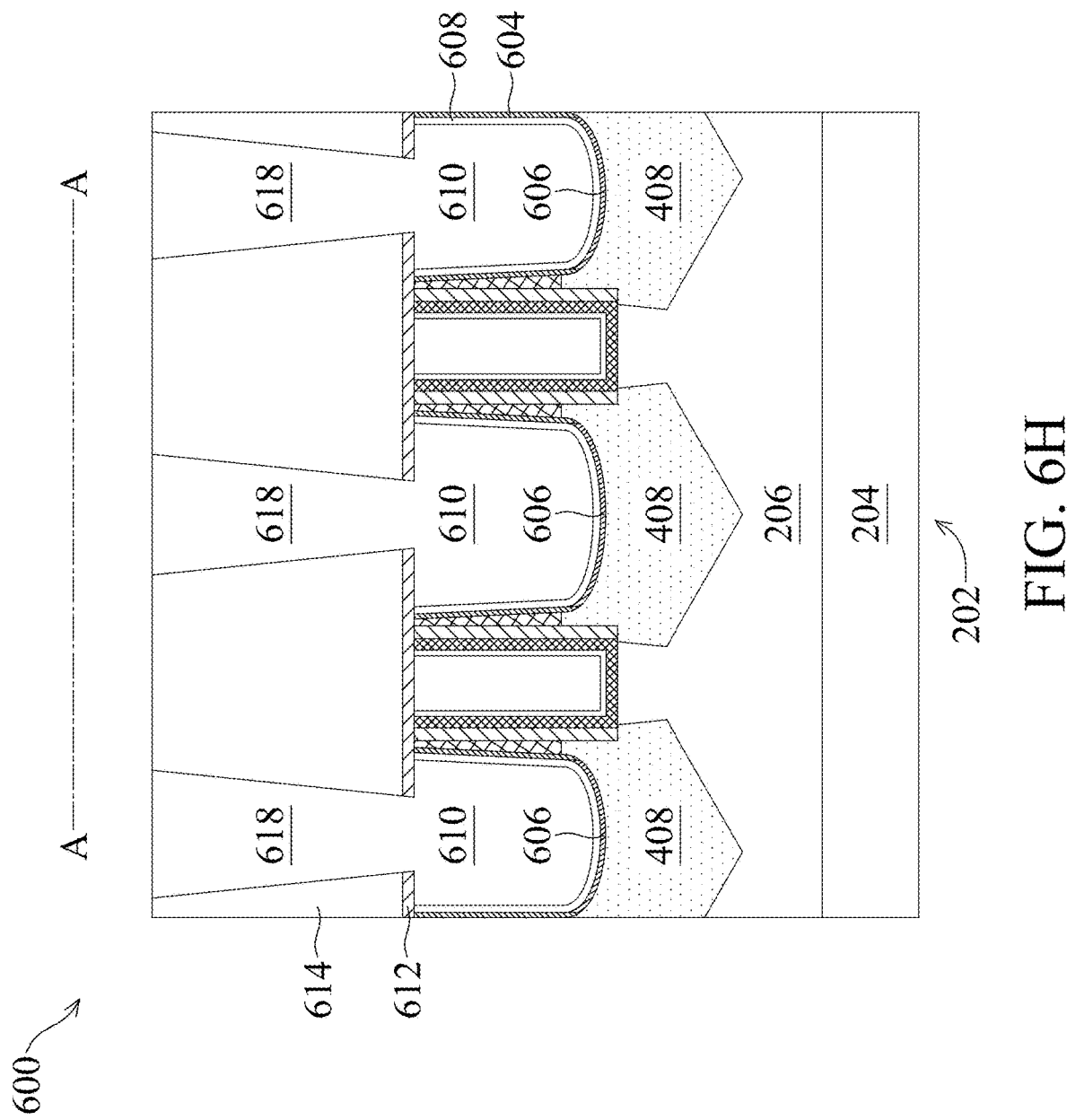
Figure 6I:
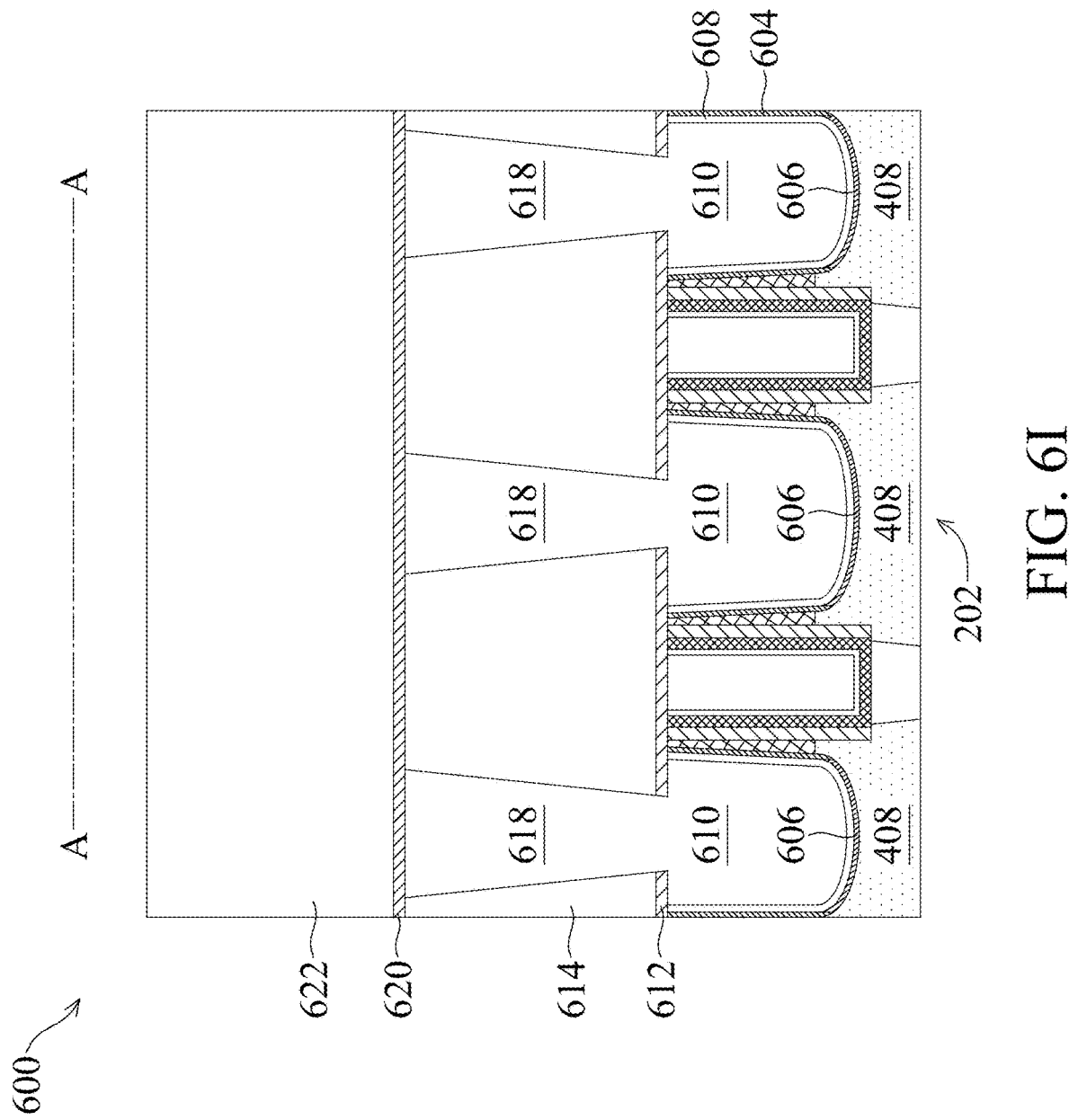
Figure 6J:
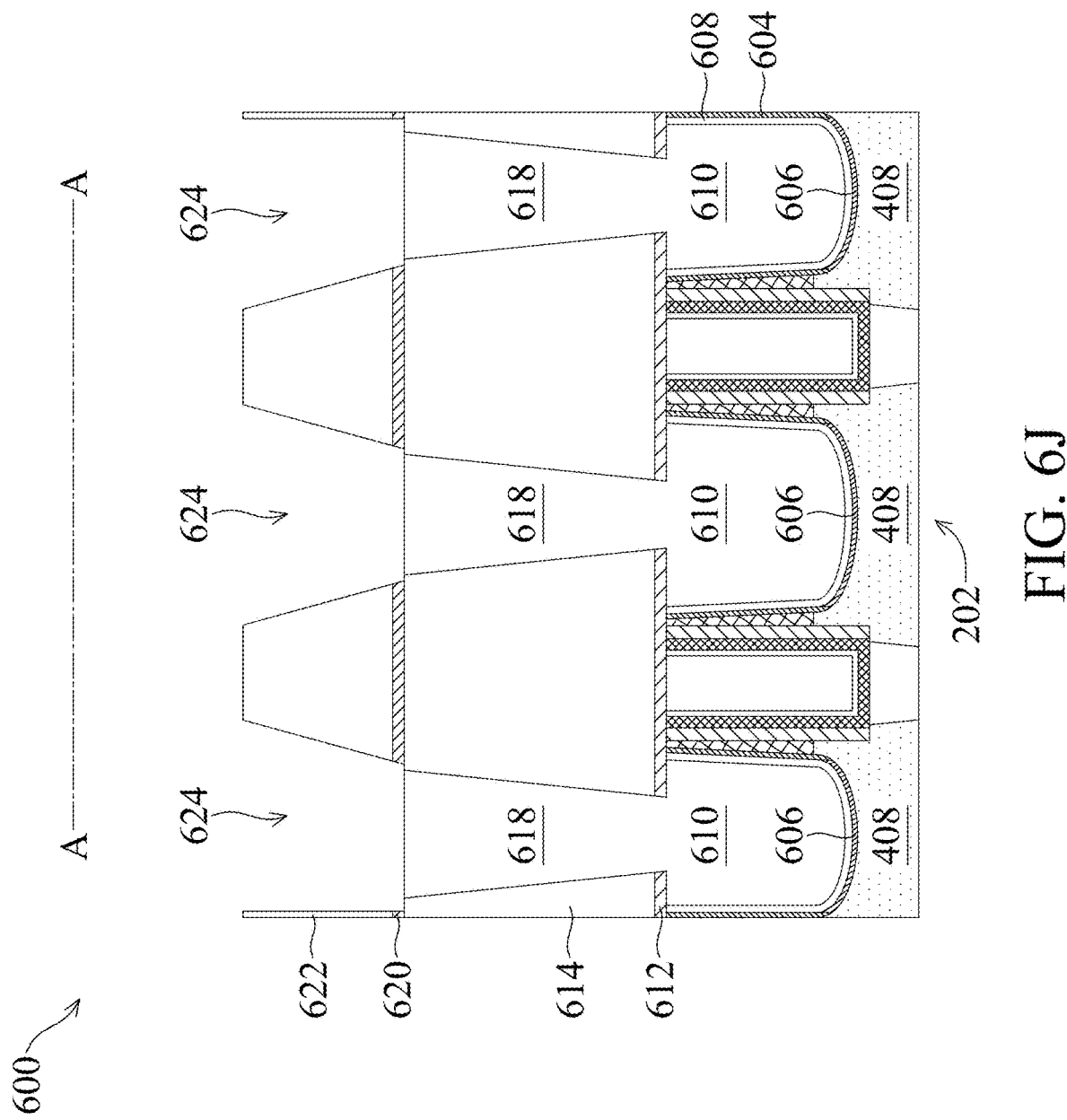
Figure 6K:
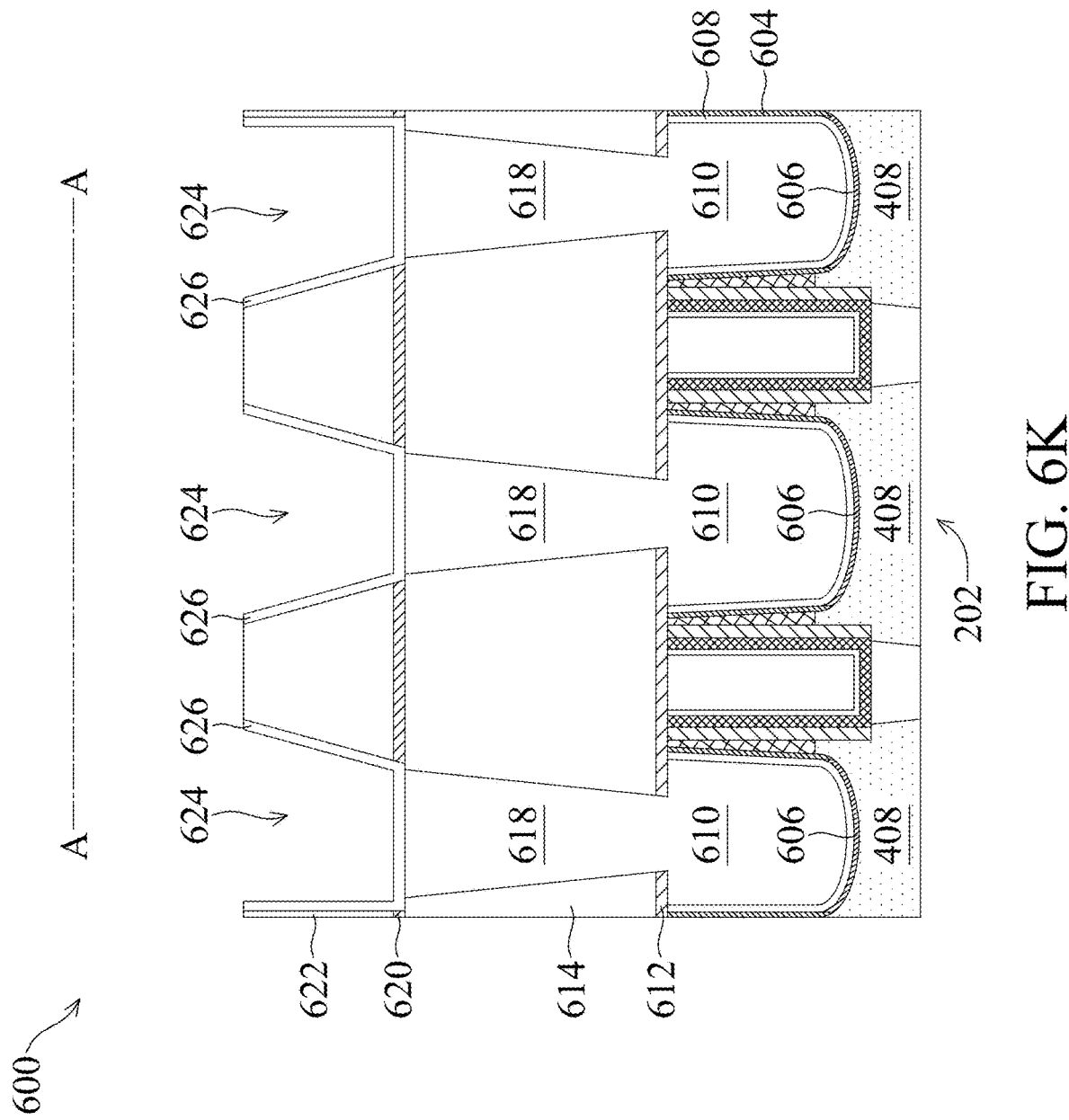
Figure 6L:
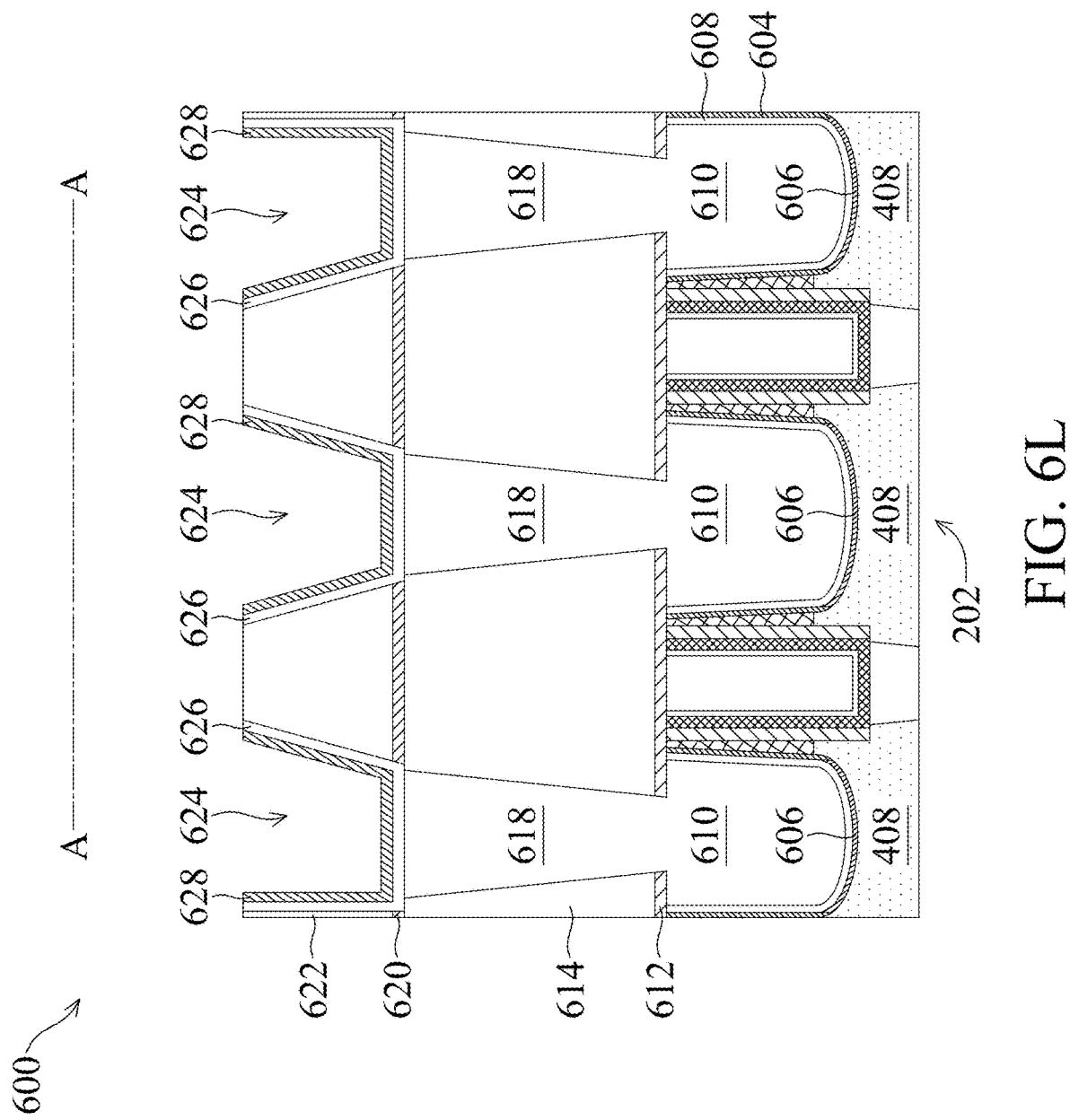
Figure 6M:
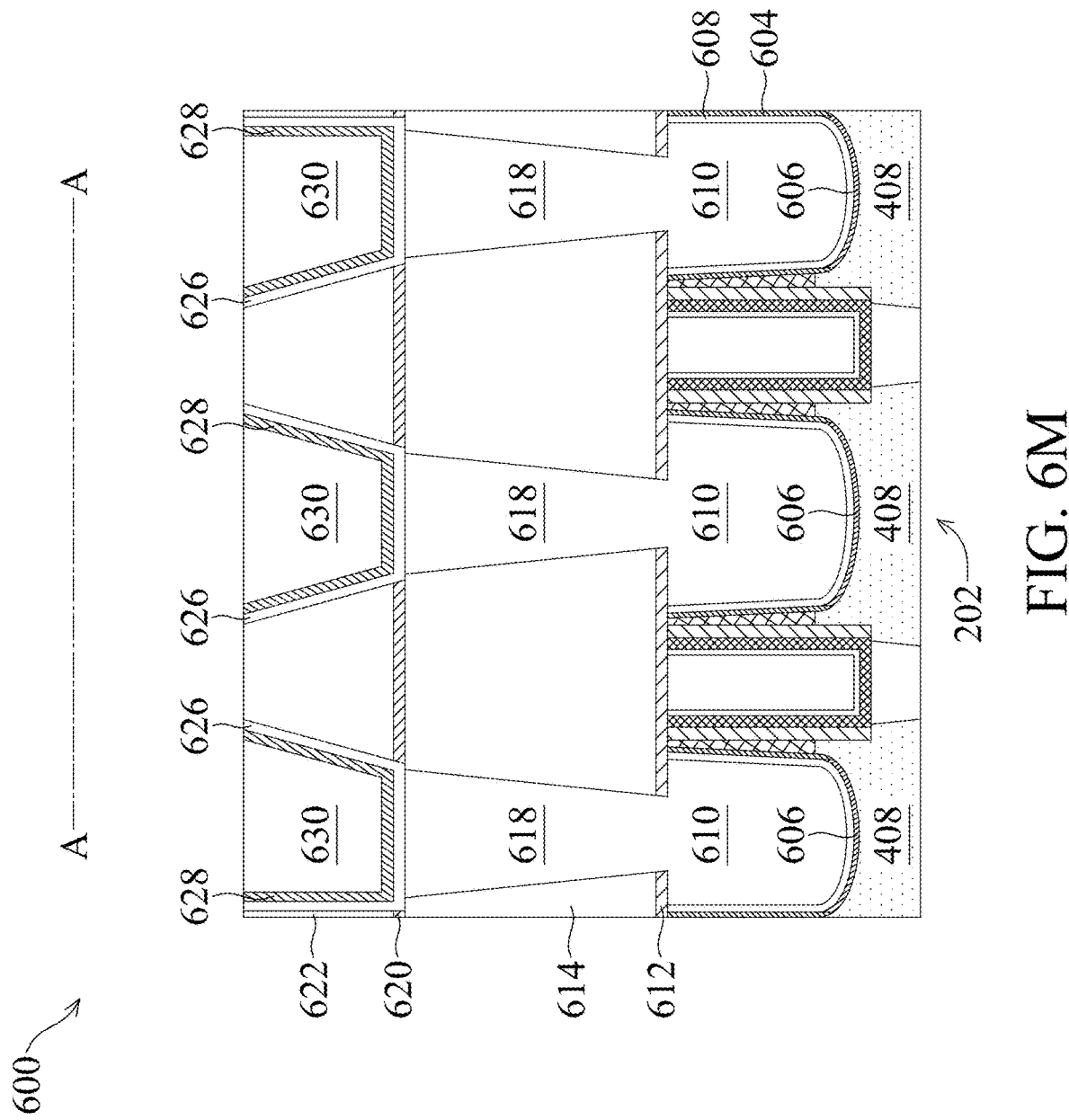
Figure 6N:
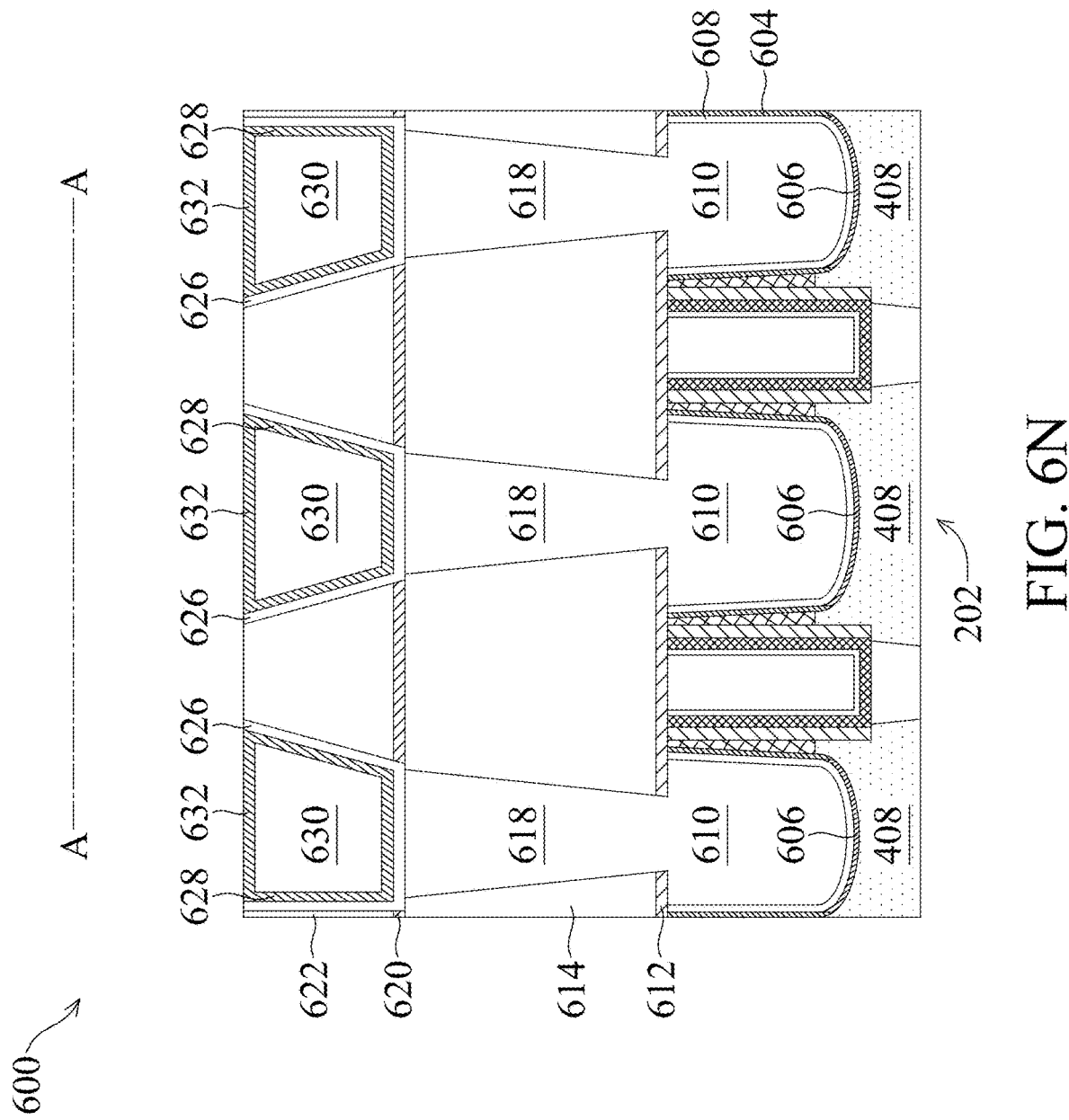

FIGS. 6A-6N are diagrams of an example implementation 600 described herein. The example implementation 600 includes an example of conductive structures and associated metal silicide layers for the semiconductor device 200. FIGS. 6A-6N are illustrated from the perspective of the cross-sectional plane A-A in FIG. 2 for the device region 202.

As shown in FIG. 6A, openings (or recesses) 602 are formed through one or more dielectric layers and to the source/drain regions 408. In particular, the CESL 502 and the ILD layer 504 between the gate structures 508 in the device region 202 are etched to form the openings 602 between the gate structures 508 and to the source/drain regions 408. In some implementations, the openings 602 are formed in a portion of the source/drain regions 408 such that recesses extend into a portion of the source/drain regions 408. An opening 602 includes a bottom surface 602a corresponding to a top surface of an associated source/drain region 408, and a plurality of sidewalls 602b corresponding to sides of the CESL 502 and/or the ILD layer 504.

In some implementations, a pattern in a photoresist layer is used to form the openings 602. In these implementations, the deposition tool 102 forms the photoresist layer on the ILD layer 504, and on the gate structures 508. The exposure tool 104 exposes the photoresist layer to a radiation source to pattern the photoresist layer. The developer tool 106 develops and removes portions of the photoresist layer to expose the pattern. The etch tool 108 etches into the ILD layer 504 to form the openings 602. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 602 based on a pattern.

In some implementations, a pre-clean operation is performed to clean the surfaces (e.g., the bottom surface 602a, the sidewalls 602b) in the openings 602. In particular, the semiconductor device 200 may be positioned in a processing chamber (e.g., of a deposition tool 102 that includes a pre-clean processing chamber), the processing chamber may be pumped down to an at least partial vacuum, and the surfaces in the openings 602 are cleaned using a plasma-based and/or a chemical-based pre-clean agent. The pre-clean operation is performed to clean (e.g., remove) oxides and other contaminants or byproducts from the top surfaces of the source/drain regions 408 and/or from other surfaces in the openings 602 that may have formed after the formation of the openings 602.

As shown in FIG. 6B, a nitride layer 604 is formed on the sidewalls 602b in the openings 602. For example, the deposition tool 102 forms the nitride layer 604 on the sidewalls 602b in the openings 602. The nitride layer 604 may include a silicon nitride ($Si_xN_y$) layer or another type of nitride layer. The deposition tool 102 may deposit the nitride layer 604 onto the sidewalls 602b in the opening 602 using a CVD operation, a PVD operation, an ALD operation, and/or another type of deposition operation. In some implementations, a blocking layer may be formed on the bottom surface 602a in the openings 602 prior to formation of the nitride layer 604 to block the nitride layer 604 from being formed on the source/drain regions 408. The blocking layer may be removed after formation of the nitride layer 604.

As shown in FIG. 6C, a metal silicide layer 606 is formed on the source/drain regions 408 in the openings 602 after the nitride layer 604 is formed. For example, the deposition tool 102 forms the metal silicide layer 606 on the source/drain regions 408 in the openings 602. The metal silicide layer 606 may be formed on the source/drain regions 408 to decrease contact resistance between the source/drain regions 408 and conductive structures (e.g., source/drain contacts) that are to be formed in the openings 602 over the source/drain regions 408. Moreover, the metal silicide layer 606 may protect the source/drain regions 408 from oxidization and/or other contamination. The metal silicide layer 606 includes a titanium silicide ($TiSi_x$) layer or another type of metal silicide layer.

The metal silicide layer 606 is formed in a soaking process, which is performed as part of a plasma-based deposition operation such as an LPCVD operation or a PECVD operation, among other examples. The deposition tool 102 provides a flow of a metal precursor, such as a titanium precursor (e.g., a titanium chloride ($TiCl_x$ such as $TiCl_4$) or another type of titanium precursor), into the openings 602 along with a flow of a reactant gas (e.g., a hydrogen ($H_2$) gas or another type of reactant or processing gas). A plasma (e.g., an argon (Ar) plasma, a helium (He) plasma, a nitrogen ($N_2$) plasma, or another type of plasma) is also provided into the openings 602. Titanium (Ti) of the titanium chloride, silicon (Si) of the source/drain region, hydrogen (H) in the reactant gas, and the plasma react to selectively form the metal silicide layer 606 (e.g., a titanium silicide ($TiSi_x$) layer) on the top surfaces of the source/drain region regions 408 (which correspond to the bottom surfaces 602a in the openings 602).

The gas phase reaction in the plasma-based deposition operation may include:

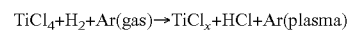

in which an argon plasma is formed from an argon gas, and hydrochloric acid (HCl) is formed from the titanium chloride ($TiCl_4$) and the hydrogen gas. The reaction that occurs on the source/drain regions 408 in the openings 602 may include:

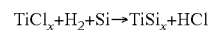

where the argon plasma is used as a surface treatment to form mobilized silicon atoms in the source/drain regions 408. The surface treatment causes the mobilized silicon atoms to diffuse toward the top surface of the source/drain regions 408, resulting in the formation of silicon-rich surfaces of the source/drain regions 408. Here, the mobilized silicon atoms and the titanium in the titanium chloride react to selectively form a titanium silicide layer (e.g., the metal silicide layer 606) on the silicon-rich surfaces of the source/drain regions 408. Chlorine (Cl) in the titanium chloride and the hydrogen in the hydrogen gas also react to form a hydrochloric acid (HCl) byproduct.

The time duration of the plasma-based deposition operation may be included in a range of approximately 80 seconds to approximately 160 seconds to form the metal silicide layer 606 to a sufficient thickness while minimizing pure titanium growth on the metal silicide layer 606. However, other values for the time duration are within the scope of the present disclosure. The plasma-based deposition operation may be performed while a temperature in a processing chamber of the deposition tool 102, in which the plasma-based deposition operation is performed, is in a range of approximately 300 degrees Celsius to approximately 500 degrees Celsius to provide sufficient metal silicide formation while maintaining a sufficiently low titanium deposition rate (e.g., such that the titanium chloride etching rate of titanium on the source/drain regions 408 is greater than the titanium deposition rate on the source/drain regions 408). However, other values for the temperature range are within the scope of the present disclosure. The pressure in the processing chamber may be in a range of approximately 1 Torr to approximately 10 Torr to provide sufficient pressure to facilitate a reaction between the titanium chloride and the source/drain regions 408 while minimizing the likelihood of titanium chloride condensation in the processing chamber. However, other values for the pressure are within the scope of the present disclosure. The operating power of the plasma may be in a range of approximately 100 watts to approximately 1500 watts to facilitate sufficient silicon migration in the source/drain regions 408 while minimizing plasma damage to other structures of the semiconductor device 200. However, other values for the operating power are within the scope of the present disclosure.

As further shown in FIG. 6C, a metal silicon nitride layer 608 is formed on the nitride layer 604 and on the metal silicide layer 606 in the plasma-based deposition operation. The titanium of the titanium chloride, the silicon of the nitride (e.g., silicon nitride) layer 604, the reactant gas, and the plasma react to selectively form a titanium silicon nitride (TiSi$_x$N$_y$) layer (e.g., the metal silicon nitride layer 608) on the nitride layer 604.

The metal silicon nitride layer 608 may function as a glue layer to promote adhesion between the ILD 504 or the nitride layer 604 and metal source/drain contacts that are to be formed in the openings 602 while minimizing the critical dimension (or cross-sectional width) reduction of the metal source/drain contacts. This increases the gap filling performance (or the performance of filling the openings 602 with conductive material to form the metal source/drain contacts), which reduces defect formation in the metal source/drain contacts. The thickness of the metal silicon nitride layer 608 on the nitride layer 604 may be in a range of approximately 5 nanometers to approximately 11 nanometers as a result of forming the metal silicide layer 606 to a sufficient thickness and to minimize critical dimension shrinkage for the metal source/drain contacts that are to be formed in the openings 602. However, other values for the thickness of the metal silicon nitride layer 608 are within the scope of the present disclosure.

The titanium of the titanium chloride, the silicon of the titanium silicide layer, the reactant gas, and the plasma react to selectively form a titanium silicon nitride (TiSi$_x$N$_y$) layer (e.g., the metal silicon nitride layer 608) on the metal silicide layer 606. The metal silicon nitride layer 608 forms on top of the metal silicide layer 606 as a result of the titanium precursor reacting with the silicon in the metal silicide layer 606. The nitrogen comes from the nitrogen in the nitride layer 604 on the sidewalls 602b in the opening and/or from nitrogen in the plasma that is used in the plasma-based deposition operation.

FIG. 6D illustrates a three-dimensional perspective view of the device region 202 of the semiconductor device 200 after formation of the metal silicide layer 606. As shown in FIG. 6D, the metal silicide layer 606 is included on the source/drain regions 408 at the bottom of the openings 602. The openings 602 may be formed to expose portions of the top surfaces of the source/drain regions 408 depending on the locations on which source/drain contacts are to be subsequently formed to the source/drain regions 408. For example, an opening 602 may be formed to enable a source/drain contact to land on a particular side of a source/drain region 408, to increase the surface area in which a source/drain contact physically connects with a source/drain region 408, and/or for other purposes.

As shown in FIG. 6E, metal source/drain contacts (MDs) 610 (e.g., conductive structures) are formed in the openings 602 in the device region 202. In particular, the source/drain contacts 610 are formed over the source/drain regions 408, are formed over and/or on the metal silicide layer 606, and/or are formed on the metal silicon nitride layer 608. In some implementations, the metal source/drain contacts 610 are formed on a barrier layer (e.g., a tantalum nitride barrier layer or a titanium nitride barrier layer) in implementations in which an additional barrier layer is included on the metal silicon nitride layer 608. In some implementations, the metal source/drain contacts 610 are formed in the opening 602 without an additional barrier layer, and may be referred to as barrierless metal source/drain contacts. The deposition tool 102 and/or the plating tool 112 deposits the source/drain contacts 610 using a CVD technique, a PVD technique, an ALD technique, an electroplating technique, another deposition technique described above in connection with FIG. 1, and/or a deposition technique other than as described above in connection with FIG. 1. The deposition tool 102 fills the openings 602 with a conductive material to form the metal source/drain contacts 610. The metal source/drain contacts 610 include ruthenium (Ru) metal source/drain contacts, tungsten (W) metal source/drain contacts, cobalt (Co) metal source/drain contacts, or metal source/drain contacts formed of another metal.

As shown in FIG. 6F, one or more dielectric layers are formed over and/or on the gate structures 508 and over and/or on the metal source/drain contacts 610. The deposition tool 102 may deposit the one or more dielectric layers using a CVD technique, a PVD technique, an ALD technique, and/or another deposition technique. The one or more dielectric layers include an etch stop layer (ESL) 612, an ILD layer 614 (e.g., an ILD1 layer, an ILD2 layer), and/or another dielectric layer.

As shown in FIG. 6G, openings (or recesses) 616 are formed in and through the ILD layer 614, in and through the ESL 612, and to the top surfaces of metal source/drain contacts 610. In some implementations, a pattern in a photoresist layer is used to form the openings 616. In these implementations, the deposition tool 102 forms the photoresist layer on the ILD layer 614. The exposure tool 104 exposes the photoresist layer to a radiation source to pattern the photoresist layer. The developer tool 106 develops and removes portions of the photoresist layer to expose the pattern. The etch tool 108 etches into the ILD layer 614 and into the ESL 612 to form the openings 616. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 616 based on a pattern.

As shown in FIG. 6H, source/drain interconnects (via-to-source/drain or VDs) 618 (e.g., conductive structures) are formed in the openings 616 in the device region 202. In particular, the source/drain interconnects 618 are formed on the metal source/drain contacts 610 such that the source/drain interconnects 618 and the metal source/drain contacts 610 are electrically and physically connected. The deposition tool 102 and/or the plating tool 112 deposits the source/drain interconnects 618 using a CVD technique, a PVD technique, an ALD technique, an electroplating technique, another deposition technique described above in connection with FIG. 1, and/or a deposition technique other than as described above in connection with FIG. 1. The deposition tool 102 fills the openings 616 with a conductive material to form the source/drain interconnects 618.

The source/drain interconnects 618 include ruthenium (Ru) metal source/drain contacts, tungsten (W) metal source/drain contacts, cobalt (Co) metal source/drain contacts, or metal source/drain contacts formed of another metal. In particular, the source/drain interconnects 618 and the metal source/drain contacts 610 include the same type of material such as ruthenium (Ru). Thus, the source/drain interconnects 618 and the metal source/drain contacts 610 include a homogeneous conductive material, which reduces and/or minimizes the occurrence of solid solutioning between the source/drain interconnects 618 and the metal source/drain contacts 610, reduces the occurrence of galvanic corrosion between the source/drain interconnects 618 and the metal source/drain contacts 610, and/or reduces the occurrence of phase transitioning in the source/drain interconnects 618 and the metal source/drain contacts 610. This reduces contact resistance between the source/drain interconnects 618 and the metal source/drain contacts 610, reduces surface roughness of the source/drain interconnects 618 and the metal source/drain contacts 610, and/or reduces separation of the source/drain interconnects 618 and the metal source/drain contacts 610, among other examples. The contact resistance that may be achieved for a source/drain interconnect structure 618 as a result of the use of homogeneous materials in the source/drain interconnects 618 and the metal source/drain contacts 610 may be in a range of approximately 30 ohms to approximately 80 ohms. The contact resistance that may be achieved for a metal source/drain contact 610 as a result of the use of homogeneous materials in the source/drain interconnects 618 and the metal source/drain contacts 610 may be in a range of approximately 30 ohms to approximately 80 ohms. However, other values for the contact resistances of the source/drain contacts 610 and for the source/drain interconnect structures 618 are within the scope of the present disclosure.

As shown in FIG. 6I, one or more dielectric layers are formed over and/or on the ILD layer 614 and over and/or on the source/drain interconnect structures 618. The deposition tool 102 may deposit the one or more dielectric layers using a CVD technique, a PVD technique, an ALD technique, and/or another deposition technique. The one or more dielectric layers include an ESL 620, an ILD layer 622 (e.g., an ILD2 layer or another ILD layer), and/or another dielectric layer.

As shown in FIG. 6J, openings (or recesses) 624 are formed in and through the ILD layer 622, in and through the ESL 620, and to the top surfaces of source/drain interconnect structures 618. In some implementations, a pattern in a photoresist layer is used to form the openings 624. In these implementations, the deposition tool 102 forms the photoresist layer on the ILD layer 622. The exposure tool 104 exposes the photoresist layer to a radiation source to pattern the photoresist layer. The developer tool 106 develops and removes portions of the photoresist layer to expose the pattern. The etch tool 108 etches into the ILD layer 622 and into the ESL 620 to form the openings 624. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 624 based on a pattern.

As shown in FIG. 6K, a barrier layer 626 is formed in the openings 624. The barrier layer 626 may include a tantalum nitride ($Ta_xN_y$) barrier layer, a titanium nitride ($Ti_xN_y$) barrier layer, or another type of barrier layer. The deposition tool 102 may deposit the barrier layer 626 using a CVD technique, a PVD technique, an ALD technique, and/or another deposition technique.

As shown in FIG. 6L, a liner 628 is formed in the openings 624 on the barrier layer 626. The liner 628 and the barrier layer 626 may be included to reduce, minimize, and/or prevent copper electromigration from back end of line (BEOL) layers that are to be formed in the openings 624 to other areas of the semiconductor device 200 (which can cause material degradation and device performance reduction). The liner 628 includes cobalt (Co) or another type of metal liner. The deposition tool 102 may deposit the liner 628 using a CVD technique, a PVD technique, an ALD technique, and/or another deposition technique.

As shown in FIG. 6M, the openings 624 are filled with a conductive material such as copper (Cu) to form BEOL metallization structures 630. The BEOL metallization structures 630 may include metal-zero (M0) metal lines, via-one (V1) metal vias, and/or other types of BEOL metallization layers. The deposition tool 102 and/or the plating tool 112 deposits the BEOL metallization structures 630 using a CVD technique, a PVD technique, an ALD technique, an electroplating technique, another deposition technique described above in connection with FIG. 1, and/or a deposition technique other than as described above in connection with FIG. 1.

As shown in FIG. 6N, a capping layer 632 is formed on BEOL metallization structures 630. The capping layer 632 is included to reduce, minimize, and/or prevent copper migration upward to other BEOL layers in the semiconductor device 200. The capping layer 632 includes cobalt (Co) or another type of metal capping layer. The deposition tool 102 may deposit the capping layer 632 using a CVD technique, a PVD technique, an ALD technique, and/or another deposition technique.

As indicated above, FIGS. 6A-6N are provided as an example. Other examples may differ from what is described with regard to FIGS. 6A-6N. In some implementations, the metal silicide and homogenous conductive structure formation techniques described in connection with FIGS. 6A-6N may be performed to form a metal gate contact and a gate interconnect structure over a gate structure 508 or another transistor structure in the device region 202 of the semiconductor device 200.

FIGS. 7A-7F are diagrams of an example implementation 700 described herein. The example implementation 700 includes an alternative example of forming conductive structures and associated metal silicide layers for the semiconductor device 200. In particular, the example implementation 700 includes an example of forming an integrated (one-piece) contact and interconnect that extends from a source/drain region (or another type of transistor structure) to a BEOL metallization layer (e.g., an M0 metal line or another type of BEOL metallization layer). FIGS. 7A-7F are illustrated from the perspective of the cross-sectional plane C-C in FIG. 2 for the device region 202.

Figure 7A:
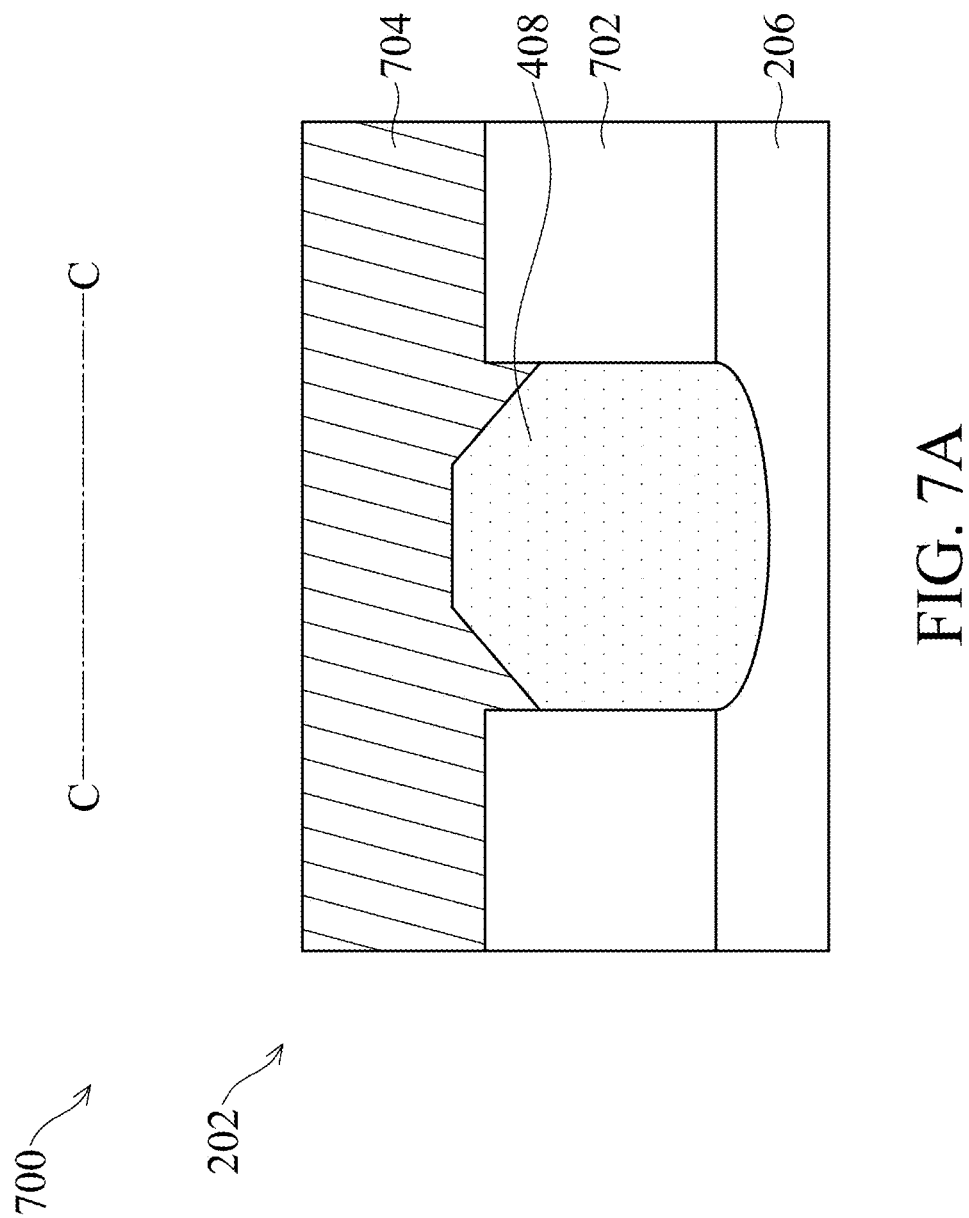

As shown in FIG. 7A, the device region 202 may include the fin structures 206. A silicon oxide ($SiO_x$) layer 702 is included over and/or on the fin structures 206, and a silicon nitride ($Si_xN_y$) layer 704 is included over and/or on the silicon oxide layer 702. The deposition tool 102 deposits the silicon oxide layer 702 and the silicon nitride layer 704 using a CVD technique, a PVD technique, an ALD technique, and/or another deposition technique.

As further shown in FIG. 7A, a source/drain region 408 is included over and/or on a fin structure 206. Moreover, the source/drain region 408 is included in (or in between portions of) the silicon oxide layer 702. Portions of the silicon nitride layer 704 may extend downward into portions of the silicon oxide layer 702 in regions along slanted or angled surfaces of the source/drain region 408, as shown in the example in FIG. 7A.

Figure 7B:
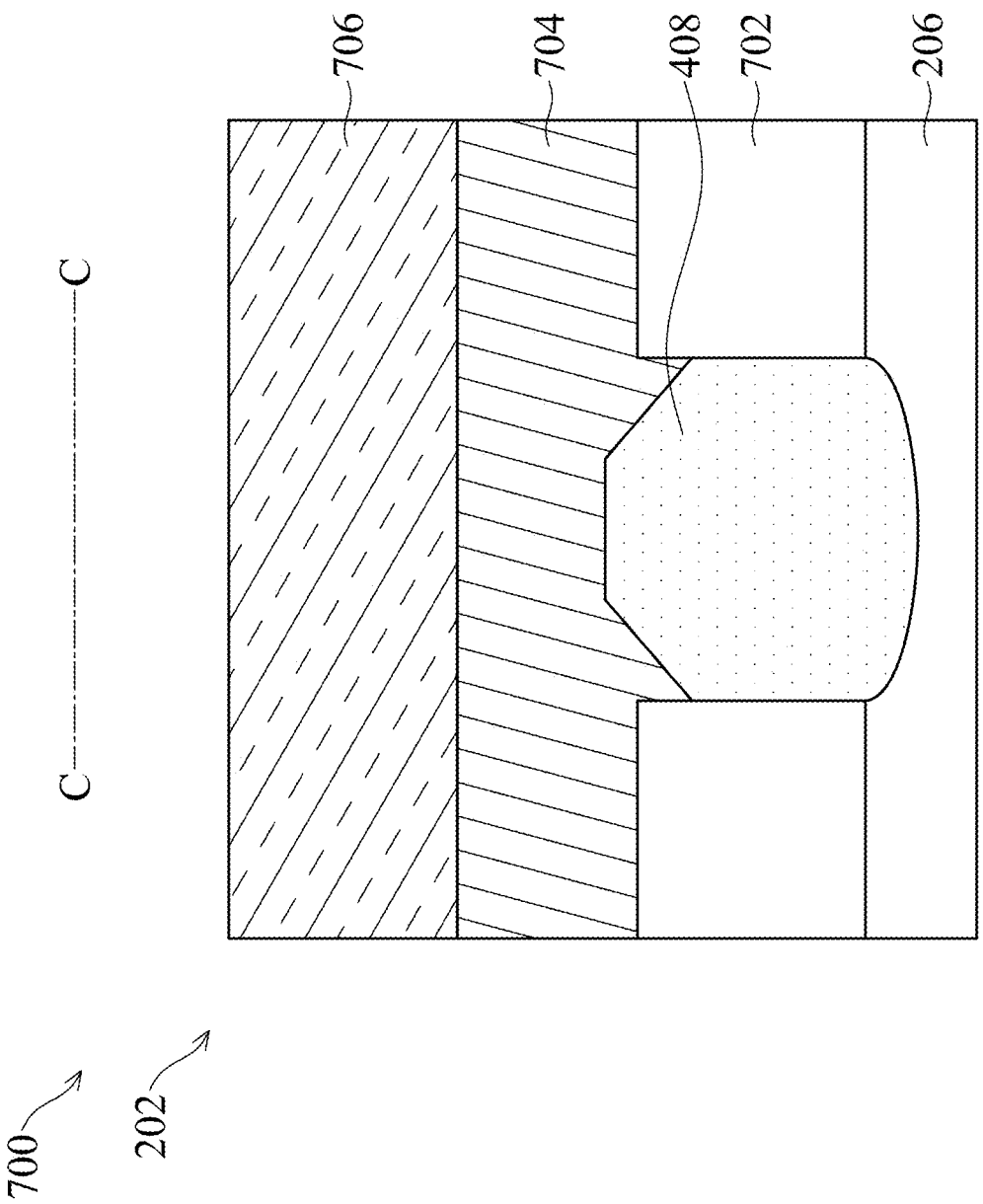

As shown in FIG. 7B, another silicon oxide layer 706 is formed over and/or on the silicon nitride layer 704 to form an $SiO_x/Si_xN_y/SiO_x$ stack. The deposition tool 102 deposits the silicon oxide layer 706 using a CVD technique, a PVD technique, an ALD technique, and/or another deposition technique. In some implementations, one or more of the silicon oxide layers 702 and/or 706 are included in the device region 202 of the semiconductor device in addition to the ILD 614. In some implementations, one or more of the silicon oxide layers 702 and/or 706 are included in the device region 202 of the semiconductor device as an alternative to the ILD 614. In some implementations, the silicon nitride layer 704 is included in the device region 202 of the semiconductor device in addition to the CESL 502, the nitride layer 604, and/or the ESL 612. In some implementations, the silicon nitride layer 704 is included in the device region 202 of the semiconductor device as an alternative to the CESL 502, the nitride layer 604, and/or the ESL 612.

Figure 7C:
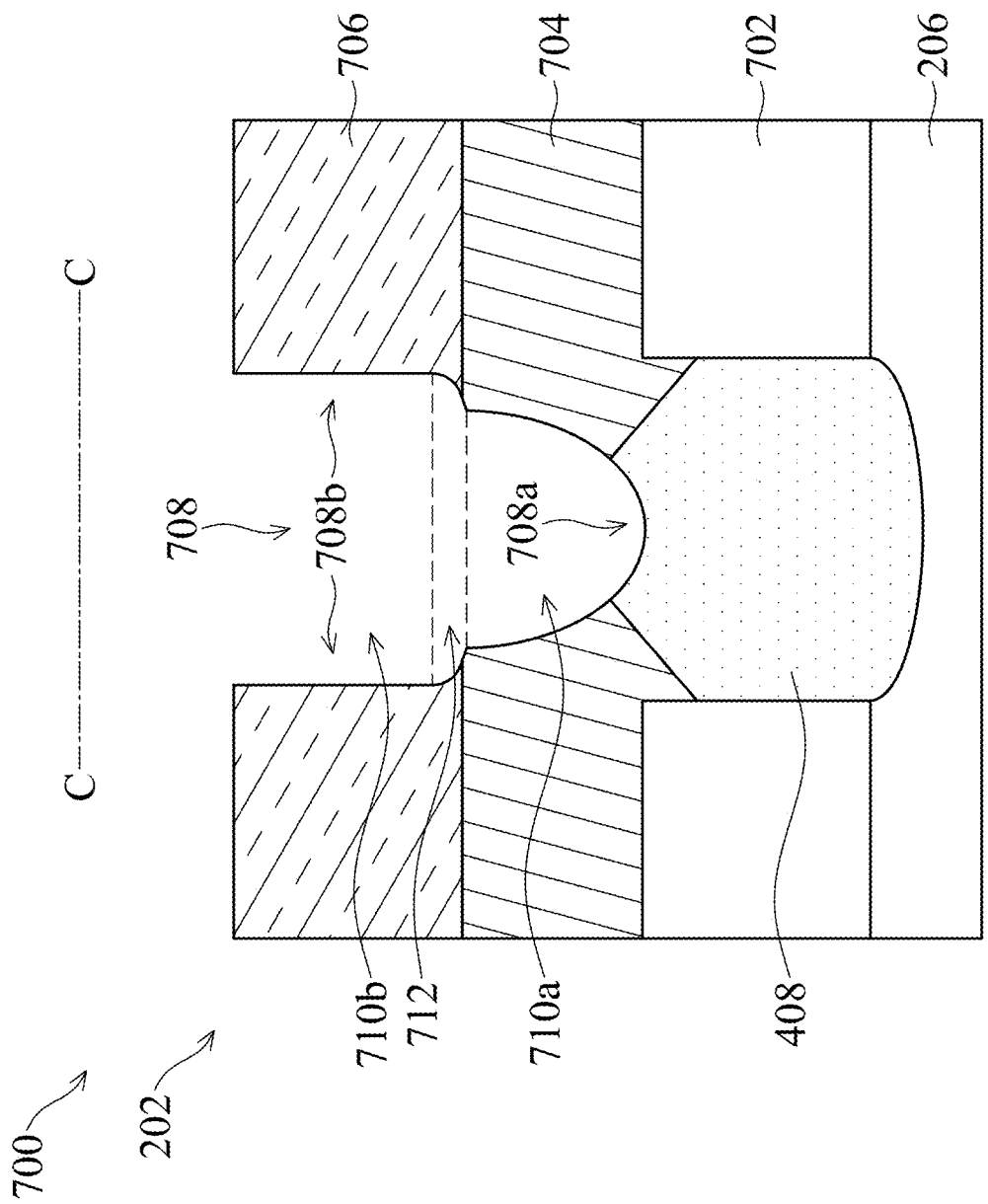

As shown in FIG. 7C, an opening (or recess) 708 is formed in and through the silicon oxide layer 706, in and through the silicon nitride layer 704, and to the source/drain region 408. In some implementations, the opening 708 is formed into a portion of the source/drain region 408, as shown in the example in FIG. 7C. The opening 708 includes a bottom surface 708a (which corresponds to a top surface of the source/drain region 408) and a plurality of sidewalls 708b (which correspond to sides of the silicon oxide layer 706 and sides of the silicon nitride layer 704).

In some implementations, a pattern in a photoresist layer is used to form the opening 708. In these implementations, the deposition tool 102 forms the photoresist layer on the silicon oxide layer 706. The exposure tool 104 exposes the photoresist layer to a radiation source to pattern the photoresist layer. The developer tool 106 develops and removes portions of the photoresist layer to expose the pattern. The etch tool 108 etches into the silicon oxide layer 706 and into the silicon nitride layer 704 to form the opening 708. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the opening 708 based on a pattern.

In some implementations, the sidewalls 708b are curved in a lower region 710a of the opening 708 through the silicon nitride layer 704, and the sidewalls 708b are approximately straight in an upper region 710b of the opening 708 through the silicon oxide layer 706. In some implementations, the sidewalls 708b are angled or tapered in the upper region 710b of the opening 708. As further shown in FIG. 7C, the opening 708 includes a necked region 712 that is located at the bottom of the silicon oxide layer 706 adjacent to the silicon nitride layer 704. The necked region 712 is located between the lower region 710a and the upper region 710b. The opening 708 transitions between the lower region 710a and the upper region 710b in the necked region 712.

The necked region 712 includes a sharply tapered, angled, or curved portion of the sidewalls 708b. The width of the opening 708 transitions (e.g., quickly increases) from a first width at the top of the lower region 710a to a width of the upper region 710b. The necked region 712 occurs or is formed as a result of a difference in etch rate between an etch rate of the silicon nitride layer 704 and an etch rate of the silicon oxide layer 706. In particular, the etch rate of the silicon oxide layer 706 is greater relative to the etch rate of the silicon nitride layer 704. The width of the opening 708 in the upper region 710b in the silicon oxide layer 706 is greater relative to the width of the opening 708 in the lower region 710a in the silicon nitride layer 704, as the etchant removes material from the silicon oxide layer 706 quicker than from the silicon nitride layer 704.

Figure 7D:
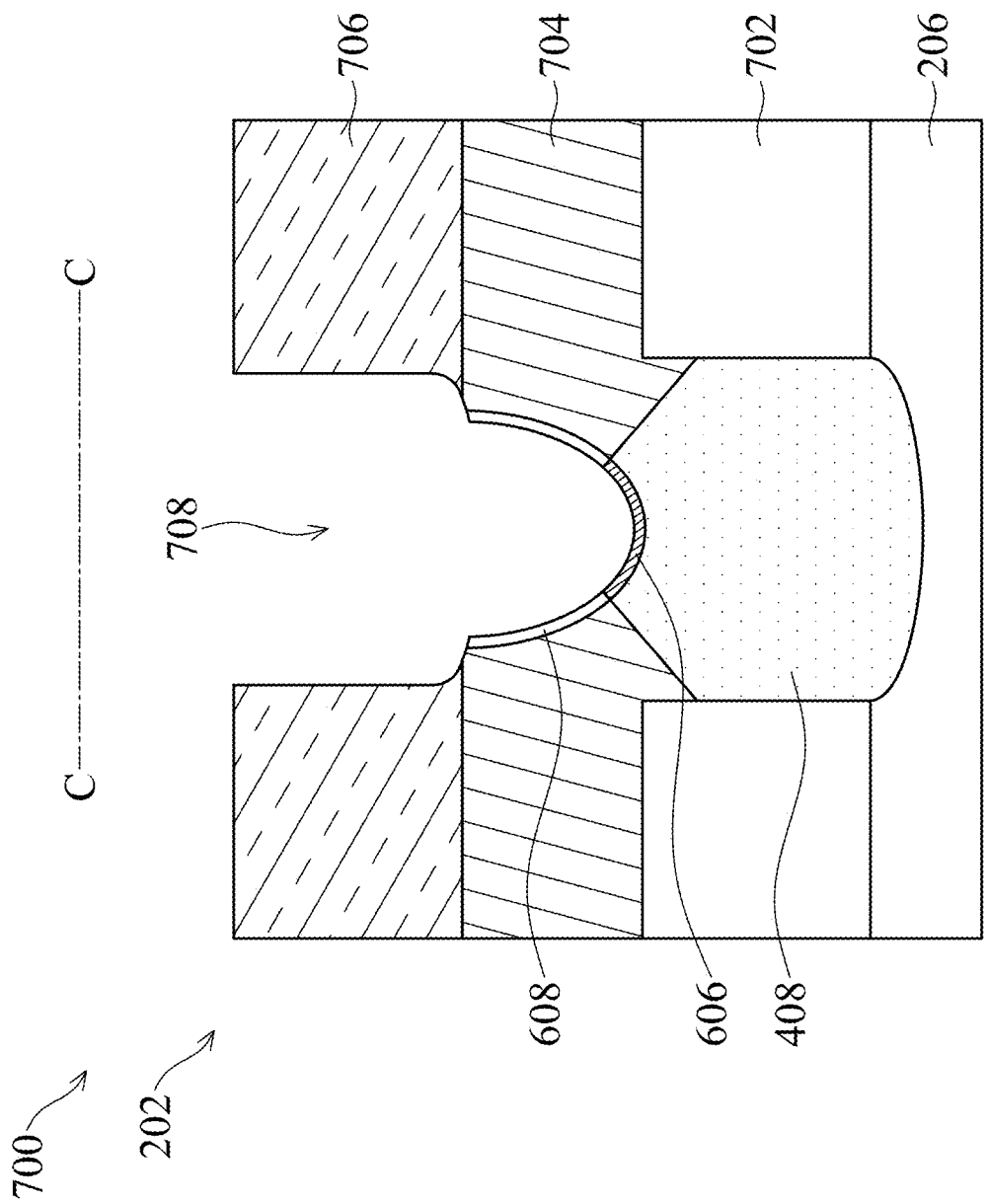

As shown in FIG. 7D, a metal silicide layer 606 (e.g., a titanium silicide ($TiSi_x$)) is formed on the source/drain region 408 in the opening 708. Moreover, a metal silicon nitride layer 608 (e.g., a titanium silicon nitride ($TiSi_xN_y$)) is formed on a portion of the sidewalls 708b in the opening 708. The metal silicide layer 606 and the metal silicon nitride layer 608 are formed in a plasma-based deposition operation, which may be performed by the deposition tool 102 as described above in connection with FIG. 6C. In this way, the metal silicide layer 606 is selectively formed on the source/drain region 408, and the metal silicon nitride layer 608 is selectively formed in the lower region 710a of the opening 708 on the portion of the sidewalls 708b corresponding to the silicon nitride layer 704. The metal silicon nitride layer 608 is selectively formed on the portion of the sidewalls 708b corresponding to the silicon nitride layer 704 (and not on the portion of the sidewalls 708b corresponding to the silicon oxide layer 706) as a result of the titanium precursor (e.g., titanium chloride ($TiCl_x$ such as $TiCl_4$)) used in the plasma-based deposition operation, and as a result of formation of silicon-rich surfaces on the source/drain region 408 and on the silicon nitride layer 704. As a result, the metal silicon nitride layer 608 is included below the silicon oxide layer 706, and below the necked region 712 in the opening 708. The metal silicon nitride layer 608 is also included above the silicon oxide layer 702.

Figure 7E:
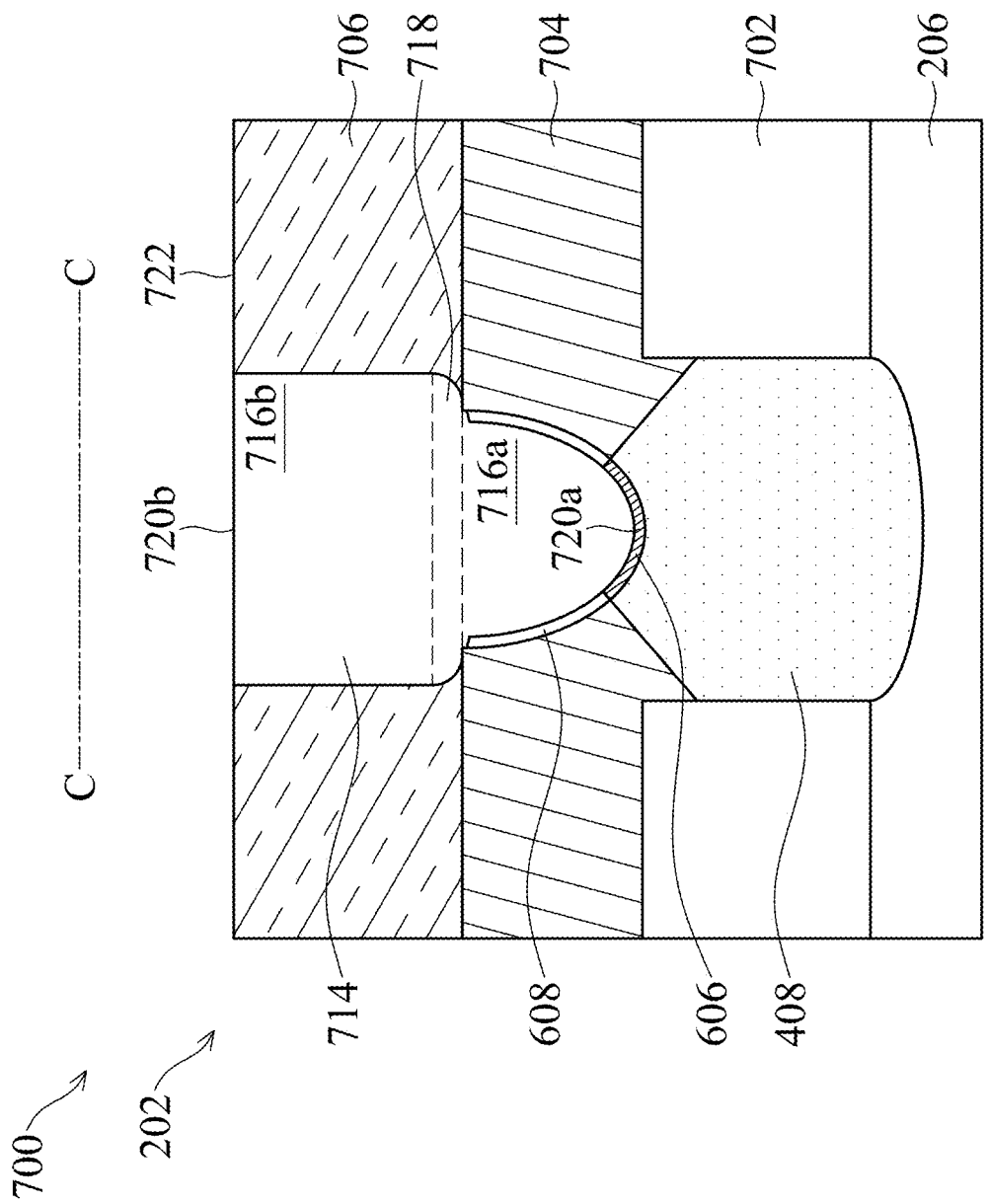

As shown in FIG. 7E, the opening 708 is filled with a conductive material to form an integrated contact and interconnect 714 in the opening 708. The deposition tool 102 and/or the plating tool 112 deposits the integrated contact and interconnect 714 in the opening 708 using a CVD technique, a PVD technique, an ALD technique, an electroplating technique, another deposition technique described above in connection with FIG. 1, and/or a deposition technique other than as described above in connection with FIG. 1. The integrated contact and interconnect 714 is formed over and/or on the metal silicide layer 606 in the opening 708, over and/or on the metal silicon nitride layer 608, and over and/or on the portion of the sidewalls 708b corresponding to the silicon oxide layer 706 in the opening 708. The integrated contact and interconnect 714 includes a homogeneous conductive material such as ruthenium (Ru) or another metal, and is not affected by defects such as solid solutioning and galvanic corrosion that might otherwise occur in separate (two-part) metal source/drain contacts and source/drain interconnects formed of respective and different types of conductive materials.

As further shown in FIG. 7E, the integrated contact and interconnect 714 conforms to the shape or profile of the opening 708. Accordingly, the integrated contact and interconnect 714 includes a lower region 716a in the silicon nitride layer 704, an upper region 716b in the silicon oxide layer 706, and a necked region 718 between the lower region 716a and the upper region 716b (and that transitions between the lower region 716a and the upper region 716b). The lower region 710a of the opening 708 is filled to form the lower region 716a over and/or on the metal silicide layer 606 and over and/or on the metal silicon nitride layer 608, the necked region 712 of the opening 708 is filled to form the necked region 718, and the upper region 710b is filled to form the upper region 716b. The lower region 716a, the necked region 718, and the upper region 716b are all formed in a single deposition operation or in the same deposition operation (e.g., without formation of any intervening dielectric layers or etch stop layers).

The lower region 716a is interfaced with (and electrically connects to) the source/drain region 408 through the metal silicide layer 606. The lower region 716a is tapered or curved between the necked region 718 and a bottom surface 720a of the lower region 716a. A height of top surface 720b of the upper region 716b and a height of a top surface 722 of the silicon oxide layer 706 are approximately equal after planarization by the planarization tool 110.

Figure 7F:
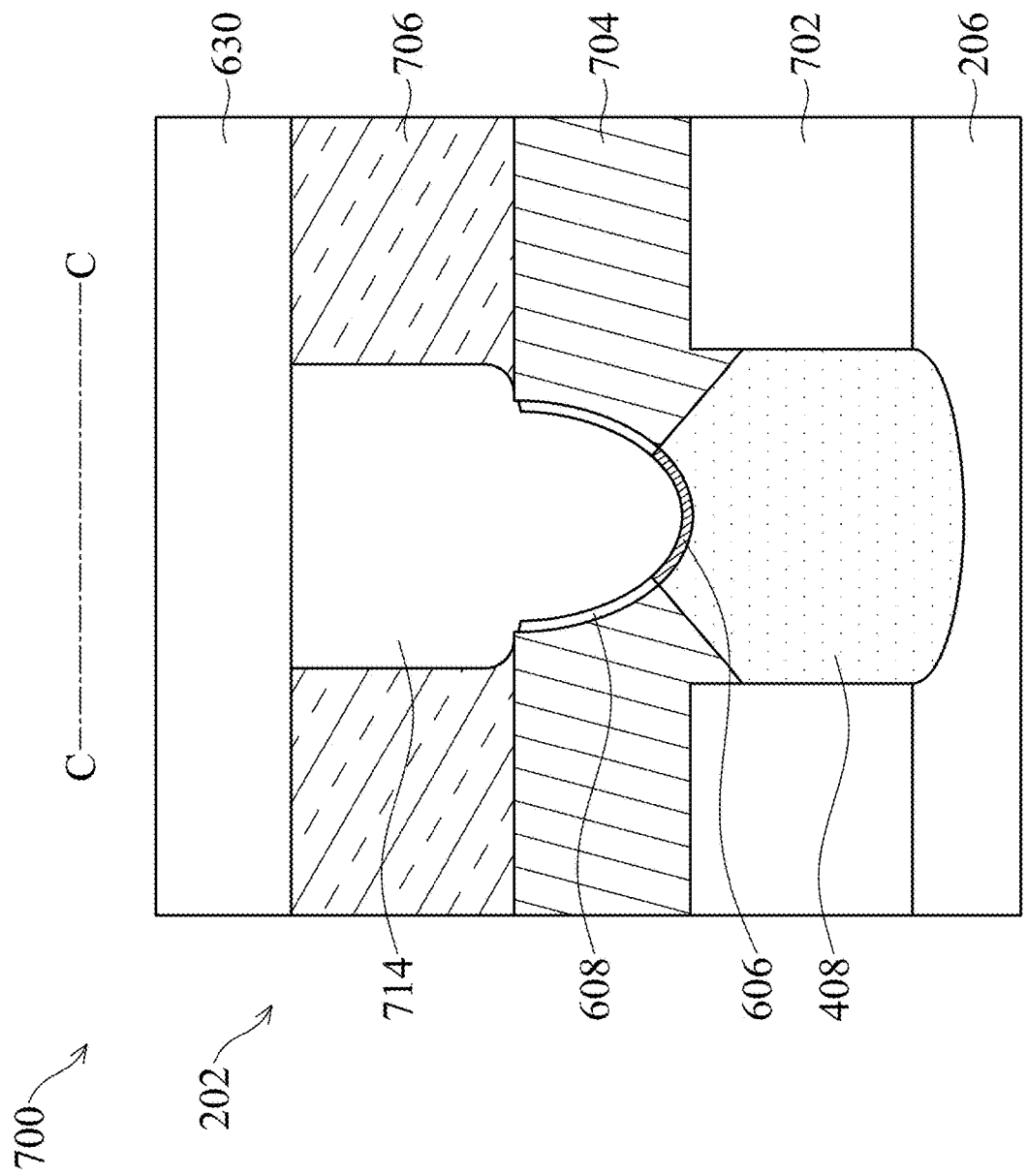

As shown in FIG. 7F, a BEOL metallization structure 630 is formed on the integrated contact and interconnect 714 such that the BEOL metallization structure 630 is electrically connected to the top surface 720b of the upper region 716b of the integrated contact and interconnect 714. In some implementations, one or more barrier layers and/or liners are included between the BEOL metallization structure 630 and the integrated contact and interconnect 714. The BEOL metallization structure 630 may include an M0 metal line, a V1 metal via, and/or other types of BEOL metallization layers. The deposition tool 102 and/or the plating tool 112 deposits the BEOL metallization structure 630 using a CVD technique, a PVD technique, an ALD technique, an electroplating technique, another deposition technique described above in connection with FIG. 1, and/or a deposition technique other than as described above in connection with FIG. 1.

As further shown in FIG. 7F, the integrated contact and interconnect 714 extends from the top surface of the source/drain region 408 (or from the metal silicide layer 606 on the top surface of the source/drain region 408) to the bottom surface of the BEOL metallization structure 630. Accordingly, the integrated contact and interconnect 714 includes a singular and/or unified conductive structure that is formed of a homogeneous conductive material that is physically and/or electrically connected to the source/drain region 408 and the BEOL metallization structure 630 (e.g., as opposed to a separate metal source/drain contact physically and electrically connected to the source/drain region 408 and a separate source/drain interconnect structure physically and electrically connected to the BEOL metallization structure 630). The integrated contact and interconnect 714 also reduces the quantity of layer-to-layer interfaces between the source/drain region 408 and the BEOL metallization structure 630, which further reduces contact resistance between the source/drain region 408 and the BEOL metallization structure 630.

As indicated above, FIGS. 7A-7F are provided as an example. Other examples may differ from what is described with regard to FIGS. 7A-7F. In some implementations, the metal silicide and homogenous conductive structure formation techniques described in connection with FIGS. 7A-7F may be performed to form a metal gate contact and a gate interconnect structure over a gate structure 508 or another transistor structure in the device region 202 of the semiconductor device 200.

Figure 8:
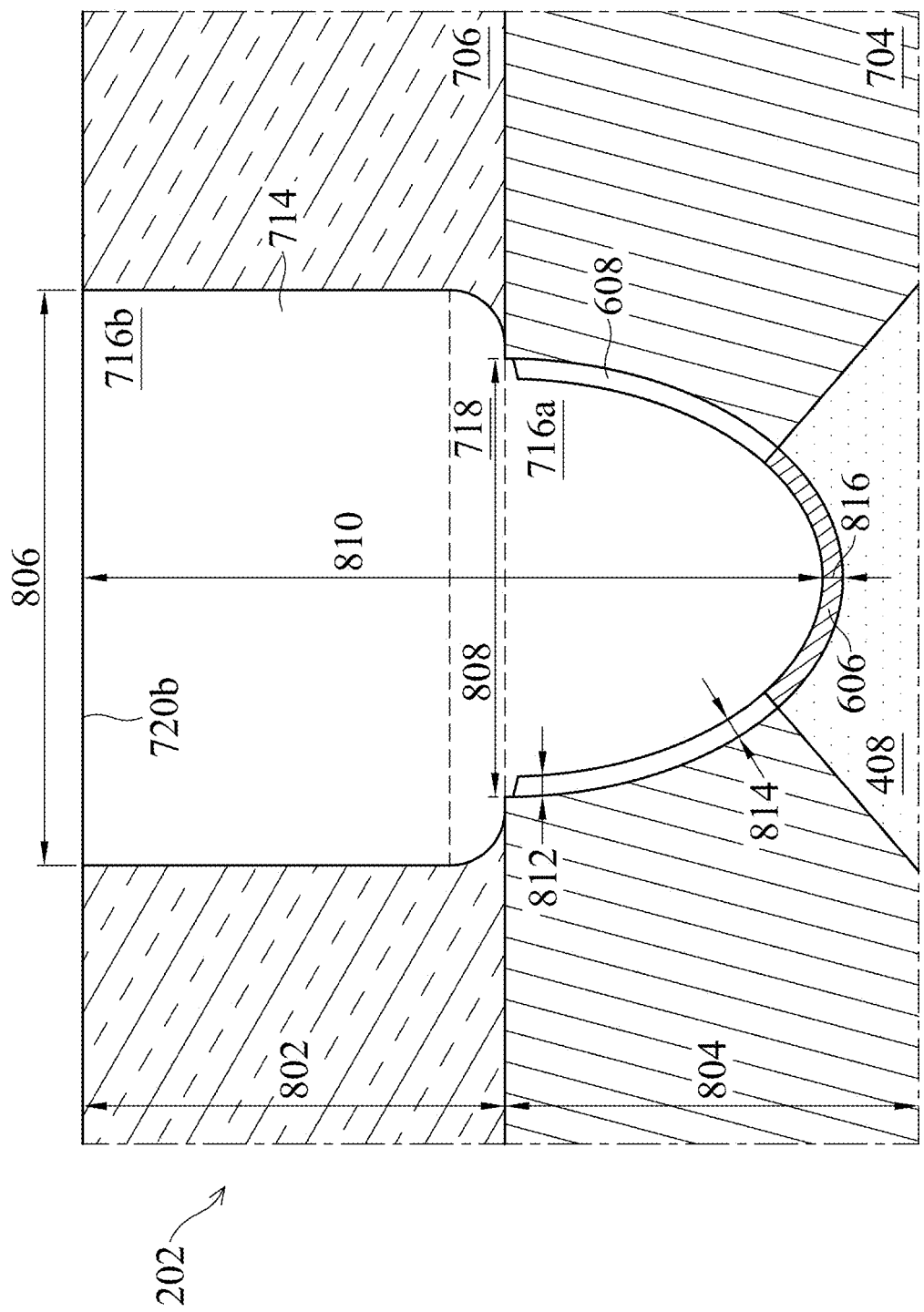
FIG. 8 is a diagram of example dimensions of a portion of a semiconductor device described herein.

FIG. 8 is a diagram of example dimensions of a portion of semiconductor device 200 described herein. In particular, the example dimensions are associated with one or more structures in the device region 202 of the semiconductor device 200.

As shown in FIG. 8, an example dimension 802 includes a height or thickness of the silicon oxide layer 706. In some implementations, the height or thickness of the silicon oxide layer 706 is in a range of approximately 5 nanometers to approximately 50 nanometers to provide sufficient height for forming the integrated contact and interconnect 714 without unduly increasing the height of the semiconductor device 200. However, other values for the example dimension 802 are within the scope of the present disclosure.

As further shown in FIG. 8, an example dimension 804 includes a height or thickness of the silicon nitride layer 704. In some implementations, the height or thickness of the silicon nitride layer 704 is in a range of approximately 5 nanometers to approximately 50 nanometers to provide sufficient height for forming the integrated contact and interconnect 714 without unduly increasing the height of the semiconductor device 200. However, other values for the example dimension 804 are within the scope of the present disclosure. In some implementations, a ratio between the thickness of the silicon nitride layer 704 (e.g., the example dimension 804) to the thickness of the silicon oxide layer 706 (e.g., the example dimension 802) is in a range of approximately 1:10 to approximately 10:1 to facilitate the formation of the necked region 718 in the integrated contact and interconnect 714 and to reduce or minimize the likelihood of over-etching and/or under-etching when forming the opening 708. However, other values for the ratio are within the scope of the present disclosure.

As further shown in FIG. 8, an example dimension 806 includes a width of the upper region 716b of the integrated contact and interconnect 714 at the top surface 720b of the integrated contact and interconnect 714. In some implementations, the width is in a range of approximately 20 nanometers to approximately 48.5 nanometers to provide sufficient contact area for the BEOL metallization structure 630 while facilitating increased transistor density in the semiconductor device 200, to reduce the likelihood of peeling or delamination of the integrated contact and interconnect 714, and/or to provide sufficient gap-filling and extrusion performance for the integrated contact and interconnect 714. However, other values for the width are within the scope of the present disclosure.

As further shown in FIG. 8, an example dimension 808 includes a width of the necked region 718 of the integrated contact and interconnect 714 at a bottom of the necked region 718. In some implementations, the width is in a range of approximately 28 nanometers to approximately 34 nanometers depending on the difference in etch rates for the silicon nitride layer 704 and the silicon oxide layer 706. However, other values for the width are within the scope of the present disclosure.

As further shown in FIG. 8, an example dimension 810 includes a height of the integrated contact and interconnect 714 between the top surface 720b of the integrated contact and interconnect 714 and the top surface of the metal silicide layer 606. In some implementations, the height is in a range of approximately 38.2 nanometers to approximately 40.3 nanometers to minimize loading effects for the integrated contact and interconnect 714 and to facilitate tuning of the integrated contact and interconnect 714. However, other values for the height are within the scope of the present disclosure.

As further shown in FIG. 8, an example dimension 812 includes a thickness of the metal silicon nitride layer 608 at a top of the lower region 716a and at an interface between the silicon nitride layer 704 and the silicon oxide layer 706. In some implementations, the thickness is in a range of approximately 1 nanometer to approximately 5 nanometers depending on the angle or curve of the sidewalls of the lower region 716a (e.g., a steeper angle of the sidewalls may result in lesser thickness, whereas a shallower angle of the sidewalls may result in a greater thickness). However, other values for the thickness are within the scope of the present disclosure.

As further shown in FIG. 8, an example dimension 814 includes a thickness of the metal silicon nitride layer 608 at an interface between the metal silicon nitride layer 608 and the metal silicide layer 606. In some implementations, the thickness is in a range of approximately 5 nanometers to approximately 11 nanometers depending on the angle or curve of the sidewalls of the lower region 716a (e.g., a steeper angle of the sidewalls may result in lesser thickness, whereas a shallower angle of the sidewalls may result in a greater thickness). However, other values for the thickness are within the scope of the present disclosure.

The thickness of the metal silicon nitride layer 608 at the interface between the metal silicon nitride layer 608 and the metal silicide layer 606 may be greater relative to the thickness of the metal silicon nitride layer 608 at the interface between the silicon nitride layer 704 and the silicon oxide layer 706. In some implementations, the thickness of the metal silicon nitride layer 608 increases from the interface between the metal silicon nitride layer 608 and the metal silicide layer 606 to the interface between the silicon nitride layer 704 and the silicon oxide layer 706. In some implementations, the increase in the thickness of the metal silicon nitride layer 608 is gradual, continuous, and/or uniform. In some implementations, the increase in the metal silicon nitride layer 608 is non-uniform and/or non-linear.

As further shown in FIG. 8, an example dimension 816 includes a thickness of the metal silicide layer 606. In some implementations, the thickness is in a range of approximately 5.4 nanometers to approximately 9.6 nanometers to provide sufficient protection of the source/drain region 408 while providing sufficient contact resistance between the source/drain region 408 and the integrated contact and interconnect 714. However, other values for the thickness are within the scope of the present disclosure.

As indicated above, FIG. 8 is provided as an example. Other examples may differ from what is described with regard to FIG. 8.

Figure 9A:
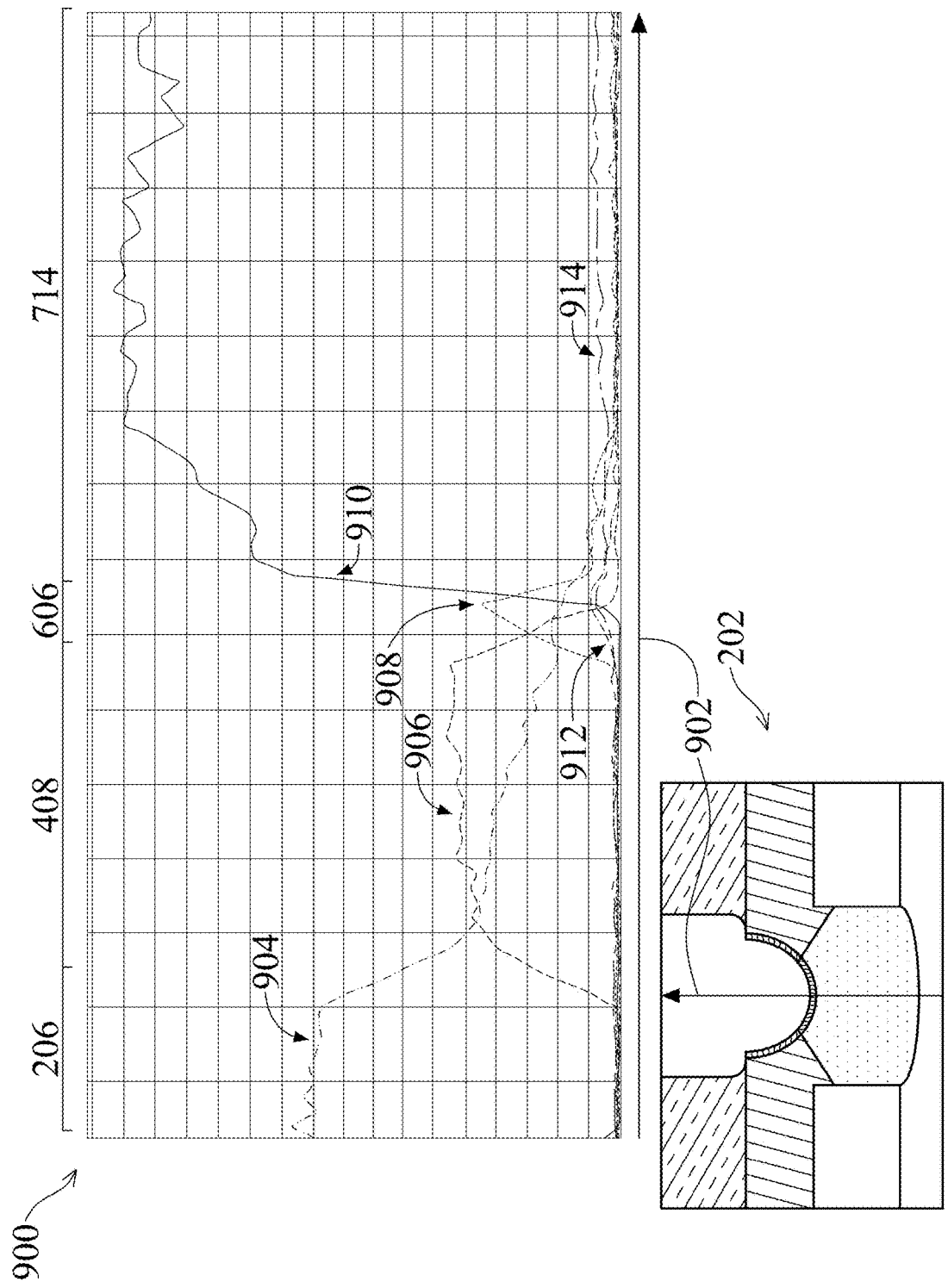
FIGS. 9A and 9B are diagrams of example elemental compositions of portions of a semiconductor device described herein.
Figure 9B:
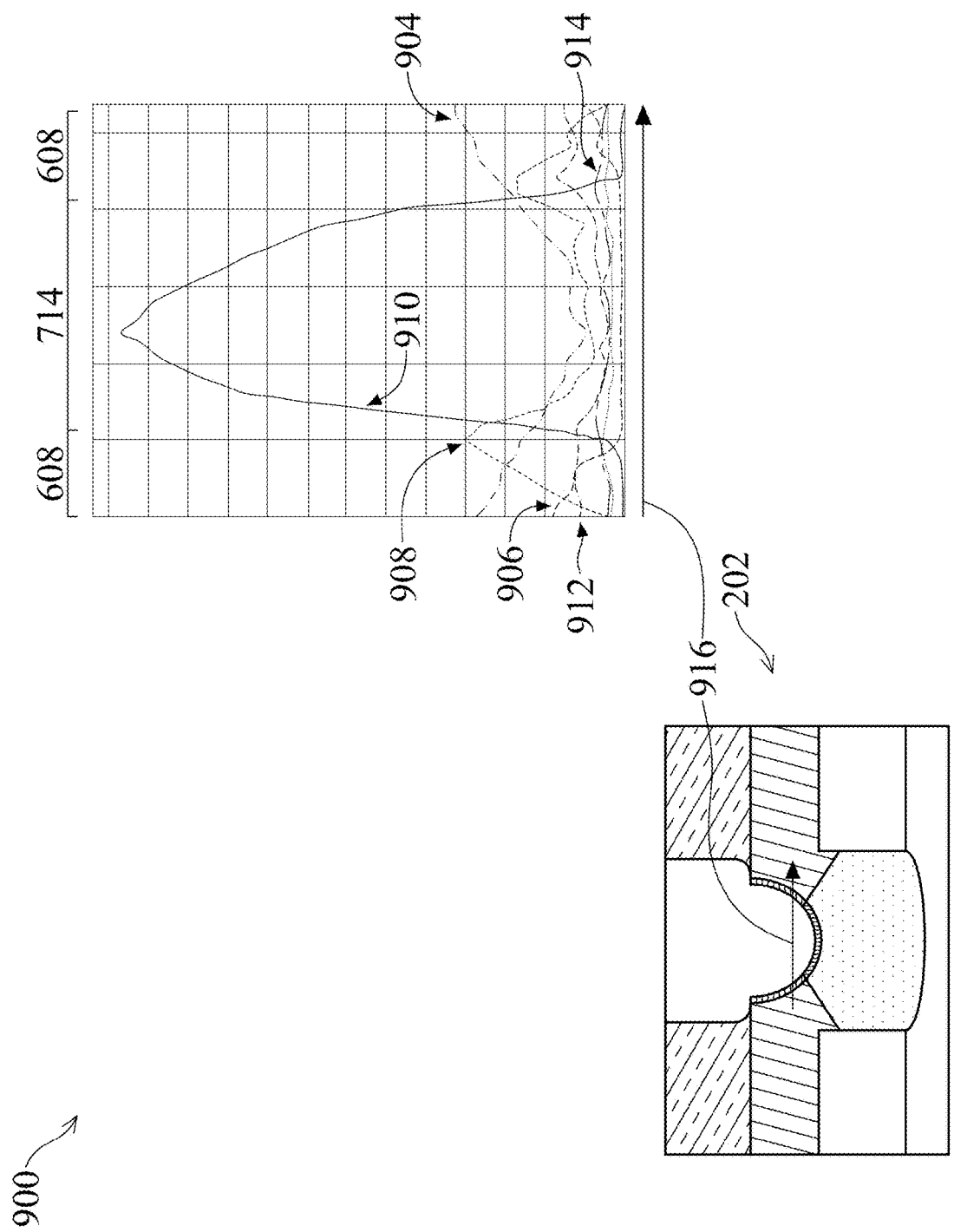

FIGS. 9A and 9B are diagrams of example elemental compositions 900 of portions of the semiconductor device 200 described herein. FIG. 9A illustrates an example vertical elemental composition 902 from a fin structure 206, through a source/drain region 408, through a metal silicide layer 606, and through an integrated contact and interconnect 714.

As shown in FIG. 9A, the fin structure 206 primarily includes silicon (Si) 904 and some germanium (Ge) 906 toward the top of the fin structure 206 (e.g., which may result during the formation of the source/drain region 408). The source/drain region 408 primarily includes a combination of silicon 904 and germanium 906. Moreover, the source/drain region 408 includes some titanium (Ti) 908 toward the top of the source/drain region 408 (e.g., which may result during the formation of the metal silicide layer 606). The metal silicide layer 606 may include primarily silicon 904 and titanium 908. The metal silicide layer 606 may include other elements such as ruthenium (Ru) 910, nitrogen (N$_2$) 912, and/or oxygen (O$_2$) 914. Ruthenium 910 may result toward the top of the metal silicide layer 606 during formation of the integrated contact and interconnect 714. Elements such as nitrogen 912 and/or oxygen 914 may be included as a result of the use of a nitrogen plasma during formation of the metal silicide layer 606 and/or oxidation in and/or on the metal silicide layer 606 (e.g., due to residual oxides). The integrated contact and interconnect 714 may include primarily ruthenium 910, some titanium 908 (resulting from migration and/or intermixing with the metal silicide layer 606), and other elements such as nitrogen 912 and oxygen 914.

In some implementations, a ratio of concentration of titanium 908 to a concentration of nitrogen 912 in the metal silicide layer 606 is in a range of approximately 9.35:1 to approximately 10.33:1. However, other values are within the scope of the present disclosure. In some implementations, a ratio of concentration of titanium 908 to a concentration of oxygen 914 in the metal silicide layer 606 is in a range of approximately 7.02:1 to approximately 7.98:1. However, other values are within the scope of the present disclosure. In some implementations, a ratio of concentration of titanium 908 to a concentration of silicon 904 in the metal silicide layer 606 is in a range of approximately 2.10:1 to approximately 2.54:1 to achieve a sufficiently low surface roughness for the integrated contact and interconnect 714. However, other values are within the scope of the present disclosure. In some implementations, the presence of chlorine can be traced in the metal silicide layer 606.

In some implementations, a ratio of concentration of ruthenium 910 to a concentration of titanium 908 in the metal silicide layer 606 is in a range of approximately 0.69:1 to approximately 0.78:1. However, other values are within the scope of the present disclosure. In some implementations, a ratio of concentration of ruthenium 910 to a concentration of nitrogen 912 in the metal silicide layer 606 is in a range of approximately 3.2:1 to approximately 3.59:1. However, other values are within the scope of the present disclosure. In some implementations, a ratio of concentration of ruthenium 910 to a concentration of oxygen 914 in the metal silicide layer 606 is in a range of approximately 3.58:1 to approximately 4.01:1. However, other values are within the scope of the present disclosure. In some implementations, a ratio of concentration of ruthenium 910 to a concentration of silicon 904 in the metal silicide layer 606 is in a range of approximately 1.69:1 to approximately 1.89:1. However, other values are within the scope of the present disclosure.

FIG. 9B illustrates an example horizontal elemental composition 916 from a metal silicon nitride layer 608, through an integrated contact and interconnect 714, and through the metal silicon nitride layer 608.

As shown in FIG. 9B, the metal silicon nitride layer 608 primarily includes silicon 904, titanium 908, and nitrogen 912. The metal silicon nitride layer 608 may also include some germanium 906 (e.g., which may result during the formation of the source/drain region 408) and some residual elements such as ruthenium 910 and oxygen 914. The integrated contact and interconnect 714 primarily includes ruthenium 910, some titanium 908 (resulting from migration and/or intermixing with the metal silicide layer 606 and the metal silicon nitride layer 608), and other elements such as nitrogen 912 and oxygen 914.

In some implementations, a ratio of concentration of titanium 908 to a concentration of nitrogen 912 in the metal silicon nitride layer 608 is in a range of approximately 4.38:1 to approximately 4.89:1. However, other values are within the scope of the present disclosure. In some implementations, a ratio of concentration of titanium 908 to a concentration of oxygen 914 in the metal silicon nitride layer 608 is in a range of approximately 5.67:1 to approximately 6.29:1. However, other values are within the scope of the present disclosure. In some implementations, a ratio of concentration of titanium 908 to a concentration of silicon 904 in the metal silicon nitride layer 608 is in a range of approximately 1.25:1 to approximately 1.41:1 to achieve a sufficiently low surface roughness for the integrated contact and interconnect 714. However, other values are within the scope of the present disclosure. In some implementations, the presence of chlorine can be traced in the metal silicon nitride layer 608.

In some implementations, a ratio of concentration of ruthenium 910 to a concentration of titanium 908 in the metal silicon nitride layer 608 is in a range of approximately 0.79:1 to approximately 0.89:1. However, other values are within the scope of the present disclosure. In some implementations, a ratio of concentration of ruthenium 910 to a concentration of nitrogen 912 in the metal silicon nitride layer 608 is in a range of approximately 2.68:1 to approximately 2.98:1. However, other values are within the scope of the present disclosure. In some implementations, a ratio of concentration of ruthenium 910 to a concentration of oxygen 914 in the metal silicon nitride layer 608 is in a range of approximately 4.32:1 to approximately 4.87:1. However, other values are within the scope of the present disclosure. In some implementations, a ratio of concentration of ruthenium 910 to a concentration of silicon 904 in the metal silicon nitride layer 608 is in a range of approximately 1.48:1 to approximately 1.64:1. However, other values are within the scope of the present disclosure.

In some implementations, a ratio of concentration of titanium 908 to a concentration of nitrogen 912 in the integrated contact and interconnect 714 is in a range of approximately 1.69:1 to approximately 1.98:1. However, other values are within the scope of the present disclosure. In some implementations, a ratio of concentration of titanium 908 to a concentration of oxygen 914 in the integrated contact and interconnect 714 is in a range of approximately 1.64:1 to approximately 1.83:1. However, other values are within the scope of the present disclosure. In some implementations, a ratio of concentration of titanium 908 to a concentration of silicon 904 in the integrated contact and interconnect 714 is in a range of approximately 0.56:1 to approximately 0.62:1 to achieve a sufficiently low surface roughness for the integrated contact and interconnect 714. However, other values are within the scope of the present disclosure.

As indicated above, FIGS. 9A and 9B are provided as examples. Other examples may differ from what is described with regard to FIGS. 9A and 9B.

Figure 10:
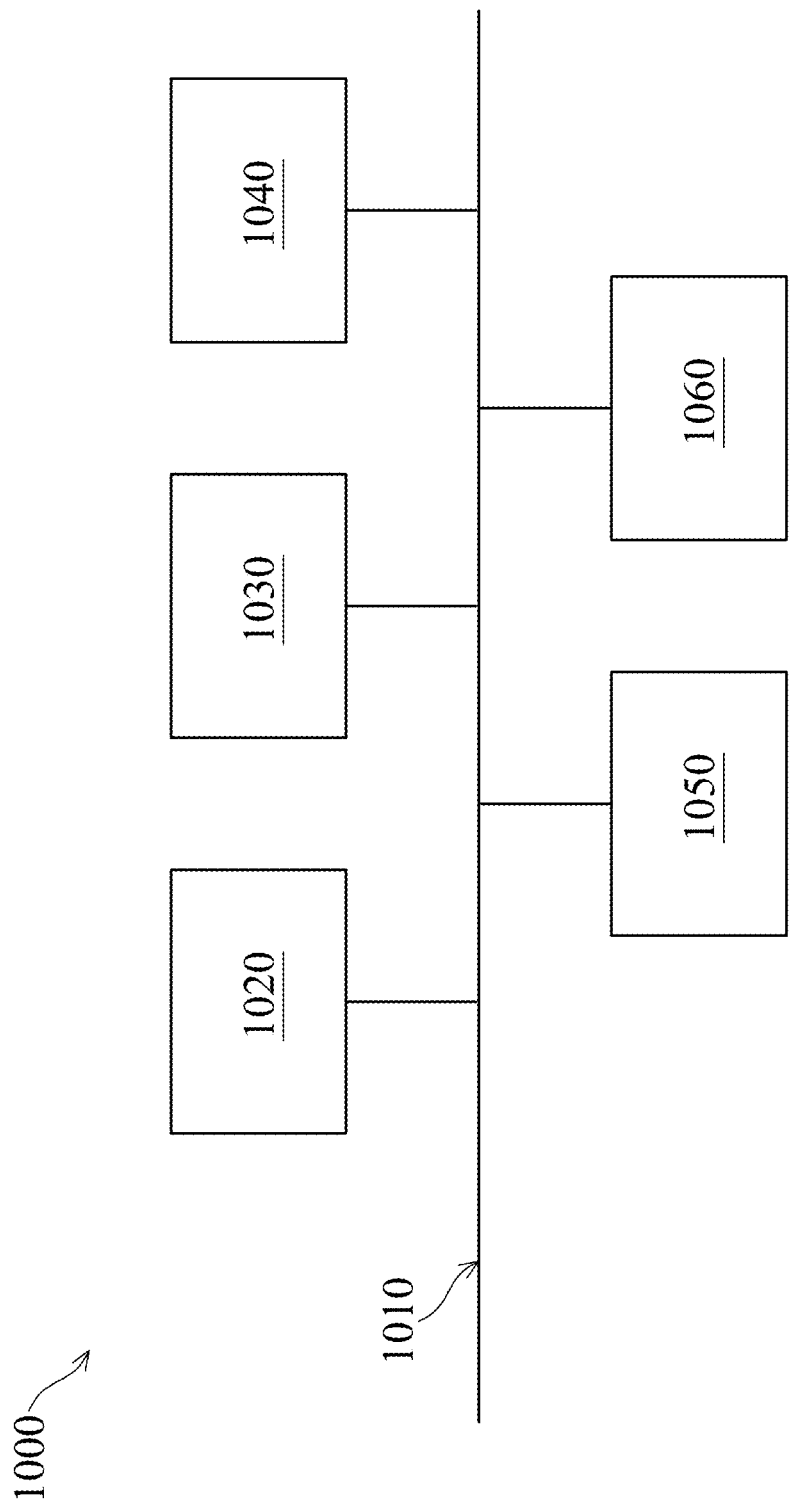
FIG. 10 is a diagram of example components of one or more devices of FIG. 1 described herein.

FIG. 10 is a diagram of example components of a device 1000. In some implementations, one or more of the semiconductor processing tools 102-112 and/or the wafer/die transport tool 114 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 includes one or more components that enable wired and/or wireless communication among the components of device 1000. Bus 1010 may couple together two or more components of FIG. 10, such as via operative coupling, communicative coupling, electronic coupling, and/or electric coupling. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform one or more operations or processes described elsewhere herein.

Memory 1030 includes volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 includes one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry may be used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
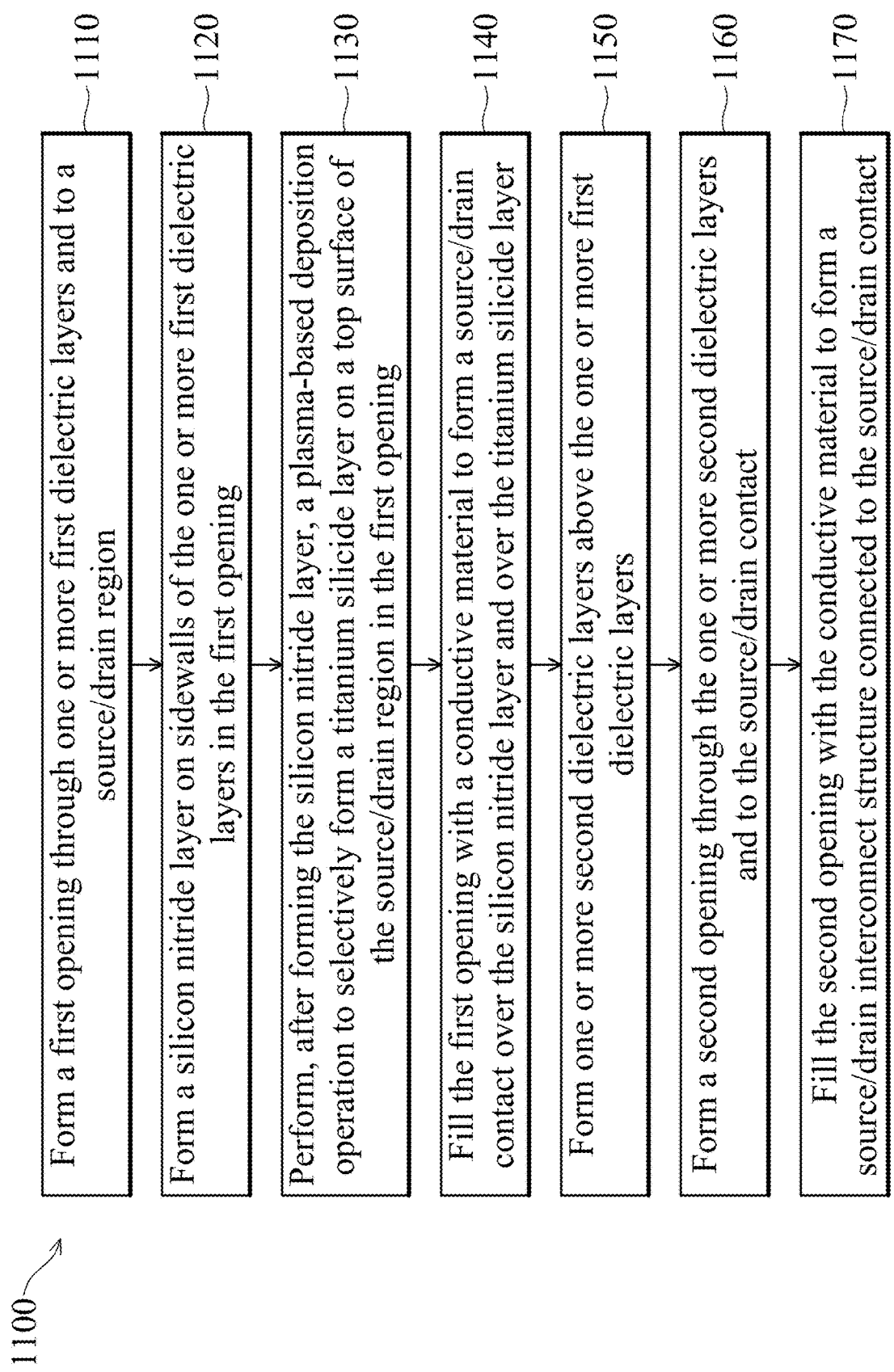
FIGS. 11 and 12 are flowcharts of example processes relating to forming conductive structures in a semiconductor device described herein.

FIG. 11 is a flowchart of an example process 1100 associated with forming conductive structures in a semiconductor device. In some implementations, one or more process blocks of FIG. 11 may be performed by one or more semiconductor processing tools (e.g., one or more of the semiconductor processing tools). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a first opening through one or more first dielectric layers and to a source/drain region (block 1110). For example, the one or more semiconductor processing tools 102-112 may form a first opening (e.g., the opening 602) through one or more first dielectric layers (e.g., the CESL 502, the ILD 504) and to a source/drain region 408, as described above.

As further shown in FIG. 11, process 1100 may include forming a silicon nitride ($Si_xN_y$) layer on sidewalls of the one or more first dielectric layers in the first opening (block 1120). For example, the one or more semiconductor processing tools 102-112 may form a silicon nitride ($Si_xN_y$) layer (e.g., the nitride layer 604) on sidewalls (e.g., the sidewalls 602b) of the one or more first dielectric layers in the first opening, as described above.

As further shown in FIG. 11, process 1100 may include performing, after forming the silicon nitride layer, a plasma-based deposition operation to selectively form a titanium silicide ($TiSi_x$) layer on a top surface of the source/drain region in the first opening (block 1130). For example, the one or more semiconductor processing tools 102-112 may perform, after forming the silicon nitride layer, a plasma-based deposition operation to selectively form a titanium silicide ($TiSi_x$) layer (e.g., a metal silicide layer 606) on a top surface (e.g., the top surface corresponding to the bottom surface 602a of the first opening) of the source/drain region 408 in the first opening, as described above.

As further shown in FIG. 11, process 1100 may include filling the first opening with a conductive material to form a source/drain contact over the silicon nitride layer and over the titanium silicide layer (block 1140). For example, the one or more semiconductor processing tools 102-112 may fill the first opening with a conductive material to form a source/drain contact 610 over the silicon nitride layer and over the titanium silicide layer, as described above.

As further shown in FIG. 11, process 1100 may include forming one or more second dielectric layers above the one or more first dielectric layers (block 1150). For example, the one or more semiconductor processing tools 102-112 may form one or more second dielectric layers (e.g., the ESL 612, the ILD 614) above the one or more first dielectric layers, as described above.

As further shown in FIG. 11, process 1100 may include forming a second opening through the one or more second dielectric layers and to the source/drain contact (block 1160). For example, the one or more semiconductor processing tools 102-112 may form a second opening (e.g., the opening 616) through the one or more second dielectric layers and to the source/drain contact 610, as described above.

As further shown in FIG. 11, process 1100 may include filling the second opening with the conductive material to form a source/drain interconnect structure connected to the source/drain contact (block 1170). For example, the one or more semiconductor processing tools 102-112 may fill the second opening with the conductive material to form a source/drain interconnect structure 618 connected to the source/drain contact, as described above.

Process 1100 may include additional implementations, such as any single implementation or any combination of implementations described below and/or in connection with one or more other processes described elsewhere herein.

In a first implementation, performing the plasma-based deposition operation includes providing a flow of titanium chloride ($TiCl_x$) and a reactant gas into the first opening and providing a plasma into the first opening, where titanium of the titanium chloride, silicon of the source/drain region 408, the reactant gas, and the plasma react to selectively form the titanium silicide ($TiSi_x$) layer (e.g., a metal silicide layer 606) on the top surface (e.g., the top surface corresponding to the bottom surface 602a of the first opening) of the source/drain region 408 in the first opening.

In a second implementation, alone or in combination with the first implementation, the titanium of the titanium chloride, silicon of the silicon nitride layer, the reactant gas, and the plasma react to selectively form a titanium silicon nitride ($TiSi_xN_y$) layer (e.g., the metal silicon nitride layer 608) on the silicon nitride layer, and where filling the first opening with the conductive material to form the source/drain contact 610 includes filling the first opening with the conductive material to form the source/drain contact 610 on the titanium silicon nitride layer. In a third implementation, alone or in combination with the first or second implementation, the titanium of the titanium chloride, silicon of the titanium silicide layer, the reactant gas, and the plasma react to selectively form a titanium silicon nitride ($TiSi_xN_y$) layer (e.g., the metal silicon nitride layer 608) on the titanium silicide layer, and where filling the first opening with the conductive material to form the source/drain contact 610 includes filling the first opening with the conductive material to form the source/drain contact 610 on the titanium silicon nitride layer (e.g., the metal silicon nitride layer 608).

In a fourth implementation, alone or in combination with one or more of the first through third implementations, a thickness of the titanium silicon nitride layer (e.g., the metal silicon nitride layer 608) is in a range of approximately 5 nanometers to approximately 11 nanometers. In a fifth implementation, alone or in combination with one or more of the first through fourth implementations, the plasma in the plasma-based deposition operation bombards the source/drain region 408, which results in formation of mobilized silicon atoms in the source/drain region 408, and the mobilized silicon atoms diffuse toward the top surface of the source/drain region 408 where the mobilized silicon atoms and the titanium chloride react to form the titanium silicide layer.

In a sixth implementation, alone or in combination with one or more of the first through fifth implementations, the reactant gas includes a hydrogen ($H_2$) gas, wherein the plasma includes at least one of an argon (Ar) plasma, a helium (He) plasma, or a nitrogen ($N_2$) plasma, and where chlorine in the titanium chloride, hydrogen in the hydrogen gas, and the plasma react in the plasma-based deposition operation to form a hydrochloric acid (HCl) byproduct.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
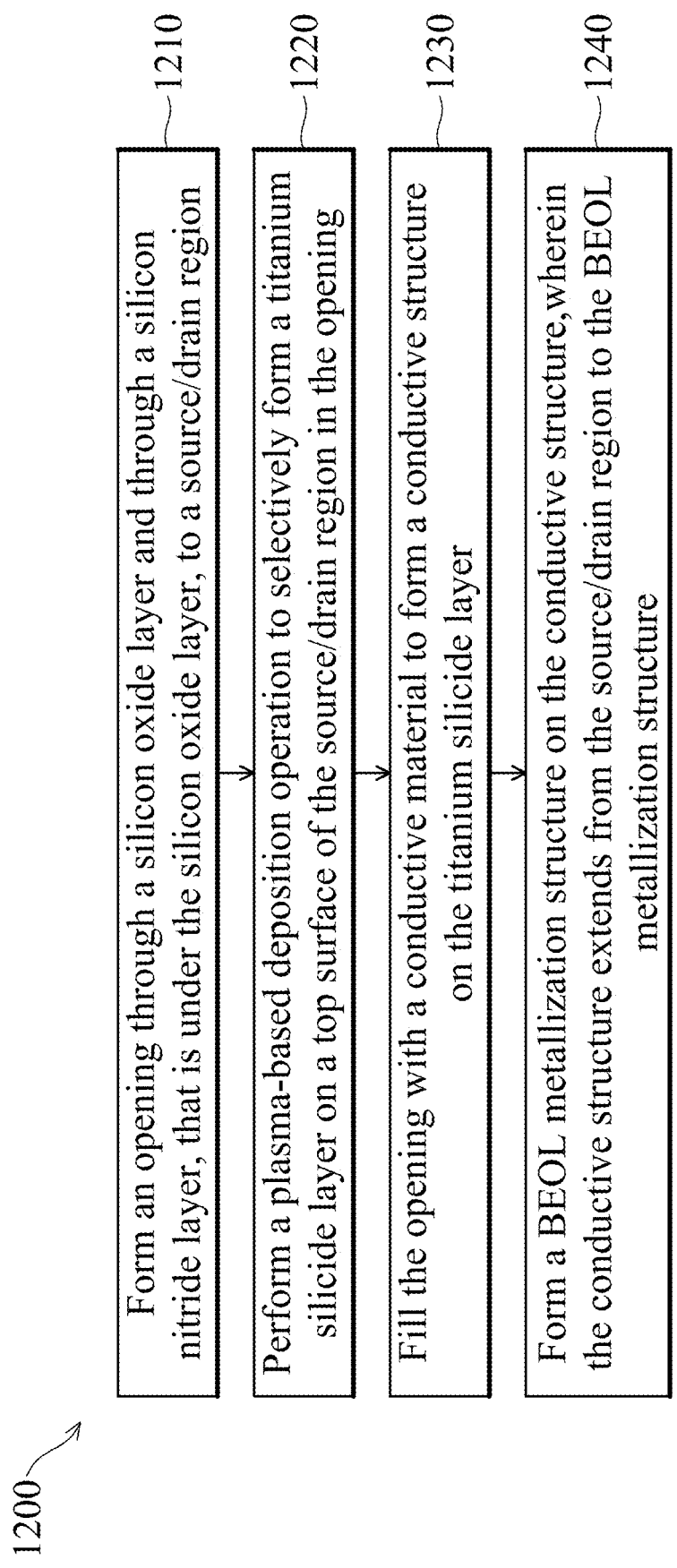

FIG. 12 is a flowchart of an example process 1200 associated with forming conductive structures in a semiconductor device. In some implementations, one or more process blocks of FIG. 12 may be performed by one or more semiconductor processing tools (e.g., one or more of the semiconductor processing tools 102-112). Additionally, or alternatively, one or more process blocks of FIG. 12 may be performed by one or more components of device 1000, such as processor 1020, memory 1030, input component 1040, output component 1050, and/or communication component 1060.

As shown in FIG. 12, process 1200 may include forming an opening through a silicon oxide ($SiO_x$) layer and through a silicon nitride ($Si_xN_y$) layer, that is under the silicon oxide layer, to a source/drain region (block 1210). For example, the one or more semiconductor processing tools 102-112 may form an opening (e.g., an opening 708) through a silicon oxide ($SiO_x$) layer 706 and through a silicon nitride ($Si_xN_y$) layer 704, that is under the silicon oxide layer 706, to a source/drain region 408, as described above.

As further shown in FIG. 12, process 1200 may include performing a plasma-based deposition operation to selectively form a titanium silicide ($TiSi_x$) layer on a top surface of the source/drain region 408 in the opening (block 1220). For example, the one or more semiconductor processing tools 102-112 may perform a plasma-based deposition operation to selectively form a titanium silicide (TiSi$_x$) layer (e.g., a metal silicide layer 606) on a top surface of the source/drain region 408 in the opening 708 (e.g., which may correspond to a bottom surface 708a of the opening 708), as described above.

As further shown in FIG. 12, process 1200 may include filling the opening with a conductive material to form a conductive structure on the titanium silicide layer, wherein the conductive structure includes a necked region between a first region of the conductive structure and a second region of the conductive structure (block 1230). For example, the one or more semiconductor processing tools 102-112 may fill the opening 708 with a conductive material to form a conductive structure (e.g., an integrated contact and interconnect 714) on the titanium silicide layer, as described above. In some implementations, the conductive structure includes a necked region 718 between a first region 716a of the conductive structure and a second region 716b of the conductive structure.

As further shown in FIG. 12, process 1200 may include forming a BEOL metallization structure on the conductive structure (block 1240). For example, the one or more semiconductor processing tools 102-112 may form a BEOL metallization structure 630 on the conductive structure, as described above. In some implementations, the conductive structure extends from the source/drain region 408 to the BEOL metallization structure 630.

Process 1200 may include additional implementations, such as any single implementation or any combination of implementations described below and/or in connection with one or more other processes described elsewhere herein.

In a first implementation, the BEOL metallization structure 630 includes an M0 metal line. In a second implementation, alone or in combination with the first implementation, the necked region 718 results from an etch rate of the silicon oxide layer 706 being greater relative to an etch rate of the silicon nitride layer 704. In a third implementation, alone or in combination with one or more of the first and second implementations, filling the opening 708 with the conductive material to form the conductive structure includes filling the opening 708 with the conductive material to form the first region 716a, the second region 716b, and the necked region 718 in a same deposition operation.

In a fourth implementation, alone or in combination with one or more of the first through third implementations, performing the plasma-based deposition operation includes providing a flow of a titanium precursor and a reactant gas into the opening and providing a plasma into the opening, where the titanium of the titanium precursor, silicon of the source/drain region, the reactant gas, and the plasma react to selectively form the titanium silicide layer on a top surface of the source/drain region in the opening. In a fifth implementation, alone or in combination with one or more of the first through fourth implementations, the titanium of the titanium precursor, silicon of the silicon nitride layer 704, the reactant gas, and the plasma react to selectively form a titanium silicon nitride (TiSi$_x$N$_y$) layer (e.g., the metal silicon nitride layer 608) on the silicon nitride layer 704 in the opening 708, and where filling the opening 708 with the conductive material to form the conductive structure includes filling the opening with the conductive material to form the conductive structure on the titanium silicon nitride layer.

In a sixth implementation, alone or in combination with one or more of the first through fifth implementations, process 1200 includes forming at least one of a titanium nitride (Ti$_x$N$_y$) barrier layer or a tantalum nitride (Ta$_x$N$_y$) barrier layer on the titanium silicide layer, and filling the opening 708 with the conductive material to form the conductive structure includes filling the opening 708 with ruthenium (Ru) to form the conductive structure on the at least one of the titanium nitride barrier layer or the tantalum nitride barrier layer. In a seventh implementation, alone or in combination with one or more of the first through sixth implementations, the plasma in the plasma-based deposition operation causes silicon atoms in the source/drain region 408 to diffuse toward the top surface of the source/drain region 408, resulting in a silicon-rich top surface of the source/drain region 408, and where the titanium precursor reacts with the silicon-rich top surface of the source/drain region 408 to form the titanium silicide layer.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

In this way, a titanium precursor is used to selectively form a titanium silicide (TiSi$_x$) layer in a semiconductor device. A plasma-based deposition operation is performed in which the titanium precursor is provided into an opening, and a reactant gas and a plasma are used to cause silicon to diffuse to a top surface of a transistor structure. The diffusion of silicon results in the formation of a silicon-rich surface of the transistor structure, which increases the selectivity of the titanium silicide formation relative to other materials of the semiconductor device. The titanium precursor reacts with the silicon-rich surface to form the titanium silicide layer. The selective titanium silicide layer formation results in the formation of a titanium silicon nitride (TiSi$_x$N$_y$) on the sidewalls in the opening, which enables a conductive structure such as a metal source/drain contact to be formed in the opening without the addition of another barrier layer.

As described in greater detail above, some implementations described herein provide a method. The method includes forming a first opening through one or more first dielectric layers and to a source/drain region. The method includes forming a silicon nitride (Si$_x$N$_y$) layer on sidewalls of the one or more first dielectric layers in the first opening. The method includes performing, after forming the silicon nitride layer, a plasma-based deposition operation to selectively form a titanium silicide (TiSi$_x$) layer on a top surface of the source/drain region in the first opening. The method includes filling the first opening with a conductive material to form a source/drain contact over the silicon nitride layer and over the titanium silicide layer. The method includes forming one or more second dielectric layers above the one or more first dielectric layers. The method includes forming a second opening through the one or more second dielectric layers and to the source/drain contact. The method includes filling the second opening with the conductive material to form a source/drain interconnect structure connected to the source/drain contact.

As described in greater detail above, some implementations described herein provide a method. The method includes forming an opening through a silicon oxide (SiO$_x$) layer and through a silicon nitride (Si$_x$N$_y$) layer, that is under the silicon oxide layer, to a source/drain region. The method includes performing a plasma-based deposition operation to selectively form a titanium silicide (TiSi$_x$) layer on a top surface of the source/drain region in the opening. The method includes filling the opening with a conductive material to form a conductive structure on the titanium silicide layer. The method includes forming a BEOL metallization structure on the conductive structure, where the conductive structure extends from the source/drain region to the BEOL metallization structure.

As described in greater detail above, some implementations described herein provide a semiconductor device. The semiconductor device includes a substrate. The semiconductor device includes a semiconductive fin structure extending above the substrate. The semiconductor device includes a first oxide layer above the fin structure. The semiconductor device includes a transistor structure over the semiconductive fin structure and in the first oxide layer, where the transistor structure includes a source/drain region or a gate structure. The semiconductor device includes a nitride layer over the first oxide layer. The semiconductor device includes a second oxide layer over the nitride layer. The semiconductor device includes an integrated contact and interconnect, including a first region in the nitride layer, a second region in the second oxide layer, and a necked region to transition between the first region and the second region. The semiconductor device includes a titanium silicide ($TiSi_x$) layer between the transistor structure and the first region of the integrated contact and interconnect. The semiconductor device includes a titanium silicon nitride ($TiSi_xN_y$) layer between the nitride layer and the first region of the integrated contact and interconnect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first opening through one or more first dielectric layers and to a source/drain region;
forming a silicon nitride ($Si_xN_y$) layer on sidewalls of the one or more first dielectric layers in the first opening;
performing, after forming the silicon nitride layer, a plasma-based deposition operation to selectively form a titanium silicide ($TiSi_x$) layer on a top surface of the source/drain region in the first opening;
filling the first opening with a conductive material to form a source/drain contact over the silicon nitride layer and over the titanium silicide layer;
forming one or more second dielectric layers above the one or more first dielectric layers;
forming a second opening through the one or more second dielectric layers and to the source/drain contact; and
filling the second opening with the conductive material to form a source/drain interconnect structure connected to the source/drain contact.

2. The method of claim 1, wherein performing the plasma-based deposition operation comprises:
providing a flow of titanium chloride ($TiCl_x$) and a reactant gas into the first opening; and
providing a plasma into the first opening,
wherein titanium of the titanium chloride, silicon of the source/drain region, the reactant gas, and the plasma react to selectively form the titanium silicide layer on the top surface of the source/drain region in the first opening.

3. The method of claim 2, wherein the titanium of the titanium chloride, silicon of the silicon nitride layer, the reactant gas, and the plasma react to selectively form a titanium silicon nitride ($TiSi_xN_y$) layer on the silicon nitride layer; and
wherein filling the first opening with the conductive material to form the source/drain contact comprises:
filling the first opening with the conductive material to form the source/drain contact on the titanium silicon nitride layer.

4. The method of claim 2, wherein the titanium of the titanium chloride, silicon of the titanium silicide layer, the reactant gas, and the plasma react to selectively form a titanium silicon nitride ($TiSi_xN_y$) layer on the titanium silicide layer; and
wherein filling the first opening with the conductive material to form the source/drain contact comprises:
filling the first opening with the conductive material to form the source/drain contact on the titanium silicon nitride layer.

5. The method of claim 2, wherein the reactant gas includes a hydrogen ($H_2$) gas;
wherein the plasma includes at least one of:
an argon (Ar) plasma,
a helium (He) plasma, or
a nitrogen ($N_2$) plasma; and
wherein chlorine in the titanium chloride, hydrogen in the hydrogen gas, and the plasma react in the plasma-based deposition operation to form a hydrochloric acid as a byproduct.

6. The method of claim 2, wherein the plasma in the plasma-based deposition operation bombards the source/drain region, which results in formation of mobilized silicon atoms in the source/drain region, and
wherein the mobilized silicon atoms diffuse toward the top surface of the source/drain region where the mobilized silicon atoms and the titanium chloride react to form the titanium silicide layer.

7. A method, comprising:
forming an opening through a silicon oxide ($SiO_x$) layer and through a silicon nitride ($Si_xN_y$) layer, that is under the silicon oxide layer, to a source/drain region,
performing a plasma-based deposition operation to selectively form a titanium silicide ($TiSi_x$) layer on a top surface of the source/drain region in the opening;
filling the opening with a conductive material to form a conductive structure on the titanium silicide layer; and
forming a back end of line (BEOL) metallization structure on the conductive structure,
wherein the conductive structure extends from the source/drain region to the BEOL metallization structure.

8. The method of claim 7, wherein the BEOL metallization structure comprises a metal-zero (M0) metal line.

9. The method of claim 7, wherein the conductive structure includes a necked region between a first region of the conductive structure and a second region of the conductive structure; and
wherein the necked region results from an etch rate of the silicon oxide layer being greater relative to an etch rate of the silicon nitride layer.

10. The method of claim 9, wherein filling the opening with the conductive material to form the conductive structure comprises:
filling the opening with the conductive material to form the first region, the second region, and the necked region in a same deposition operation.

11. The method of claim 7, wherein performing the plasma-based deposition operation comprises:
providing a flow of a titanium precursor and a reactant gas into the opening; and
providing a plasma into the opening,
wherein titanium of the titanium precursor, silicon of the source/drain region, the reactant gas, and the plasma react to selectively form the titanium silicide layer on the top surface of the source/drain region in the opening.

12. The method of claim 11, wherein the titanium of the titanium precursor, silicon of the silicon nitride layer, the reactant gas, and the plasma react to selectively form a titanium silicon nitride ($TiSi_xN_y$) layer on the silicon nitride layer in the opening; and
wherein filling the opening with the conductive material to form the conductive structure comprises:
filling the opening with the conductive material to form the conductive structure on the titanium silicon nitride layer.

13. The method of claim 11, wherein the plasma in the plasma-based deposition operation causes silicon atoms in the source/drain region to diffuse toward the top surface of the source/drain region, resulting in a silicon-rich top surface of the source/drain region, and
wherein the titanium precursor reacts with the silicon-rich top surface of the source/drain region to form the titanium silicide layer.

14. A semiconductor device, comprising:
a substrate;
a semiconductive fin structure extending above the substrate;
a first oxide layer above the semiconductive fin structure;
a transistor structure over the semiconductive fin structure and in the first oxide layer,
wherein the transistor structure includes a source/drain region or a gate structure;
a nitride layer over the first oxide layer;
a second oxide layer over the nitride layer;
an integrated contact and interconnect, comprising:
a first region in the nitride layer,
a second region in the second oxide layer, and
a necked region to transition between the first region and the second region;
a titanium silicide ($TiSi_x$) layer between the transistor structure and the first region of the integrated contact and interconnect; and
a titanium silicon nitride ($TiSi_xN_y$) layer between the nitride layer and the first region of the integrated contact and interconnect.

15. The semiconductor device of claim 14, wherein a ratio between a thickness of the nitride layer to a thickness of the second oxide layer is in a range of approximately 1:10 to approximately 10:1.

16. The semiconductor device of claim 14, wherein a thickness of the titanium silicon nitride layer increases from a first interface, between the nitride layer and the second oxide layer, to a second interface between the titanium silicon nitride layer and the titanium silicide layer.

17. The semiconductor device of claim 14, wherein the necked region is included in the second oxide layer; and
wherein the titanium silicon nitride layer is below the second oxide layer.

18. The semiconductor device of claim 14, wherein a first ratio of titanium to silicon, in the titanium silicide layer, is in a range of approximately 2.10:1 to approximately 2.54:1; and
wherein a second ratio of titanium to silicon, in the first region of the integrated contact and interconnect, is in a range of approximately 0.56:1 to approximately 0.62:1.

19. The semiconductor device of claim 14, wherein the integrated contact and interconnect comprises a ruthenium (Ru) integrated contact and interconnect; and
wherein the semiconductor device further comprises:
a metal-zero (M0) metal line over the second oxide layer and electrically connected to a top surface of the second region of the ruthenium integrated contact and interconnect.

20. The semiconductor device of claim 14, wherein the first region of the integrated contact and interconnect is curved between the necked region and a bottom surface of the first region of the integrated contact and interconnect.

* * * * *